US008305795B2

(12) United States Patent
Azuma et al.

(10) Patent No.: US 8,305,795 B2
(45) Date of Patent: Nov. 6, 2012

(54) NONVOLATILE VARIABLE RESISTANCE MEMORY ELEMENT WRITING METHOD, AND NONVOLATILE VARIABLE RESISTANCE MEMORY DEVICE

(75) Inventors: Ryotaro Azuma, Osaka (JP); Kazuhiko Shimakawa, Osaka (JP); Shunsaku Muraoka, Osaka (JP); Ken Kawai, Osaka (JP)

(73) Assignee: Panasonic Corporation, Osaka (JP)

( * ) Notice: Subject to any disclaimer, the term of this patent is extended or adjusted under 35 U.S.C. 154(b) by 169 days.

(21) Appl. No.: 12/999,019

(22) PCT Filed: Apr. 27, 2010

(86) PCT No.: PCT/JP2010/003015
§ 371 (c)(1),
(2), (4) Date: Dec. 14, 2010

(87) PCT Pub. No.: WO2010/125805
PCT Pub. Date: Nov. 4, 2010

(65) Prior Publication Data
US 2011/0128773 A1   Jun. 2, 2011

(30) Foreign Application Priority Data

Apr. 27, 2009 (JP) ................. 2009-108528
Apr. 27, 2009 (JP) ................. 2009-108555

(51) Int. Cl.
*G11C 11/00* (2006.01)
(52) U.S. Cl. .................. 365/148; 365/189.16
(58) Field of Classification Search .......... 365/148, 365/189.16, 189.011
See application file for complete search history.

(56) References Cited

U.S. PATENT DOCUMENTS
7,289,351 B1   10/2007 Chen et al.
(Continued)

FOREIGN PATENT DOCUMENTS
JP    2005-101535    4/2005
(Continued)

OTHER PUBLICATIONS
International Search Report issued Aug. 24, 2010 in International (PCT) Application No. PCT/JP2010/003015.

*Primary Examiner* — Vu Le
(74) *Attorney, Agent, or Firm* — Wenderoth, Lind & Ponack, LLP

(57) ABSTRACT

To provide a variable resistance element writing method that, even when a variable resistance element has a possibility of becoming a half LR state, can ensure a maximum resistance change window by correcting the variable resistance element to a normal low resistance state. In a method of writing data to a variable resistance element (10a) that reversibly changes between a high resistance state and a low resistance state according to a polarity of an applied voltage, as a voltage applied to an upper electrode (11) with respect to a lower electrode (14t): a positive voltage is applied in a high resistance writing step (405) to set the variable resistance element (10a) to a high resistance state (401); a negative voltage is applied in a low resistance writing step (406, 408) to set the variable resistance element (10a) to a low resistance state (403, 402); and a positive voltage is applied in a low resistance stabilization writing step (404) after the negative voltage is applied in the low resistance writing step (408), thereby setting the variable resistance element (10a) through the low resistance state to the high resistance state (401).

25 Claims, 37 Drawing Sheets

U.S. PATENT DOCUMENTS

| | | | |
|---|---|---|---|
| 8,023,313 B2 * | 9/2011 | Toda | 365/148 |
| 2005/0045919 A1 | 3/2005 | Kaeriyama et al. | |
| 2005/0174840 A1 | 8/2005 | Tsushima et al. | |
| 2006/0126380 A1 | 6/2006 | Osada et al. | |
| 2007/0159867 A1 | 7/2007 | Muraoka et al. | |
| 2007/0195581 A1 | 8/2007 | Morimoto | |
| 2008/0117664 A1 | 5/2008 | Kinoshita et al. | |
| 2009/0001348 A1 | 1/2009 | Kaeriyama et al. | |
| 2009/0046495 A1 | 2/2009 | Shimaoka et al. | |
| 2009/0079009 A1 | 3/2009 | Muraoka et al. | |
| 2010/0054019 A1 * | 3/2010 | Toda | 365/148 |
| 2010/0172170 A1 | 7/2010 | Tamai et al. | |
| 2010/0182821 A1 | 7/2010 | Muraoka et al. | |
| 2010/0195372 A1 | 8/2010 | Toda | |

FOREIGN PATENT DOCUMENTS

| | | |
|---|---|---|
| JP | 2005-235360 | 9/2005 |
| JP | 2006-155700 | 6/2006 |
| JP | 2006-179560 | 7/2006 |
| JP | 2006-344349 | 12/2006 |
| JP | 2007-4935 | 1/2007 |
| JP | 2007-193878 | 8/2007 |
| JP | 2007-226883 | 9/2007 |
| JP | 2008-210441 | 9/2008 |
| JP | 2009-76143 | 4/2009 |
| WO | 2005/066969 | 7/2005 |
| WO | 2007/013174 | 2/2007 |
| WO | 2008/142919 | 11/2008 |

* cited by examiner

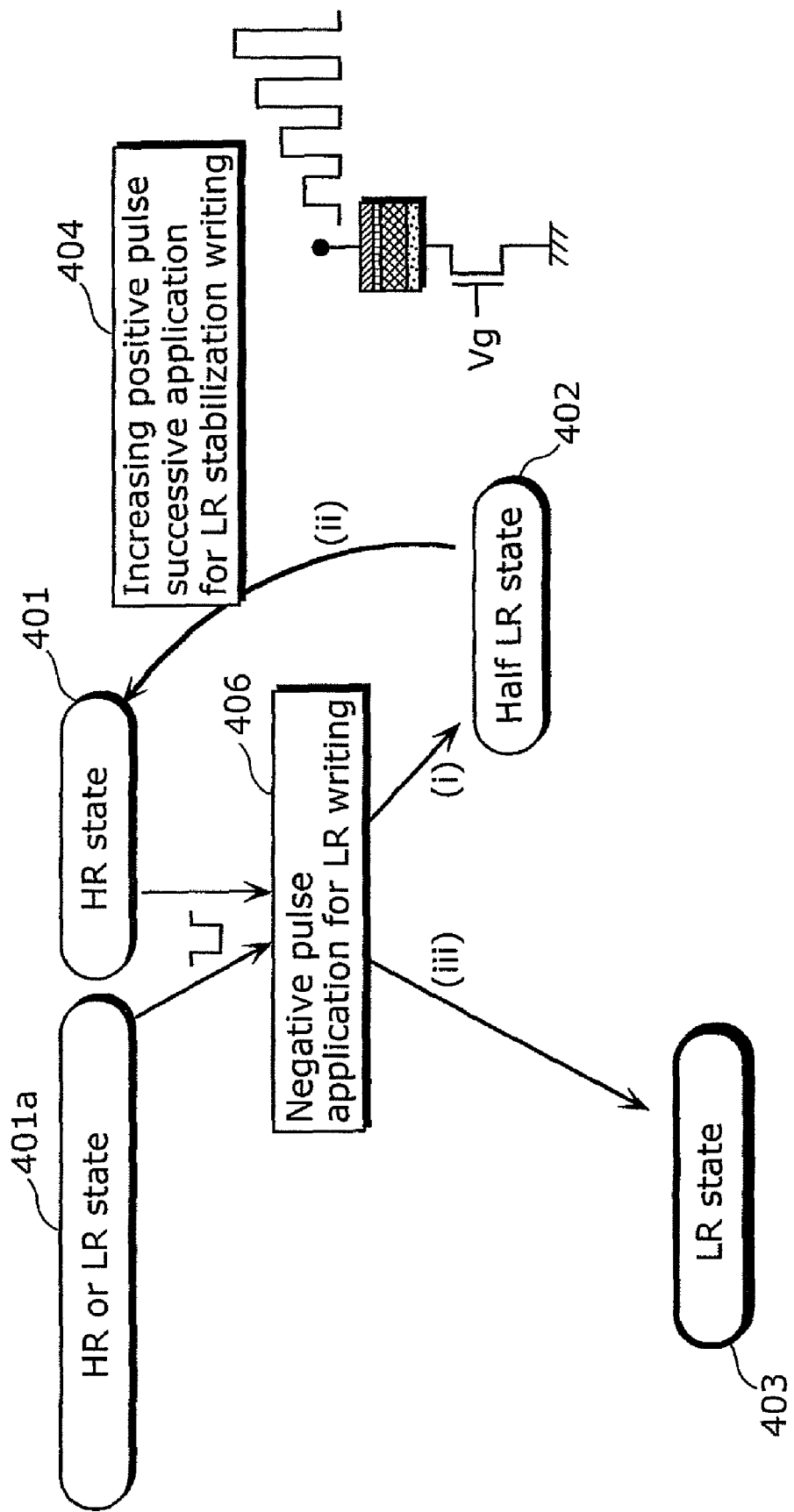

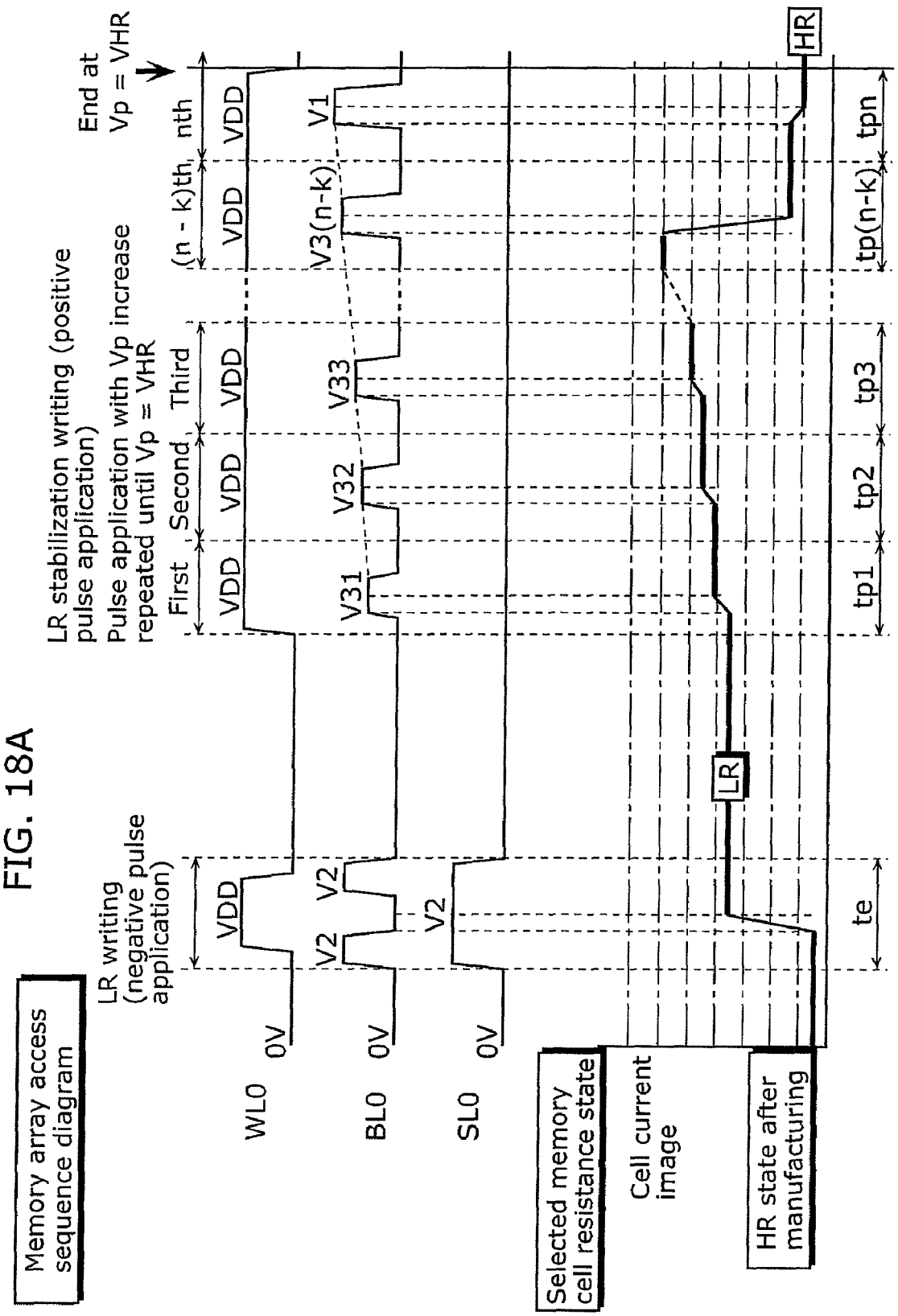

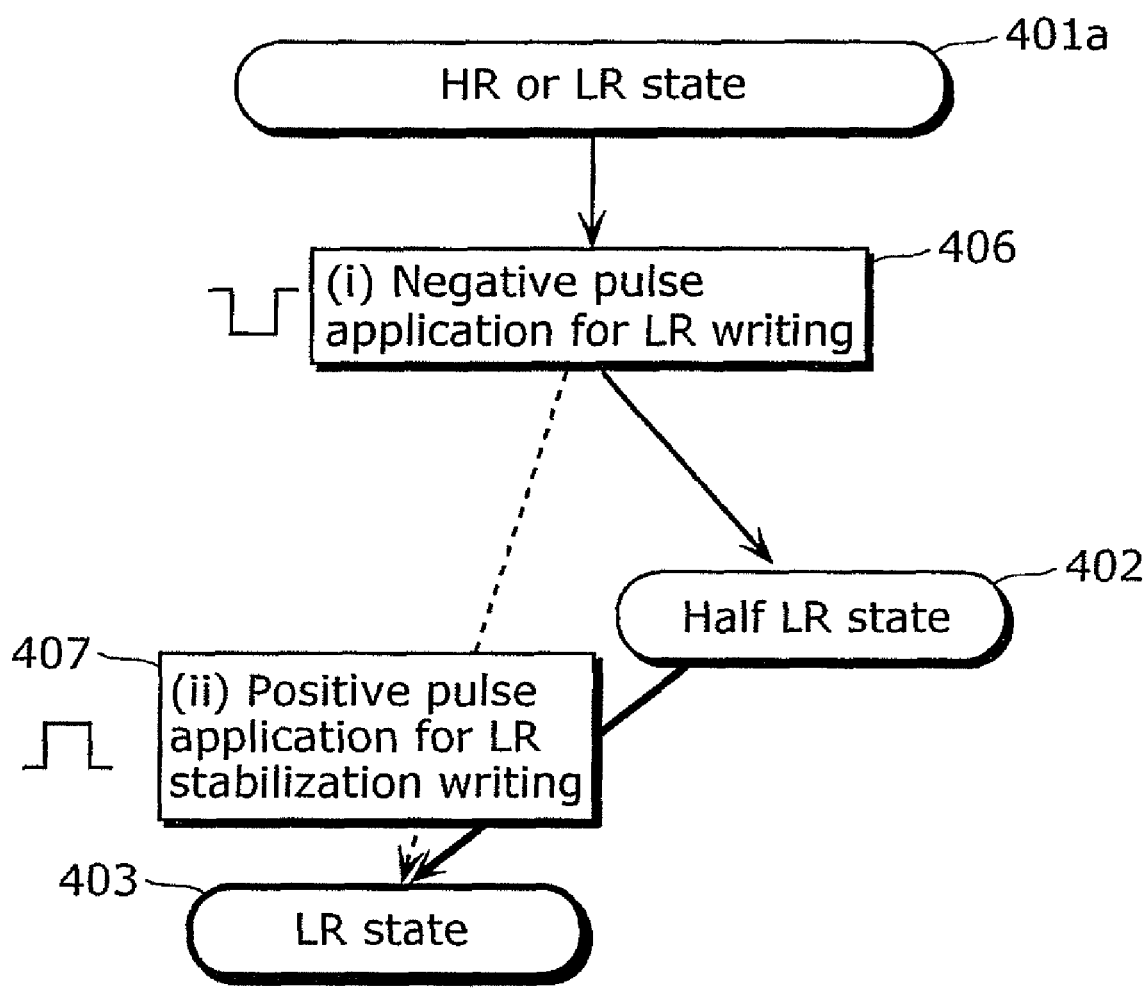

FIG. 35
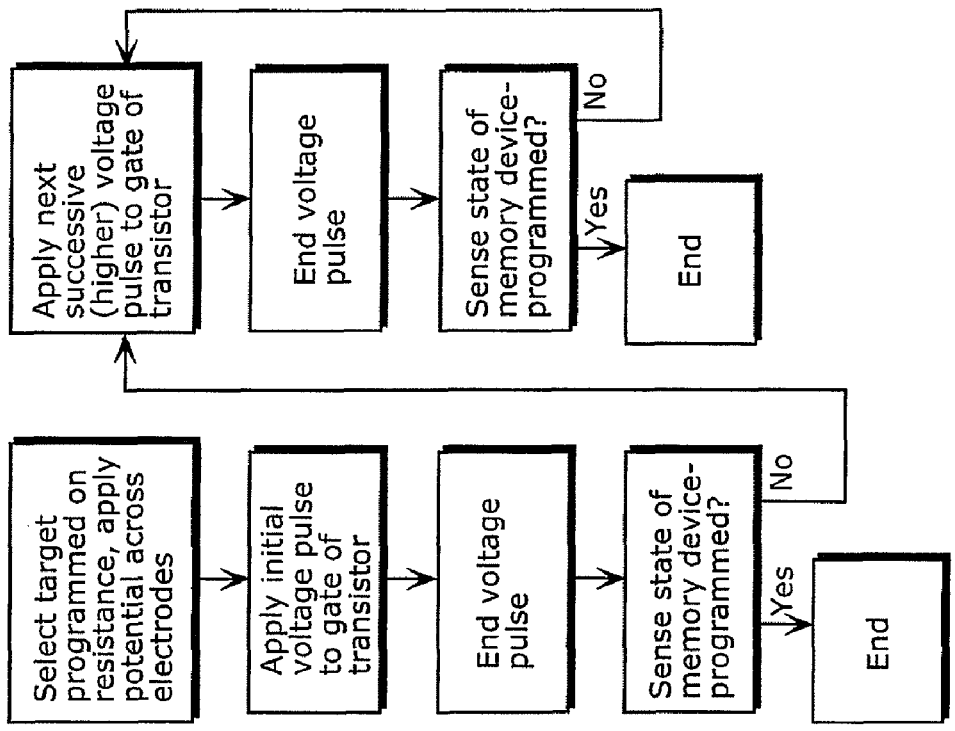
(b) Gate voltage increase adjustment
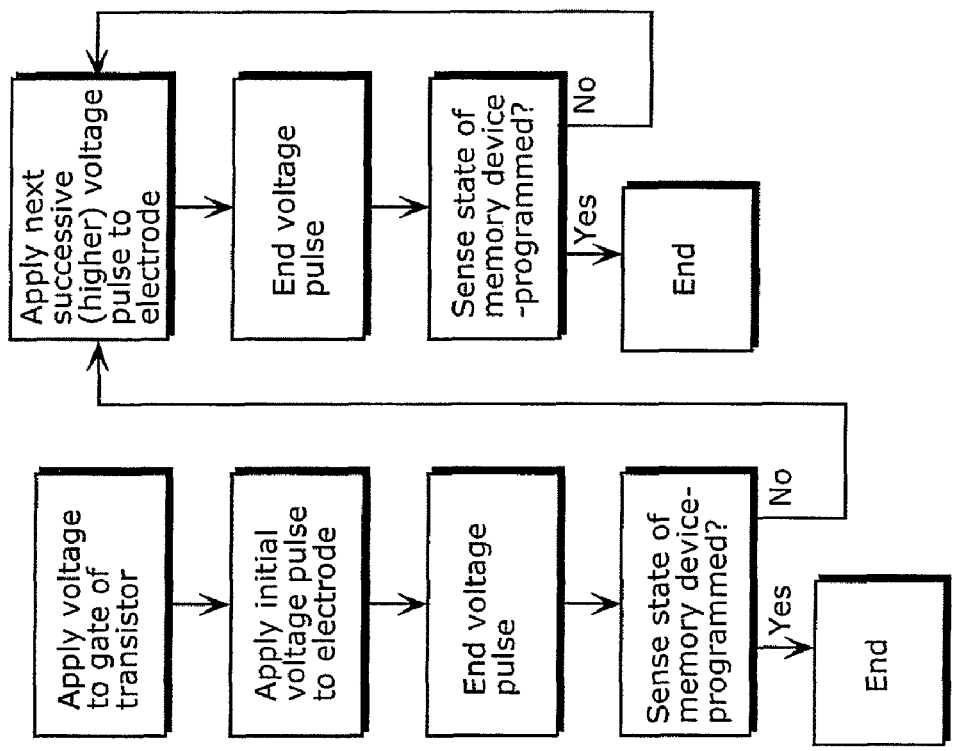
(a) Electrode voltage increase adjustment

NONVOLATILE VARIABLE RESISTANCE MEMORY ELEMENT WRITING METHOD, AND NONVOLATILE VARIABLE RESISTANCE MEMORY DEVICE

TECHNICAL FIELD

The present invention relates to a method of writing data to a nonvolatile variable resistance memory element that changes in resistance value according to an applied electrical signal, and a nonvolatile variable resistance memory device including the nonvolatile variable resistance memory element as a memory cell.

BACKGROUND ART

In recent years, research and development are being conducted on a nonvolatile variable resistance memory device (hereafter also simply referred to as "nonvolatile memory device") having a memory cell that includes a nonvolatile variable resistance memory element (hereafter also simply referred to as "variable resistance element"). The variable resistance element is such an element that has at least two threshold voltages (a threshold voltage for writing and a threshold voltage for erasing), reversibly changes in resistance value by an electrical signal exceeding the writing or erasing threshold voltage, and enables data corresponding to the resistance value to be written in a nonvolatile manner.

As a nonvolatile memory device using such a variable resistance element, the following nonvolatile memory device is typically known. In the nonvolatile memory device, 1T1R memory cells in each of which a MOS transistor and a variable resistance element are connected in series with each other are arrayed in a matrix at crosspoints of orthogonally arranged bit lines and word lines with source lines (the source lines are in parallel with either the bit lines or the word lines).

PTL 1 describes a nonvolatile memory device including 1T1R memory cells in each of which a variable resistance element has a memory layer formed using an amorphous thin film such as a rare-earth oxide film.

FIG. 32 is a diagram showing a structure of a memory cell described in PTL 1.

A memory cell 1001 is formed by electrically connecting a variable resistance element 1002 and a MIS transistor 1003 as an active element for controlling access to the variable resistance element 1002, in series with each other.

The variable resistance element 1002 has a memory layer 1002c sandwiched between a first electrode 1002a and a second electrode 1002b.

As a material used for the memory layer 1002c, a material obtained by containing an easily ionizable metal such as Cu, Ag, or Zn in a rare-earth oxide film is disclosed.

As shown in FIG. 32, voltage application to the memory cell 1001 is performed as follows. A terminal voltage V1 is applied to a terminal of the variable resistance element 1002 opposite to a terminal connected to the MIS transistor 1003. A terminal voltage V2 is applied to a terminal (for example, a source terminal) of the MIS transistor 1003 opposite to a terminal connected to the variable resistance element 1002. A gate voltage Vgs is applied to a gate of the MIS transistor 1003.

By applying the terminal voltages V1 and V2 respectively to these ends of the variable resistance element 1002 and the MIS transistor 1003 constituting the memory cell 1001, a potential difference V (=|V2−V1|) is created across both terminals.

As a method of writing to the memory cell 1001, a bipolar resistance change operation is disclosed. That is, when the variable resistance element 1002 is in a high resistance state, the gate of the MIS transistor 1003 is turned ON and the voltage V (=|V2−V1|) is applied across both terminals of the memory cell 1001. In the case where the voltage across both ends of the variable resistance element 1002 exceeds the above-mentioned writing threshold voltage of the variable resistance element 1002, the variable resistance element 1002 decreases in resistance value and changes from the high resistance state to a low resistance state. When the variable resistance element 1002 is in the low resistance state, the gate of the MIS transistor 1003 is turned ON and the voltage V opposite in polarity to that in the writing step is applied across the variable resistance element 1002 and the MIS transistor 1003 in the memory cell 1001. In the case where the voltage across both ends of the variable resistance element 1002 exceeds the above-mentioned erasing threshold voltage of the variable resistance element 1002, the variable resistance element 1002 increases in resistance value and changes from the low resistance state to the high resistance state.

As shown in FIG. 33, in the change of the variable resistance element 1002 from the high resistance state to the low resistance state, the resistance value of the variable resistance element 1002 is determined by a current-voltage operating point of the series connected variable resistance element 1002 and MIS transistor 1003. This value is determined by a current value flowing when the voltage of the variable resistance element 1002 becomes the writing threshold voltage (denoted by Vth).

Accordingly, the resistance value of the variable resistance element 1002 in the low resistance state can be controlled by the gate voltage of the MIS transistor 1003. In FIG. 33, by changing the gate voltage to VG3, VG2, and VG1, the operating point near the threshold voltage Vth is changed to P3, P2, and P1, so that the resistance value of the variable resistance element 1002 can be arbitrarily set to be lower (larger in current) in this order. This property is utilized to provide a multi-value memory device capable of recording information of three values or more.

PTL 2 describes a nonvolatile memory device including 1T1R memory cells in each of which a variable resistance element comprises a strongly-correlated electron oxide.

FIG. 34 is a diagram showing a structure of a memory cell described in PTL 2.

A memory cell 1140 is formed by electrically connecting a variable resistance element 1130 and a MOS transistor 1138 as an active element for controlling access to the variable resistance element 1130, in series with each other.

The variable resistance element 1130 has a variable resistance layer 1134 sandwiched between a first electrode 1136 and a second electrode 1132.

As a material used for each component, titanium (Ti) for the first electrode 1136, copper (Cu) for the second electrode 1132, and copper oxide (CuO) for the variable resistance layer 1134 are disclosed.

As a method of writing to the memory cell 1140, when the variable resistance element 1130 is in the high resistance state, one of drain and source terminals of the MOS transistor 1138 (for example, the source terminal) not connected to the variable resistance element 1130 is set to a reference voltage (ground), and a positive voltage is applied to the first electrode 1136 so that a programming voltage Vpg is applied to the variable resistance element 1130. This causes the variable resistance element 1130 to change from the high resistance state to the low resistance state, as a result of which the memory cell 1140 becomes the low resistance state.

On the other hand, when the variable resistance element 1130 is in the low resistance state, an erasing voltage Ver causing a current to flow from the second electrode 1132 to the first electrode 1136 is applied to the variable resistance element 1130. This causes the variable resistance element 1130 to change from the low resistance state to the high resistance state, as a result of which the memory cell 1140 becomes the high resistance state.

It is also disclosed that the resistance value of the memory cell 1140 in the low resistance state is determined in inverse proportion to the voltage of the gate G or the programming voltage Vpg in the programming step mentioned above. That is, the resistance value of the memory cell 1140 shifts to a lower value when the voltage of the gate G or the programming voltage Vpg increases.

Hence, a low resistance value adjustment unit that detects a resistance level and, in the case where writing to the low resistance state is insufficient, performs adjustment by decreasing the write level while increasing the write voltage is disclosed in PTL 2.

FIG. 35(a) is a flowchart for adjusting the resistance value while increasing the applied voltage of the upper electrode 1136, and FIG. 35(b) is a flowchart for adjusting the resistance value while increasing the applied voltage of the gate G of the transistor 1138.

PTL 1 discloses applications to multi-value memory devices. According to the disclosure, even in the case of applying to a two-value memory of the low resistance state and the high resistance state, variations in current capability caused by variations in transistor manufacturing process appear as variations in low resistance value.

Such variations in low resistance value can be effectively suppressed by the adjustment unit in PTL 2 that adjusts the resistance level while successively increasing the same-polarity voltage in low resistance writing.

In a memory device that utilizes a resistance change of a memory cell for writing data, data discrimination reliability is enhanced by separating, with a margin, a distribution difference between the high resistance state and the low resistance state of a large number of memory cells. Moreover, a reading speed of the memory device is generally based on a worst value of a memory cell through which a large cell current flows (a memory cell in the low resistance state). Accordingly, by lowering an upper limit of the low resistance value in the variable resistance memory, a higher speed can be attained. Hence, it is very important to set the cell current of the memory cell in the low resistance state, to a specified value or more.

CITATION LIST

Patent Literature

[PTL 1]
Japanese Unexamined Patent Application Publication No. 2005-235360 (FIGS. 2, 4)
[PTL 2]
U.S. Pat. No. 7,289,351 (FIGS. 2, 4, 5)

SUMMARY OF INVENTION

Technical Problem

As one type of nonvolatile variable resistance memory device, the present inventors have examined a nonvolatile variable resistance memory device including memory cells in each of which a variable resistance layer comprises an oxygen-deficient oxide of a transition metal such as tantalum or hafnium.

Here, the oxygen-deficient oxide is an oxide that is deficient in oxygen compared to its stoichiometric composition.

Many metal oxides having stoichiometric compositions exhibit insulating properties. However, by making such metal oxides oxygen-deficient, they exhibit semiconducting or conducting properties.

Suppose the same rewriting method as in PTL 2 is performed on a memory cell whose variable resistance layer comprises the oxygen-deficient oxide of the transition metal as mentioned above, that is, a write pulse of a positive voltage is applied to change the memory cell to the high resistance state and a write pulse of a negative voltage is applied to change the memory cell to the low resistance state. In this case, there is a possibility that, when the memory cell changes from the high resistance state to the low resistance state, the memory cell cannot reach a sufficient low resistance level and is shifted toward a higher resistance. This poses a problem. A low resistance state in which the memory cell has an intermediate low resistance, value is hereafter referred to as "half LR state".

When the above situation occurs, in a nonvolatile variable resistance memory device having a plurality of memory cells, due to a memory cell state of a half LR level, a read window which is a resistance difference between the high resistance state and the low resistance state diminishes and as a result the reading speed decreases, or variations in resistance state cause the window to disappear and make it impossible to perform reading. Thus, property degradation or malfunctions take place.

Hence, the memory cell characteristics of the half LR state present a new problem.

The present invention has been made in view of the above circumstances, and has an object of providing a variable resistance element writing method and a nonvolatile memory device that, even when a variable resistance element has a possibility of becoming the half LR state, can ensure a maximum resistance change window by correcting the variable resistance element to a normal low resistance state.

Solution to Problem

To achieve the stated object, one form of a variable resistance element writing method according to the present invention is a method of writing data to a nonvolatile variable resistance memory element that includes a first electrode and a second electrode and reversibly changes between a high resistance state and a low resistance state according to a polarity of a voltage applied across the first electrode and the second electrode, the writing method including: performing high resistance writing by applying a positive first voltage to the second electrode with respect to the first electrode, to set the nonvolatile variable resistance memory element to the high resistance state; performing low resistance writing by applying a negative second voltage to the second electrode with respect to the first electrode, to set the nonvolatile variable resistance memory element to the low resistance state; and performing low resistance stabilization writing by applying a positive third voltage to the second electrode with respect to the first electrode to set the nonvolatile variable resistance memory element to the low resistance state, after the negative second voltage is applied in the low resistance writing.

According to this, after the negative voltage for setting the nonvolatile variable resistance memory element to the low resistance state is applied by the low resistance writing, the positive voltage is further applied. That is, the low resistance stabilization writing is performed after the low resistance writing. Therefore, even in the case where the nonvolatile variable resistance memory element changes to the half LR state as a result of the low resistance writing, the nonvolatile variable resistance memory element can be reliably set to the low resistance state by the low resistance stabilization writing following the low resistance writing.

Moreover, the present invention can also be realized as an initialization method of changing a nonvolatile variable resistance memory element from an initial state immediately after manufacturing to a state of being usable as a memory element, the nonvolatile variable resistance memory element including a first electrode and a second electrode and reversibly changing between a high resistance state and a low resistance state according to a polarity of a voltage applied across the first electrode and the second electrode, the initialization method including: forming by applying a negative fourth voltage to the second electrode with respect to the first electrode, to decrease a resistance value of the nonvolatile variable resistance memory element that is in the initial state immediately after manufacturing; and performing low resistance stabilization writing by applying a positive voltage to the second electrode with respect to the first electrode to set the nonvolatile variable resistance memory element to the low resistance state, after the negative fourth voltage is applied in the forming.

According to this, after the forming by negative voltage application is performed on the nonvolatile variable resistance memory element in the initial state immediately after manufacturing, the low resistance stabilization writing is performed. Therefore, even in the case where the nonvolatile variable resistance memory element changes to the half LR state as a result of the forming, the nonvolatile variable resistance memory element can be reliably set to the low resistance state by the low resistance stabilization writing following the low resistance writing.

Moreover, one form of a nonvolatile variable resistance memory device according to the present invention is a nonvolatile variable resistance memory device that writes data to a nonvolatile variable resistance memory element, the nonvolatile variable resistance memory device including: a memory cell array that includes a plurality of memory cells in each of which a nonvolatile variable resistance memory element and a switch element are connected in series with each other, the nonvolatile variable resistance memory element including a first electrode and a second electrode and reversibly changing between a high resistance state and a low resistance state according to a polarity of a voltage applied across the first electrode and the second electrode; a selection unit that selects at least one memory cell from the memory cell array; a writing power source that supplies power for writing data to the nonvolatile variable resistance memory element; and a writing circuit that applies a voltage for writing data to the nonvolatile variable resistance memory element included in the memory cell selected by the selection unit, with the supply of the power from the writing power source, wherein the writing power source includes: a high resistance writing power source that supplies power for setting the nonvolatile variable resistance memory element to the high resistance state; a low resistance writing power source that supplies power for setting the nonvolatile variable resistance memory element to the low resistance state; and a low resistance stabilization writing power source that supplies power for additionally setting the nonvolatile variable resistance memory element to the low resistance state stably, and the writing circuit includes: a high resistance writing unit that applies, with the supply of the power from the high resistance writing power source, a voltage to the memory cell selected by the selection unit so that a positive first voltage is applied to the second electrode with respect to the first electrode in the nonvolatile variable resistance memory element included in the selected memory cell, the positive first voltage being required to set the nonvolatile variable resistance memory element to the high resistance state; a low resistance writing unit that applies, with the supply of the power from the low resistance writing power source, a voltage to the memory cell selected by the selection unit so that a negative second voltage is applied to the second electrode with respect to the first electrode in the nonvolatile variable resistance memory element included in the selected memory cell, the negative second voltage being required to set the nonvolatile variable resistance memory element to the low resistance state; and a low resistance stabilization writing unit that applies, with the supply of the power from the low resistance stabilization writing power source, a voltage to the memory cell selected by the selection unit so that a positive third voltage is applied to the second electrode with respect to the first electrode in the nonvolatile variable resistance memory element included in the selected memory cell, after the negative second voltage is applied by the low resistance writing unit, the positive third voltage being required to set the nonvolatile variable resistance memory element to the low resistance state.

According to this, after the negative voltage for setting the nonvolatile variable resistance memory element to the low resistance state is applied by the low resistance writing unit, the positive voltage is further applied by the low resistance stabilization writing unit. Therefore, even in the case where the nonvolatile variable resistance memory element changes to the half LR state as a result of the writing by the low resistance writing unit, the nonvolatile variable resistance memory element can be reliably set to the low resistance state by the following writing by the low resistance stabilization writing unit.

Advantageous Effects of Invention

According to the present invention, even in the case where the variable resistance element changes to the half LR state as a result of low resistance writing, the variable resistance element can be reliably set to the low resistance state by low resistance stabilization writing. This makes it possible to provide a nonvolatile variable resistance memory element writing method and a nonvolatile variable resistance memory device that can ensure a maximum resistance change window by suppressing variations in low resistance state even for a variable resistance element with a possibility of half LR state. As a result, the resistance change state of the nonvolatile variable resistance memory element can be stabilized, which contributes to faster memory reading and improved yields.

BRIEF DESCRIPTION OF DRAWINGS

FIG. 16B is a rewriting state change diagram of the selected memory cell in the embodiment of the present invention.

FIG. 18A is a sequence diagram of low resistance stabilization writing and a selected memory cell state image diagram in the embodiment of the present invention.

FIG. 19 is a rewriting state change diagram of the selected memory cell in the embodiment of the present invention.

FIGS. 35(a) and (b) is a flowchart of rewriting to the memory cell described in PTL 2.

DESCRIPTION OF EMBODIMENTS

Figure 1:
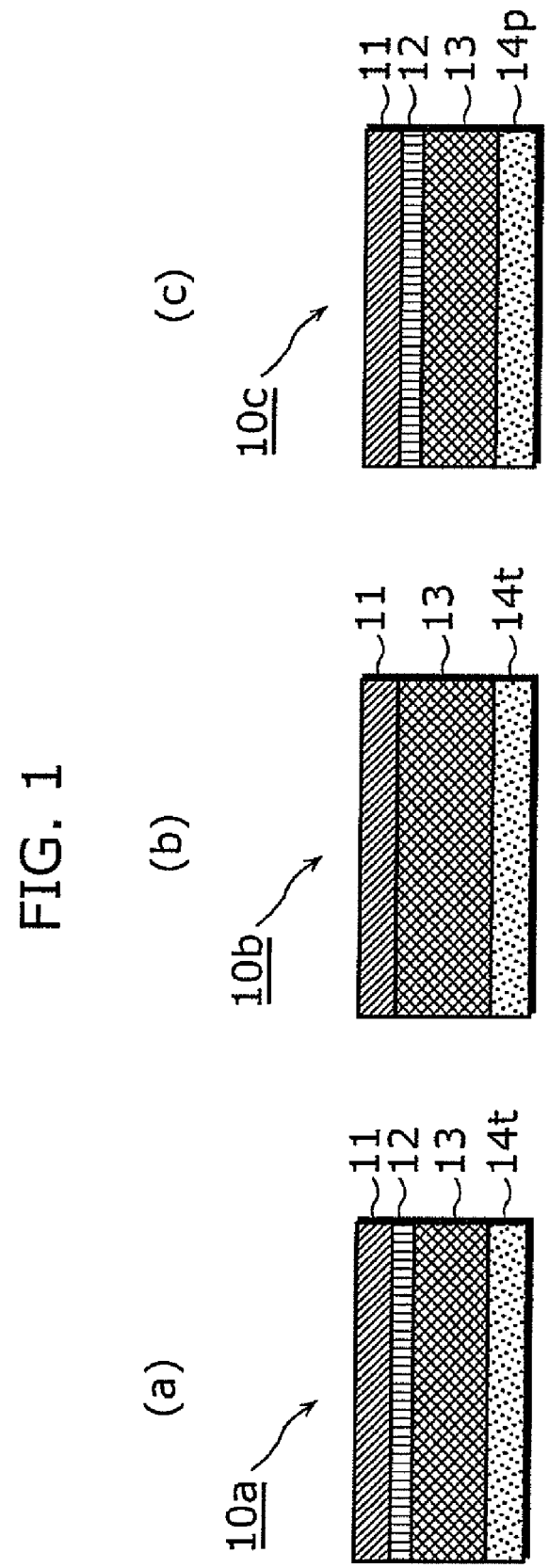
FIG. 1(a) to (c) is a diagram showing a structure of a variable resistance element in an embodiment of the present invention.

The following describes embodiments of the present invention in detail, with reference to drawings.

First, the present inventors have examined a nonvolatile variable resistance memory device including memory cells in each of which an oxygen-deficient oxide of tantalum or hafnium is used in a variable resistance layer as a nonvolatile variable resistance material.

There are mainly three basic structures for this. Schematic diagrams of variable resistance elements 10a, 10b, and 10c of the three types are shown respectively in FIGS. 1(a), (b), and (c).

In FIG. 1(a), oxygen-deficient tantalum oxide ($TaO_x$) or oxygen-deficient hafnium oxide ($HfO_{x'}$) is used in a variable resistance layer 13. An upper interface of the variable resistance layer 13 is irradiated with oxygen plasma at 300° C. and 200 W for 20 seconds, thereby forming a thin oxide layer 12 comprising $TaO_y$ or $HfO_{y'}$ higher in oxygen concentration than $TaO_x$ or $HfO_{x'}$. This structure is then sandwiched between an upper electrode 11 comprising platinum (Pt) and a lower electrode 14t comprising tantalum nitride (TaN).

In FIG. 1(b), oxygen-deficient tantalum oxide ($TaO_x$) or oxygen-deficient hafnium oxide ($HfO_{x'}$) is used in the variable resistance layer 13. The variable resistance layer 13 is sandwiched between the upper electrode 11 comprising platinum (Pt) and the lower electrode 14t comprising tantalum nitride (TaN).

In FIG. 1(c), oxygen-deficient tantalum oxide ($TaO_x$) or oxygen-deficient hafnium oxide ($HfO_{x'}$) is used in the variable resistance layer 13. An upper interface of the variable resistance layer 13 is irradiated with oxygen plasma, thereby forming the thin oxide layer 12 comprising $TaO_y$ or $HfO_{y'}$ higher in oxygen concentration than $TaO_x$ or $HfO_{x'}$. This structure is then sandwiched between the upper electrode 11 comprising platinum (Pt) and a lower electrode 14p.

Here, an oxygen-deficient oxide is an oxide that is deficient in oxygen compared to its stoichiometric composition. Take tantalum which is one type of transition metal, as an example. $Ta_2O_5$ is an oxide having a stoichiometric composition. $Ta_2O_5$ contains 2.5 times more oxygen than tantalum, which is 71.4% in oxygen content percentage. An oxide whose oxygen content percentage is lower than 71.4%, namely, tantalum oxide that, when expressed as $TaO_x$, has a nonstoichiometric composition satisfying 0<x<2.5, is called oxygen-deficient tantalum oxide. Likewise, hafnium oxide ($HfO_{x'}$) satisfying 0<x'<2.0 is called oxygen-deficient hafnium oxide.

Many metal oxides having stoichiometric compositions exhibit insulating properties. However, by making such metal oxides oxygen-deficient, they exhibit semiconducting or conducting properties.

A more preferable composition range of the variable resistance layer is 45 at. % (atomic percentage) to 65 at. % in oxygen content percentage. That is, when oxygen-deficient tantalum oxide used in the variable resistance layer is expressed as $TaO_x$, a more appropriate range of x is $0.8 \leq x \leq 1.9$ (an oxygen content percentage of 45 at. % corresponds to x=0.8, and an oxygen content percentage of 65 at. % corresponds to x=1.9).

In a nonvolatile memory element that uses oxygen-deficient tantalum oxide in its variable resistance film, by using materials having different standard electrode potentials as the upper electrode and the lower electrode, a resistance change is induced predominantly near one of the electrodes, with it being possible to achieve an ideal bipolar resistance change. Moreover, a stable resistance change operation can be performed with no mixture of resistance change modes. On the other hand, when oxygen-deficient hafnium oxide used in the variable resistance layer is expressed as $HfO_{x'}$, a more appropriate range of x' is $0.9 \leq x' \leq 1.6$.

In the case of using tantalum oxide as the variable resistance film, preferably, a material whose standard electrode potential is larger than that of tantalum with a large difference is used as the material of one electrode, and a material whose standard electrode potential is larger than that of tantalum with a small difference is used as the material of the other electrode.

More preferably, a material whose standard electrode potential is larger than that of tantalum is used as the material of one electrode, and a material whose standard electrode potential is smaller than that of tantalum is used as the material of the other electrode.

In the case of using hafnium oxide as the variable resistance film, preferably, a material whose standard electrode potential is larger than that of hafnium with a large difference is used as the material of one electrode, and a material whose standard electrode potential is larger than that of hafnium with a small difference is used as the material of the other electrode. More preferably, a material whose standard electrode potential is larger than that of hafnium is used as the material of one electrode, and a material whose standard electrode potential is smaller than that of hafnium is used as the material of the other electrode.

That is, the variable resistance layer includes the oxygen-deficient transition metal oxide layer as a main variable resistance material, and the first electrode and the second electrode comprise materials formed of different elements, where a standard electrode potential V1 of the first electrode, a standard electrode potential V2 of the second electrode, and a standard electrode potential Vt of the transition metal constituting the transition metal oxide layer satisfy Vt<V2 and V1<V2.

In detail, in the nonvolatile memory element using oxygen-deficient tantalum oxide, it is desirable to use platinum (Pt), iridium (Ir), palladium (Pd), silver (Ag), copper (Cu), gold (Au), or the like as the material of the second electrode, and tungsten (W), nickel (Ni), tantalum (Ta), titanium (Ti), aluminum (Al), or the like as the material of the first electrode. Hence, it is preferable that the second electrode is selected from the group consisting of Pt, Ir, Pd, Ag, Cu, Au, and the like, and the first electrode is selected from the group consisting of W, Ni, Ta, Ti, Al, and the like. In the nonvolatile memory element using oxygen-deficient hafnium oxide, it is desirable to use Pt, Ir, Pd, Ag, Cu, Au, W, or the like as the material of the second electrode, and hafnium (Hf), Ti, Al, or the like as the material of the first electrode. Hence, it is preferable that the second electrode is selected from the group consisting of Pt, Ir, Pd, Ag, Cu, Au, W, and the like, and the first electrode is selected from the group consisting of Hf, Ti, Al, and the like.

According to the above structure, the oxygen concentration of the variable resistance film selectively changes near the interface between the variable resistance film and the electrode of the higher standard electrode potential, as a result of which stable resistance change characteristics can be obtained.

Here, the variable resistance layer may have a stack structure in which a first oxygen-deficient tantalum oxide layer having a composition expressed as $TaO_x$ (where $0.8 \leq x \leq 1.9$) and a second oxygen-deficient tantalum oxide layer having a composition expressed as $TaO_y$ (where x<y) are stacked, or a stack structure in which a first oxygen-deficient hafnium oxide layer having a composition expressed as $HfO_{x'}$ (where $0.9 \leq x' \leq 1.6$) and a second oxygen-deficient hafnium oxide layer having a composition expressed as $HfO_{y'}$ (where x'<y') are stacked.

According to the above structure, the oxygen concentration of the second oxygen-deficient metal oxide layer changes near the interface between the second oxygen-deficient metal oxide layer and the electrode, as a result of which stable resistance change characteristics can be obtained.

Furthermore, the second oxygen-deficient tantalum oxide layer may be positioned on the second electrode side.

Figure 2:
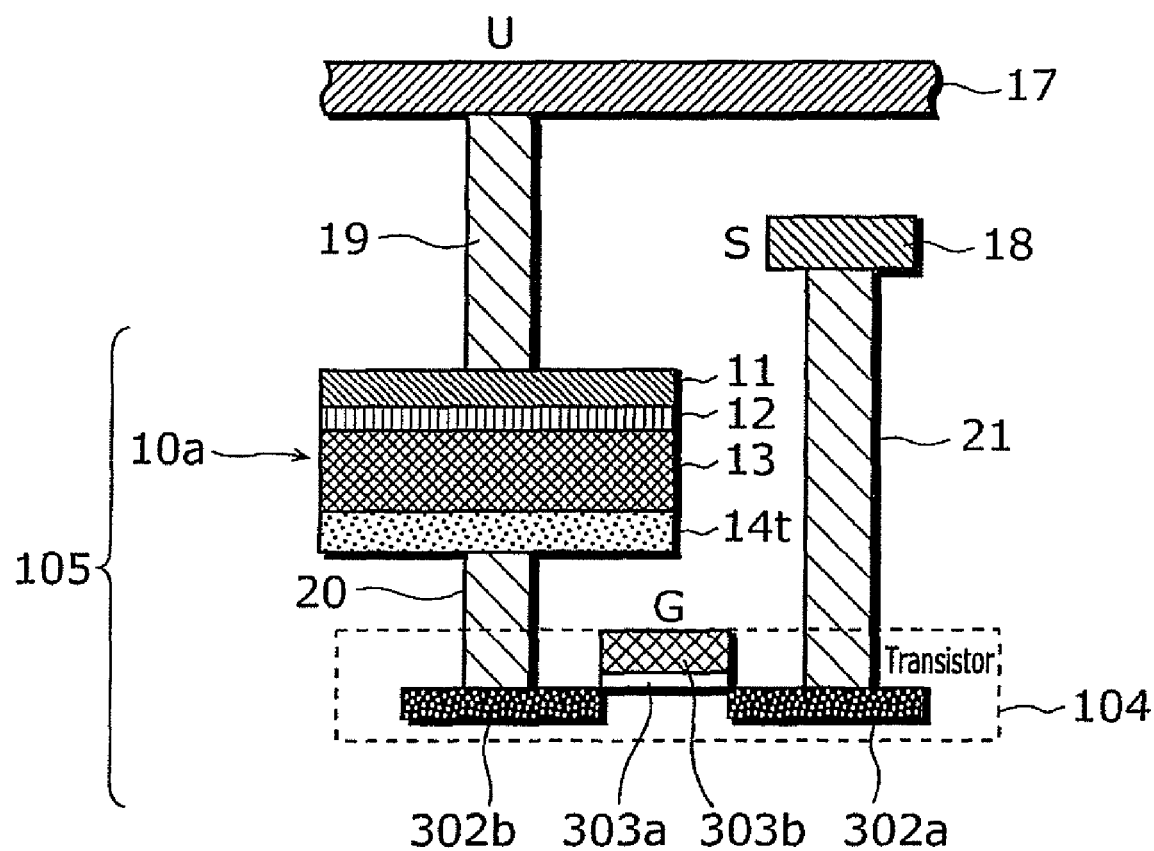
FIG. 2 is a diagram showing a structure of a memory cell in the embodiment of the present invention.

FIG. 2 shows a 1T1R memory cell 105 in which the variable resistance element 10a is connected to a transistor 104. The lower electrode 14t of the variable resistance element 10a and a diffusion region 302b of the transistor 104 are connected by a via 20.

Terminals of the memory cell 105 include a terminal U where the upper electrode 11 is drawn to a second wiring layer 17 through a via 19, a terminal S where a diffusion region 302a of the transistor 104 connected to the lower electrode 14t is drawn to a first wiring layer 18 through a via 21, and a terminal G that is a gate electrode 303b of the transistor 104. The transistor 104 includes a gate oxide film 303a.

Though FIG. 2 shows an example where the variable resistance element 10a shown in FIG. 1(a) is used as the variable resistance element in the memory cell 105, even in the case of using the variable resistance element 10b or 10c shown in FIG. 1(b) or (c), the lower electrode 14p or 14t is connected to the diffusion region 302b of the transistor 104 by the via 20, in the same way as the variable resistance element 10a.

Figure 3:
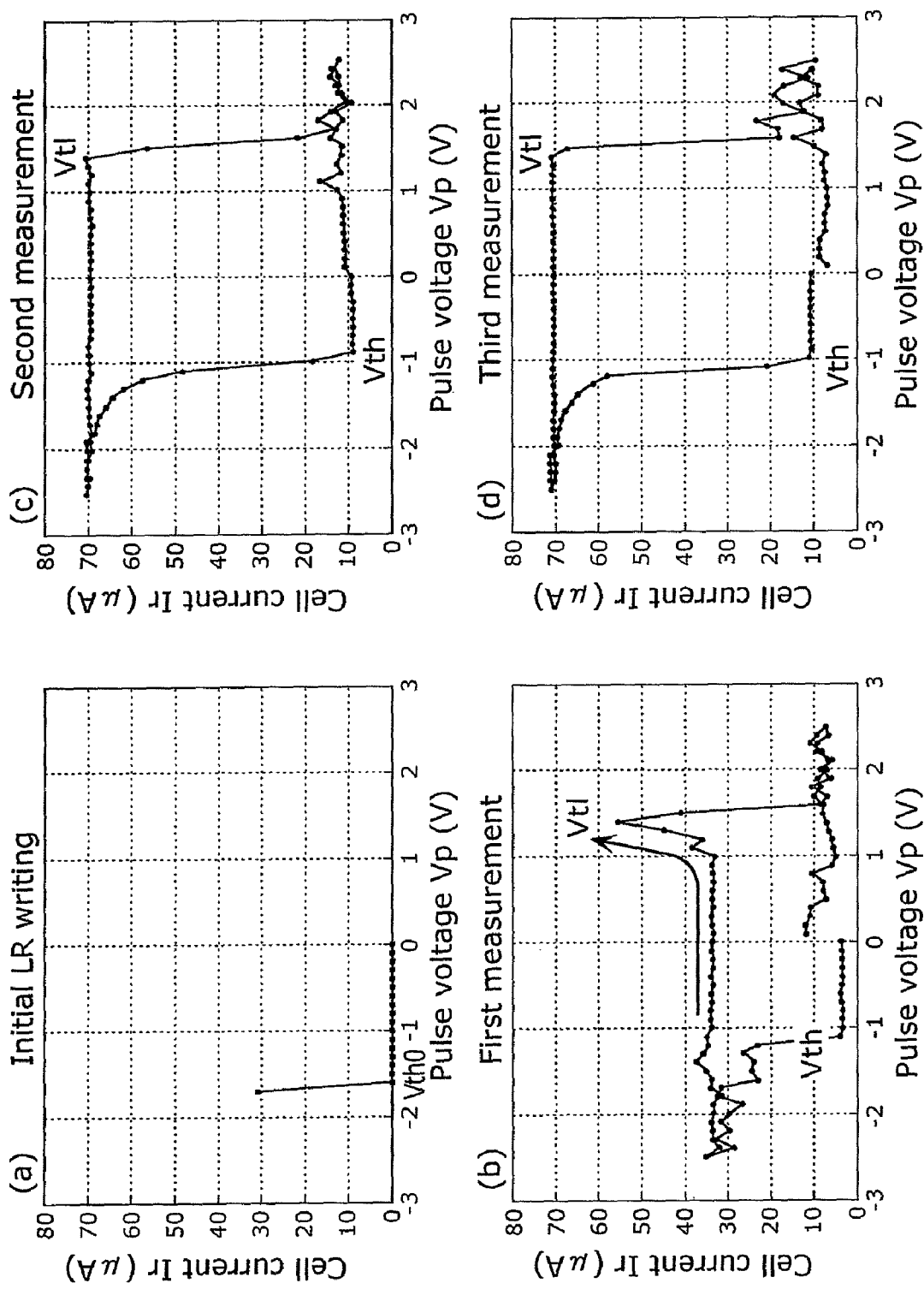
FIG. 3(a) to (d) is a pulse V-I characteristic graph of the memory cell in the embodiment of the present invention.
Figure 6:
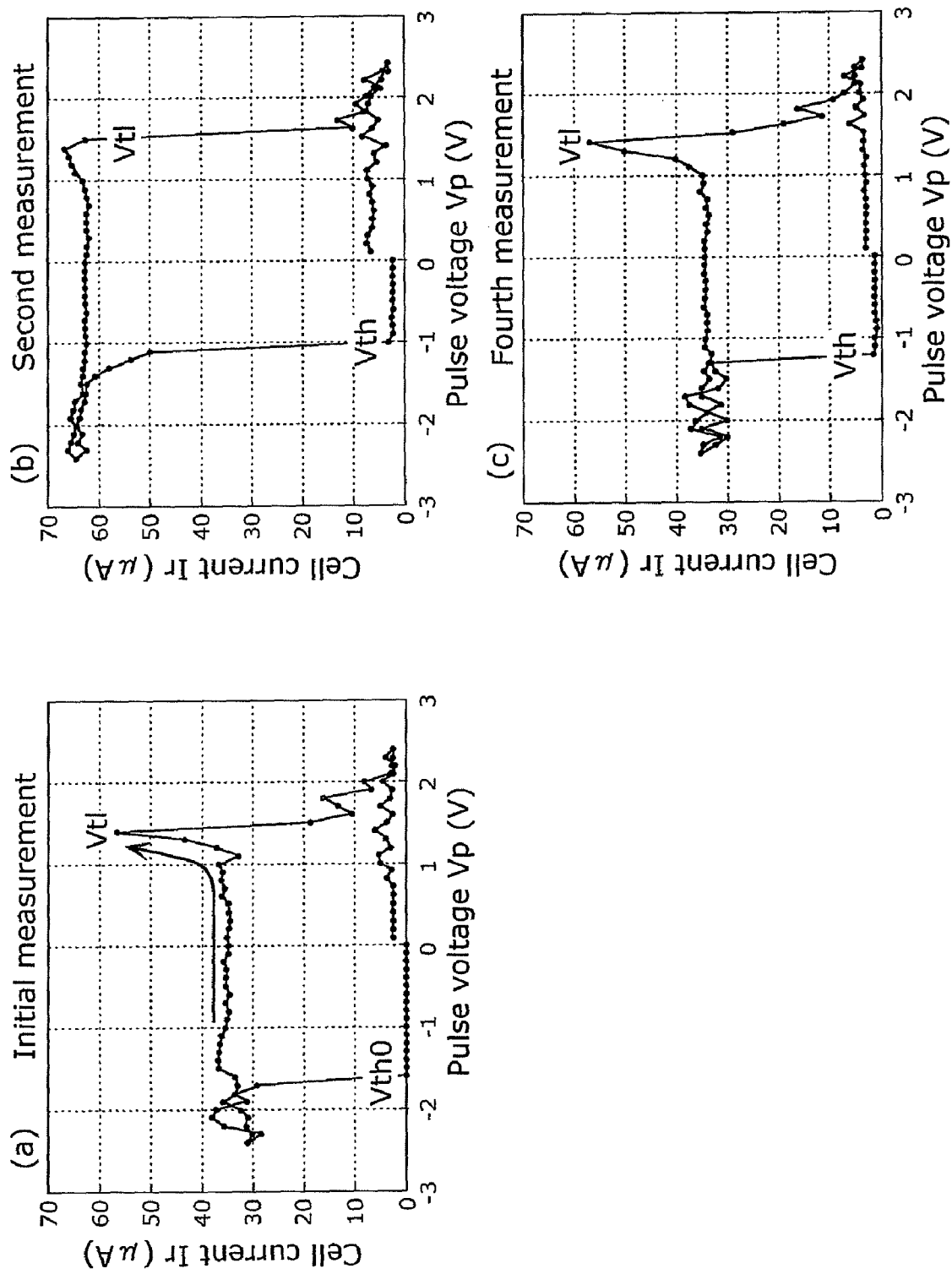
FIG. 6(a) to (c) is a pulse V-I characteristic graph of the memory cell in the embodiment of the present invention.
Figure 7:
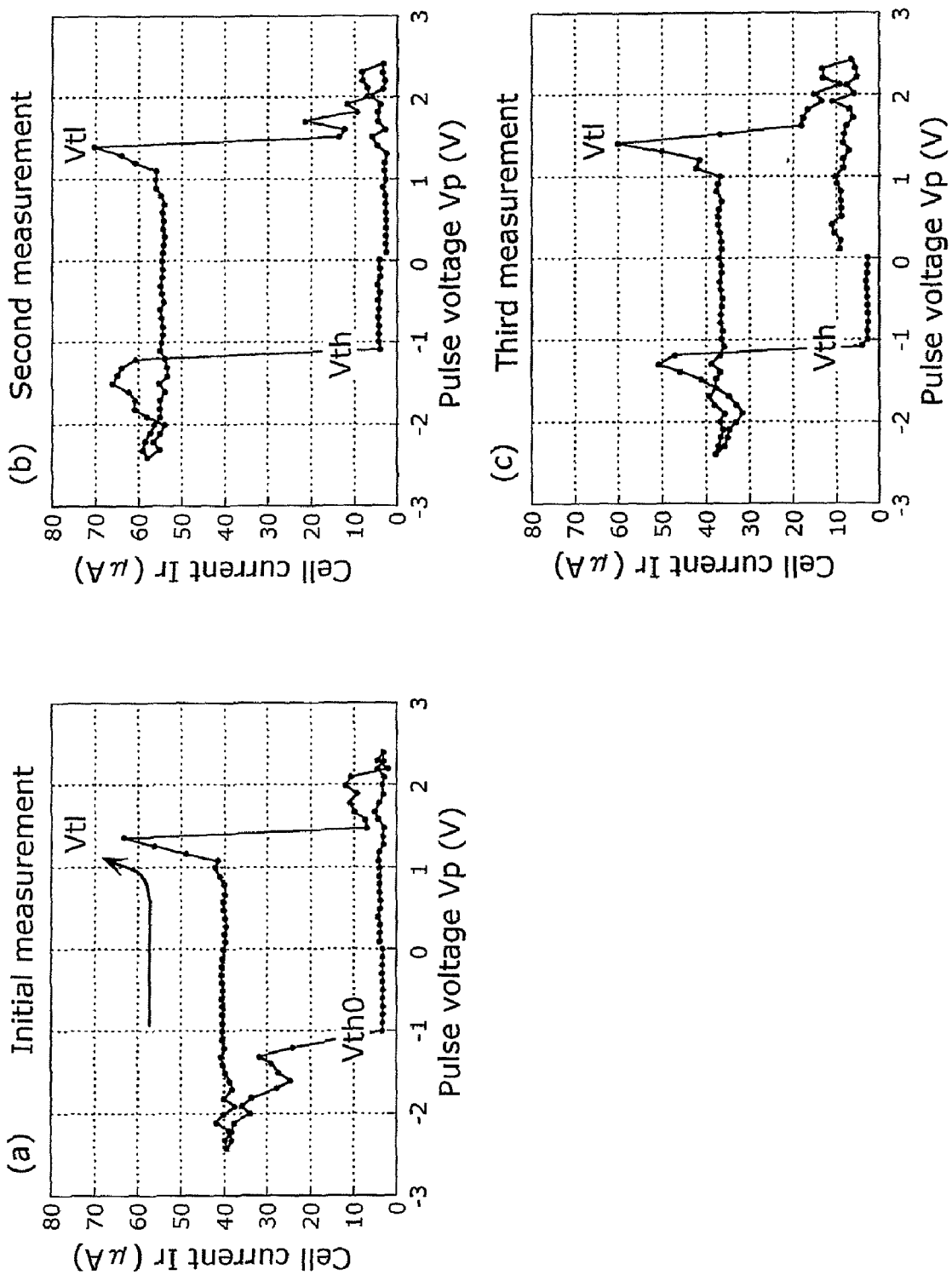
FIG. 7(a) to (c) is a pulse V-I characteristic graph of the memory cell in the embodiment of the present invention.

FIGS. 3, 6, and 7 show examples of current-voltage characteristic graphs indicating three different resistance change characteristics obtained when the three different variable resistance elements 10a to 10c shown in FIG. 1 are used in the memory cell 105 shown in FIG. 2. In this specification, regarding a polarity of voltage application, the case where a higher voltage is applied to the upper electrode 11 than the lower electrode 14t or 14p in the variable resistance elements 10a to 10c is defined as positive voltage application, unless otherwise indicated. Note here that specific terminals to which a voltage is applied are not limited to both terminals of the variable resistance element, but include both terminals of the memory cell in which the variable resistance element and the transistor are connected in series. Which of these terminals a voltage is applied to are clearly stated in each embodiment.

Embodiment 1

The following describes a variable resistance element writing method and a nonvolatile memory device in Embodiment 1 of the present invention.

FIG. 3 is a current-voltage characteristic graph showing an example of a pulse voltage (Vp) and a cell current (Ir) associated with a resistance change of the memory cell 105. The horizontal axis represents the value of the pulse voltage Vp from a negative voltage to a positive voltage, when applying a voltage (=2.4 V) for turning ON the transistor 104 to the terminal G of the transistor 104 in FIG. 2, and applying a resistance change pulse (0 V→Vp→0 V, with a pulse width of 50 ns) across the terminals U and S in FIG. 2 with the terminal S being set to a reference potential. The vertical axis represents the value of a read current flowing through the variable resistance element 10a when, after the voltage application by the resistance change pulse, applying a voltage Vr=0.4 V of a lower absolute value than a writing or erasing threshold voltage across both ends of the variable resistance element 10a as a read voltage. Voltage-current characteristics according to this measurement method are hereafter referred to as pulse V-I characteristics. Note that the writing or erasing threshold voltage is a maximum voltage (absolute value) that can be applied without changing the resistance value of the variable resistance element. In other words, the writing or erasing threshold voltage is a maximum voltage (absolute value) that can be applied upon reading without changing the resistance value of the variable resistance element.

FIG. 3(a) is a pulse V-I characteristic graph (measurement of the cell current Ir flowing through the variable resistance element when applying the pulse voltage Vp to the variable resistance element), when the variable resistance element 10a in a high resistance state (HR, Vp=0 V to −1.6 V) which is an initial state immediately after manufacturing is changed to a low resistance state (LR) by an initial forming step (application of Vp=−1.7 V). FIG. 3(b) shows the result of the first measurement according to the above evaluation method. FIG. 3(c) shows the result of the second measurement according to the same evaluation method. FIG. 3(d) shows the result of the third measurement according to the same evaluation method. Similar waveforms are subsequently repeated, and so they are omitted in FIG. 3.

Note that "forming" means to change (initialize) the variable resistance element in the initial state immediately after manufacturing, to a state of being able to reversibly change between a high resistance state (HR) and a low resistance state (LR) according to a polarity of an applied voltage. In the initial state, the variable resistance element is typically in a higher resistance state than the high resistance state of ordinary use. Such a variable resistance element is changed to the low resistance state by the forming step, to enable a resistance change. Therefore, "variable resistance element in the initial state immediately after manufacturing" or "variable resistance element immediately after manufacturing" means a variable resistance element that, after manufacturing, has not yet been in a state of being able to reversibly change between the high resistance state (HR) and the low resistance state (LR) according to the polarity of the applied voltage (i.e., has not yet been initialized).

Figure 4:
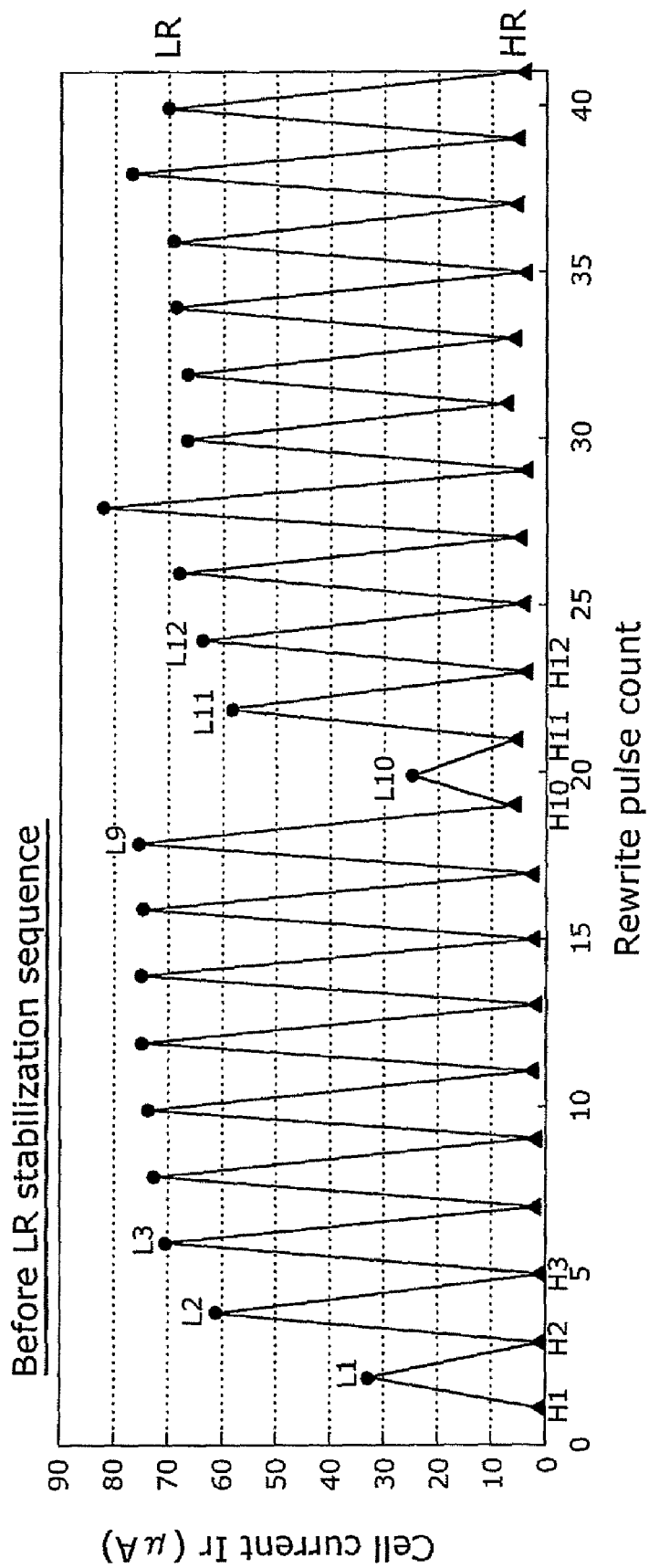
FIG. 4 is a resistance change characteristic graph by positive and negative alternating pulse application to the memory cell in the embodiment of the present invention.
Figure 5:
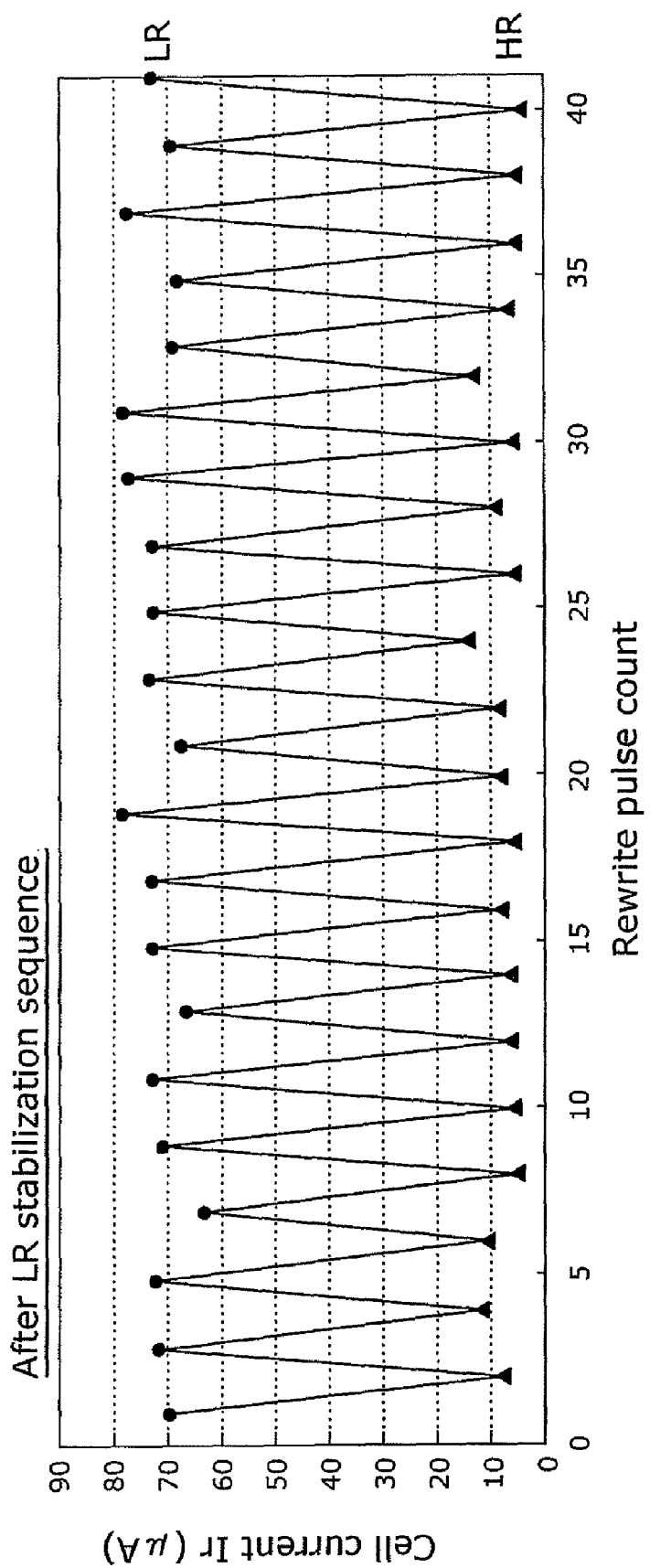
FIG. 5 is a resistance change characteristic graph by positive and negative alternating pulse application to the memory cell in the embodiment of the present invention.

Ordinary resistance change measurement by a positive and negative alternating pulse is performed before the pulse V-I measurement of FIG. 3(b) and after the pulse V-I measurement of FIG. 3(d). FIG. 4 is a resistance change characteristic graph before the measurement of FIG. 3(b). FIG. 5 is a resistance change characteristic graph after the measurement of FIG. 3(d).

The following shows measurement sequence steps of FIGS. 3(a), (b), (c), and (d), FIG. 4, and FIG. 5.
(Evaluation Step 1)
  FIG. 3(a): a forming step by the pulse V-I method (initial LR writing)
  Pulse voltage Vp=0 V→−1.7 V (in 0.1 V steps)
(Evaluation Step 2)
  FIG. 4: resistance change measurement by positive and negative alternating pulse (before LR stabilization sequence)
  Pulse voltage Vp=−2.4 V⇔+2.4 V, applied 41 times
(Evaluation Step 3)
  FIG. 3(b): first pulse V-I measurement
  Pulse voltage Vp=0 V→>−2.4 V→0 V→+2.4 V→0 V (in 0.1 V steps)
(Evaluation Step 4)
  FIG. 3(c): second pulse V-I measurement
  Pulse voltage Vp=0 V→−2.4 V→0 V→+2.4 V→0 V (in 0.1 V steps)
(Evaluation Step 5)
  FIG. 3(d): third pulse V-I measurement
  Pulse voltage Vp=0 V→−2.4 V→0 V→+2.4 V→0 V (in 0.1 V steps)
(Evaluation Step 6)
  FIG. 5: resistance change measurement by positive and negative alternating pulse (after LR stabilization sequence)
  Pulse voltage Vp=−2.4 V⇔+2.4 V, applied 41 times FIG. 3(a) is a pulse V-I characteristic graph in the initial forming step immediately after manufacturing, where the resistance state before measurement is a high resistance state. When the pulse voltage Vp is applied while changing it from 0 V to the negative voltage side, first the memory cell 105 is in the high resistance state (initial state), but changes to the low resistance state when the pulse voltage Vp falls below Vth0 (when the absolute value of the pulse Vp exceeds the absolute value of Vth0). The resistance level at this time is about 30 μA in cell current. Hence, the forming step (initial LR writing) is completed. Once the resistance state of the memory cell has shifted to the low resistance side, further high voltage pulse application is stopped. This is because any more pulse voltage application in the initial stage tends to cause an unstable resistance value in the high resistance state in subsequent stages.

Resistance change measurement by positive and negative alternating pulse application in FIG. 4 is performed next in the measurement order.

FIG. 4 shows an example of resistance change when positive and negative pulses are alternately applied to the same memory cell 105 as in FIG. 3, after executing the forming step shown in FIG. 3(a). In detail, a voltage of 2.4 V sufficient to turn ON the transistor 104 is applied to the gate of the transistor 104, and pulse voltages of −2.4 V and +2.4 V sufficiently larger than the resistance change thresholds for low resistance writing and high resistance writing of the variable resistance element 10a are alternately applied across the terminals U and 5, with respect to the terminal S. When a pulse of +2.4 V is applied to the memory cell 105 which is in the low resistance state after the forming step shown in FIG. 3(a), the memory cell 105 changes to the high resistance state. In the following reading measurement, the resistance level is about 1 μA (point H1 in FIG. 4). Next, when a pulse of −2.4 V is applied to the memory cell 105 which is in the high resistance state, the memory cell 105 changes to the low resistance state. In the following reading measurement, the resistance level is about 32 µA (point L1 in FIG. 4). Subsequently, the positive and negative alternating pulses are repeatedly applied. As a result, the resistance value changes as point H2 (1 µA)→point L2 (61 µA)→point H3 (1 µA)→point L3 (70 µA) . . . . Though the low resistance state remains at about 75 µA up to point L9, the low resistance state becomes 25 µA at point L10.

Thus, the resistance change by positive and negative alternating pulse application has unstable characteristics where an intermediate resistance state (half LR state) between the high resistance state (about 1 to 3 µA) and the low resistance state (about 70 µA) occasionally occurs like points L1 and L10 in the low resistance state. This is a specific example of the problem to be solved by the present invention.

The present inventors have found that the occurrence of the half LR state has three types, in the repeated measurement of the pulse V-I characteristics of the memory cell.

The three types have the following features.

(1) Pulse V-I Characteristics of First Type

The half LR state occurs only in the first measurement immediately after manufacturing (FIG. 3).

Most cells in a memory cell array correspond to this type.

(2) Pulse V-I Characteristics of Second Type

The half LR state occurs on rare occasions even after the first measurement (FIG. 6).

(3) Pulse V-I Characteristics of Third Type

The half LR state occurs each time even after the first measurement (FIG. 7).

The following describes the features of these three types and the resistance change by positive and negative alternating pulse application, in detail.

The pulse V-I characteristics of the first type are described first.

FIG. 3(b) is a pulse V-I characteristic graph of the measurement following the positive and negative alternating pulse measurement in FIG. 4 (i.e., a pulse V-I characteristic graph obtained after the positive and negative alternating pulse measurement in FIG. 4). The first resistance state in FIG. 3(b) is the last state in FIG. 4 (the high resistance state after applying the positive and negative alternating pulse 41 times). When the pulse voltage Vp is applied while changing it from 0 V to the negative voltage side, first the memory cell 105 is in the high resistance state, but changes to the low resistance state when the pulse voltage Vp falls below Vth (when the absolute value of Vp exceeds the absolute value of Vth). The resistance level of the low resistance state at this time is about 34 µA in cell current, that is, the half LR state. After this, the pulse voltage Vp is successively changed from the negative voltage side to the positive voltage side. When the pulse voltage exceeds about +1 V and reaches Vtl, the cell current increases to 55 µA, so that the memory cell 105 changes to the low resistance state (normal low resistance state) that is lower than when the negative voltage pulse is applied. When the pulse voltage exceeds Vtl, the cell current decreases to about 8 µA, so that the memory cell 105 changes to the high resistance state. The voltage Vtl at which the change from the low resistance state to the high resistance state starts is referred to as "high resistance writing threshold voltage" (or "high resistance writing start voltage"). This voltage is a voltage at which the resistance value of the variable resistance element that is in the half LR state becomes lowest (i.e., the normal low resistance state).

That is, as a result of negative pulse voltage application, the memory cell 105 once changes to the low resistance state of the intermediate level (half LR state). However, by applying a positive pulse voltage equal to or lower than Vtl, the memory cell 105 changes to the low resistance state (normal low resistance state) that is lower in resistance value than the low resistance state to which the memory cell has been changed by the negative pulse voltage. After this, by applying a positive pulse voltage exceeding Vtl, the memory cell 105 changes to the high resistance state.

FIG. 3(c) shows the result of the second measurement on the same sample as in FIG. 3(b) according to the same evaluation method and measurement condition. In this case too, first the memory cell 105 is in the high resistance state as in the first measurement. When the pulse voltage Vp falls below Vth, the memory cell 105 changes to the sufficient (normal) low resistance state. When the pulse voltage Vp is further decreased, the cell current increases to 70 µA. After this, the pulse voltage Vp is changed from the negative voltage side to the positive voltage side, but the cell current remains at about 70 µA until the pulse voltage exceeds Vtl. When the pulse voltage exceeds Vtl, the cell current decreases to about 10 µA.

That is, when the pulse voltage falls below Vth (exceeds Vth in absolute value) as a result of negative pulse voltage application, the memory cell 105 changes to the low resistance state. Here, the memory cell 105 eventually changes to the sufficient low resistance state (normal low resistance state) by the negative pulse alone. This low resistance state is maintained approximately at the same level while the positive pulse voltage equal to or lower than Vtl is being applied. When the positive pulse voltage exceeding Vtl is applied, the memory cell 105 changes to the high resistance state.

FIG. 3(d) shows the result of the third measurement on the same sample as in FIG. 3(b) according to the same evaluation method and measurement condition. In FIG. 3(d), the cell current follows approximately the same path as in FIG. 3(c).

That is, when the pulse voltage falls below Vth as a result of negative pulse voltage application, the memory cell 105 changes to the low resistance state. Here, the memory cell 105 eventually changes to the sufficient low resistance state (the cell current increases to 70 µA) by the negative pulse alone. This low resistance state is maintained approximately at the same level while the positive pulse voltage equal to or lower than Vtl is being applied. When the positive pulse voltage exceeding Vtl is applied, the memory cell 105 changes to the high resistance state (about 10 µA in cell current).

When comparing FIGS. 3(b) and (c), the process of the change to the low resistance state is clearly different. In detail, even when the same pulse voltage sufficient for the change from the high resistance state to the low resistance state is applied, in the case of FIG. 3(b), there is a phenomenon (i.e., the half LR state) that the resistance only changes to the intermediate level between the high resistance state and the low resistance state in FIG. 3(c). Such a resistance state of the memory cell can be changed to a level close to the low resistance state in FIG. 3(c), by applying a positive pulse voltage equal to or slightly lower than Vtl.

Here, the characteristics of the memory cell corresponding to the pulse V-I characteristic graph shown in FIG. 3(c) are referred to as "characteristic type 1", and the characteristics of the memory cell corresponding to the pulse V-I characteristic graph shown in FIG. 3(b) are referred to as "characteristic type 2".

The following describes an estimated resistance change mechanism of the characteristic type 2 that becomes the half LR state and, by a positive voltage near Vtl, reaches a peak in the low resistance state as shown in FIG. 3(b), with reference to FIG. 8(a) to (d).

Figure 8:
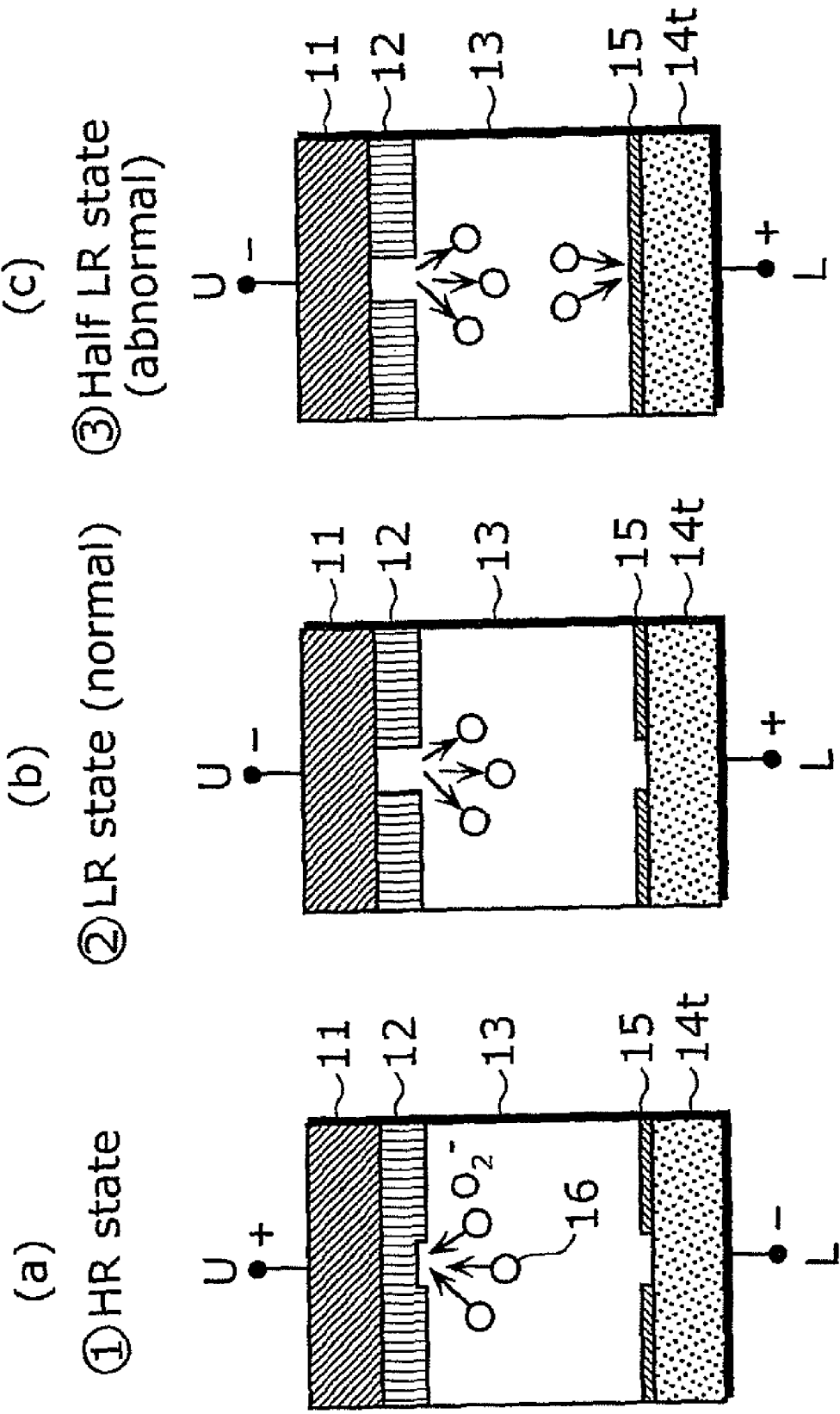
FIG. 8(a) to (d) is a resistance change mechanism estimation diagram of a half LR state in the embodiment of the present invention.

Typically, the high resistance state (FIG. 8(a)) and the low resistance state (FIG. 8(b) or (c)) are created by movement of oxygen ions 16 between the variable resistance layer 13 and the oxide layer 12 near the upper electrode interface. When the oxygen ions 16 are taken into the oxide layer 12 to thereby induce a high oxidation state, the high resistance state is created. When the oxygen ions 16 are released from the oxide layer 12 to thereby induce a low oxidation state, the low resistance state is created. The resistance change phenomenon by the oxygen ion movement occurs near the interface between the upper electrode 11 and the variable resistance layer 13, by forming the oxide layer 12 on the upper electrode 11 side as shown in FIG. 8(a), or by forming the upper electrode 11 using a material (for example, a precious metal material such as platinum) less easily oxidizable than the metal of the variable resistance layer 13 and forming the lower electrode 14t using a material (for example, tantalum nitride) more easily oxidizable than the material of the upper electrode 11 as shown in FIG. 1(b). In this case, when a positive voltage pulse is applied to the terminal U on the upper electrode side with respect to the terminal L on the lower electrode side, the oxygen ions 16 are absorbed into the variable resistance layer 13 near the upper electrode 11 to thereby form the oxide layer 12 containing a high concentration of oxygen, which causes the change to the high resistance state (FIG. 8(a)). On the other hand, when a negative voltage pulse is applied to the terminal U on the upper electrode side, the oxygen ions 16 are released from the oxide layer 12, which causes the change to the low resistance state (FIG. 8(b)). Consider this in terms of the direction of the current upon resistance change. In the case where the oxygen ion movement occurs in the interface with the upper electrode, the oxygen ions 16 are absorbed into the oxide layer 12 on the upper electrode side to thereby change to the high resistance state when the current flows from the upper electrode to the lower electrode, and the oxygen ions 16 are released from the oxide layer 12 on the upper electrode side to thereby change to the low resistance state when the current flows from the lower electrode to the upper electrode.

The following estimation can be made regarding the reason for the phenomenon that the cell current is maximized (further decrease in resistance value) by positive voltage pulse application near Vtl as shown in FIG. 3(b). A thin oxide layer 15 also exists near the lower electrode interface, and the oxygen ions 16 move between the thin oxide layer 15 and the variable resistance layer 13. In this case, when a positive voltage pulse is applied to the terminal U on the upper electrode side with respect to the terminal L on the lower electrode side, a current flows from the upper electrode to the lower electrode. This causes the oxygen ions 16 to be released from the thin oxide layer 15 near the lower electrode interface, as a result of which the neighborhood of the lower electrode interface changes to the low resistance state (FIG. 8(d)). Thus, the application of the positive voltage pulse near Vtl induces such a phenomenon that the oxygen ions 16 are released from the oxide layer 15 near the interface of the lower electrode 14t into the variable resistance layer 13, so that the cell current is maximized (further decrease in resistance value). On the other hand, when a negative voltage pulse is applied to the terminal U on the upper electrode side with respect to the terminal L on the lower electrode side, a current flows from the lower electrode to the upper electrode. This causes the oxygen ions 16 to be absorbed into the oxide layer 15 on the lower electrode side. As a result, a conducting path of the oxide layer 15 becomes higher in resistance, inducing the change to the half LR state (FIG. 8(c)).

Moreover, according to the resistance states of the oxide layer 12 near the upper electrode interface and the oxide layer 15 near the lower electrode interface, the easiness of resistance change in the oxide layer 15 can be estimated from the potential on each oxide layer. The resistance change of the oxide layer 15 near the lower electrode interface is also described from this viewpoint below, with reference to FIG. 9(a) to (d). Note that FIG. 9(a) to (d) corresponds to FIG. 8(a) to (d). Two series resistors 117 and 118 in FIG. 9(a) to (d) are the resistor 117 indicating the resistance state of the oxide layer 12 near the upper electrode interface and the resistor 118 indicating the resistance state of the oxide layer 15 near the lower electrode interface.

Figure 9:
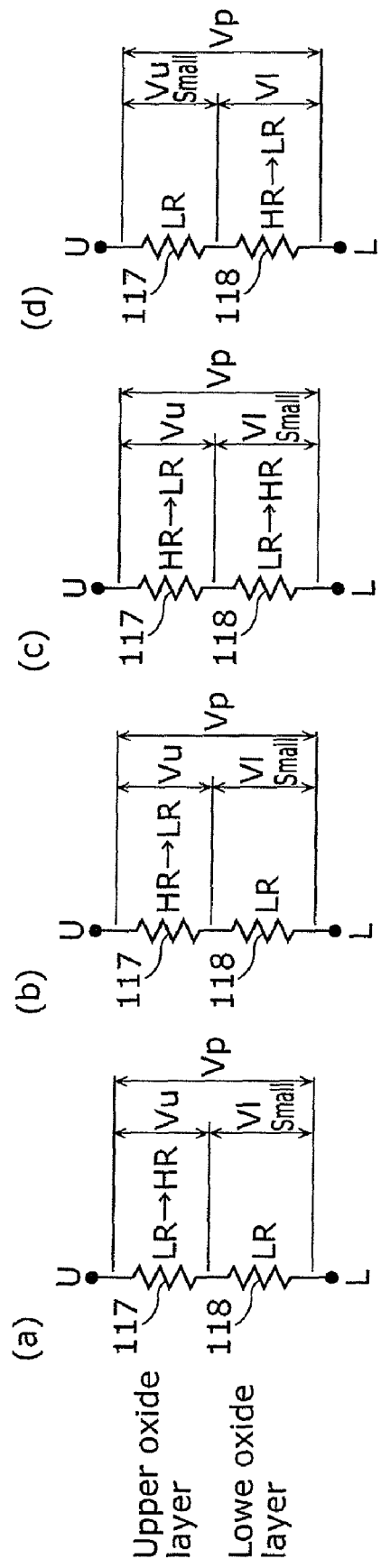
FIG. 9(a) to (d) is a resistance change mechanism explanatory diagram of the half LR state in the embodiment of the present invention.

FIGS. 9(a) and (b) shows resistance state changes of HR (high, resistance) writing and LR (low resistance) writing in a normal state. In both cases, the resistor 118 of the oxide layer 15 near the lower electrode interface is in the low resistance state (LR), and so there is almost no potential difference in the oxide layer 15, that is, the resistor 118. Therefore, the oxide layer 15 near the lower electrode interface has no resistance change. In the case of FIG. 9(d), on the other hand, in the half LR state before LR state improvement (that is, in a pre-change state), the resistor 118 of the oxide layer 15 near the lower electrode interface is in the high resistance state (HR), and the resistor 117 of the oxide layer 12 near the upper electrode interface is in the low resistance state (LR). When the voltage Vp is applied across the terminals U and L in such a state, a voltage Vu on the oxide layer 12 (the resistor 117) near the upper electrode interface is small, and a voltage Vl on the oxide layer 15 (the resistor 118) near the lower electrode interface is large. Accordingly, the oxide layer 15 near the lower electrode interface is likely to exceed the resistance change threshold voltage. When this occurs, the oxide layer 15 changes from the high resistance state to the low resistance state. In the case of FIG. 9(c), in a state before pulse application (that is, in a pre-change state), the resistor 118 of the oxide layer 15 near the lower electrode interface is in the low resistance state (LR), and the resistor 117 of the oxide layer 12 near the upper electrode interface is in the high resistance state (HR). When the voltage Vp is applied across the terminals U and L in such a state, the voltage Vu on the oxide layer 12 (the resistor 117) near the upper electrode interface is large, and the voltage Vl on the oxide layer 15 (the resistor 118) near the lower electrode interface is small. Accordingly, the oxide layer 12 near the upper electrode interface is likely to exceed the resistance change threshold voltage. When this occurs, the oxide layer 12 changes from the high resistance state to the low resistance state. Subsequently, the voltage Vl on the oxide layer 15 (the resistor 118) near the lower electrode interface increases. When the voltage Vl exceeds the resistance change threshold voltage, the oxide layer 15 changes from the low resistance state to the high resistance state.

The occurrence of the half LR state shown in FIG. 9(c) is a rare phenomenon, because the resistor 118 needs to exceed the threshold voltage for the resistance change to the high resistance state when the resistor 117 and the resistor 118 are both in the low resistance state (LR). On the other hand, in the case of the recovery from the half LR state to the low resistance state shown in FIG. 9(d), the resistance state of the oxide layer 15 near the lower electrode interface can substantially reliably change to the low resistance state, because the resistor 117 is in the low resistance state (LR) and also the resistor 118 is in the high resistance state (HR) and so the resistor 118 can easily exceed the threshold voltage for the resistance change to the low resistance state.

The reason why the pulse V-I characteristics of the second measurement and the third measurement shown in FIGS. 3(c) and (d) do not have the half LR state (low cell current state) after negative voltage pulse application unlike in FIG. 3(b) can be estimated as follows. As a result of applying the positive voltage pulse near Vtl in the first pulse V-I characteristic evaluation shown in FIG. 3(b), the oxygen ions 16 are released from the oxide layer 15 near the lower electrode interface, so that the neighborhood of the lower electrode interface changes to the low resistance state. This low resistance state of the neighborhood of the lower electrode is maintained in the subsequent pulse V-I characteristic evaluation.

Next, FIG. 5 shows an example of resistance change in the second measurement by positive and negative alternating pulse application.

FIG. 5 is a diagram showing the result of the measurement performed after the measurement of FIG. 3(d), under the same condition as in FIG. 4. When a pulse of +2.4 V is applied, the memory cell 105 changes to the high resistance state of about 7 µA. When a pulse of −2.4 V is applied, the memory cell 105 changes to the low resistance state of about 70 µA. Thus, the low resistance state is stable during positive and negative alternating pulse application in FIG. 5, unlike in FIG. 4.

The stabilization of the low resistance state can be attributed to the pulse V-I characteristic evaluation in FIG. 3(b), and in particular attributed to the application of the positive voltage near Vtl. From a mechanical point of view, it can be estimated that the subsequent operation is stabilized as a result of the oxygen ion release from the oxide layer 15 near the lower electrode interface by the voltage near Vtl.

Therefore, the same operation as the first pulse V-I characteristic evaluation needs to be performed on the memory cell in the initial state immediately after manufacturing. Especially, it is effective to apply the voltage near Vtl (more precisely, a voltage lower than and close to Vtl), in order to shift the memory cell from the half LR state to the low resistance state.

In the process of studying the resistance change characteristics of the memory cell 105, the present inventors have found that there are the resistance change characteristics to the unstable low resistance state (half LR state) shown in FIG. 3(b), but the low resistance state can be stabilized by applying a voltage lower than and close to Vtl. Moreover, the present inventors have found that (i) since the oxide layer near the lower electrode is expected to be in the high resistance state in most memory cells in the initial state immediately after manufacturing, stabilization needs to be performed once by changing the oxide layer near the lower electrode to the low resistance state through application of a voltage lower than and close to Vtl. The present inventors have also found that (ii) even when the half LR state occurs in rare occasions, the memory cell can be set to the low resistance state by changing the oxide layer near the lower electrode to the low resistance state through application of a voltage lower than and close to Vtl. On the basis of these findings (i) and (ii), the present inventors have newly discovered a method of stabilizing the low resistance state of the memory cell.

[Same Resistance Change by Pulse V-I Characteristics and Single Pulse Application]

In the pulse V-I characteristics of the memory cell 105 as shown in FIG. 3(d), the write pulse voltage Vp is gradually decreased from 0 V in the negative voltage direction. When the pulse voltage Vp exceeds the threshold voltage Vth at which low resistance writing starts, the memory cell 105 changes from the high resistance state to the low resistance state. When the pulse voltage Vp is decreased further, low resistance writing stops, and the resistance change of the memory cell 105 becomes saturated. Next, the write pulse voltage Vp is gradually increased from negative to positive voltages. When the pulse voltage Vp exceeds the positive threshold voltage Vtl at which high resistance writing starts, the memory cell 105 changes from the low resistance state to the high resistance state. When the pulse voltage Vp is increased further, high resistance writing stops, and the resistance change of the memory cell 105 becomes saturated.

In the evaluation method described above, the pulse voltage Vp is gradually changed in the negative direction or the positive direction. However, it is also possible to change the variable resistance element to the low resistance state or the high resistance state shown in FIG. 3, by applying a pulse exceeding the threshold voltage once.

FIG. 5 shows an example of resistance change when, for the same memory cell 105 as in FIG. 3(d), a voltage of 2.4 V sufficient to turn ON the gate is applied to the gate, and pulse voltages of −2.4 V and 2.4 V larger than the resistance change thresholds for low resistance writing and high resistance writing are alternately applied to the terminal U with respect to the terminal S. When a pulse of 2.4 V is applied to the memory cell 105 in the low resistance state, the memory cell 105 changes to the high resistance state. The reading measurement which follows indicates that the resistance level is about 7 µA. This resistance level is very close to the level after application of 2.4 V in the pulse V-I characteristics in FIG. 3(d). Next, when a pulse of −2.4 V is applied to the memory cell 105 in the high resistance state, the memory cell 105 changes to the low resistance state. The reading measurement which follows indicates that the resistance level is about 70 µA. This resistance level is very close to the level after application of −2.4 V in the pulse V-I characteristics in FIG. 3(d).

In this way, by applying such a voltage pulse that enables a resistance change to the memory cell 105 once, the memory cell 105 can be changed from the high resistance state to the low resistance state or from the low resistance state to the high resistance state.

The pulse V-I characteristics of the second type are described next.

FIG. 6 is a current-voltage characteristic graph showing a resistance change of the memory cell 105 of a different sample from FIG. 4. FIG. 6(a) shows the result of the measurement in the initial state immediately after manufacturing, according to the above evaluation method. FIG. 6(b) shows the result of the second measurement according to the same evaluation method. FIG. 6(c) shows the result of the fourth measurement according to the same evaluation method.

FIG. 6(a) is an initial pulse V-I characteristic graph immediately after manufacturing, where the initial resistance state is the high resistance state. When the pulse voltage Vp is applied while changing it from 0 V to the negative voltage side, first the memory cell 105 is in the high resistance state, but changes to the low resistance state when the pulse voltage Vp falls below Vth0. Hence, a forming step is completed. However, the resistance level of the low resistance state at this time is about 35 µA in cell current. That is, the memory cell 105 is in the half LR state. After this, the pulse voltage Vp is changed from the negative voltage side to the positive voltage side. Once the pulse voltage Vp has exceeded about 1 V, the cell current increases, and reaches about 57 µA at the maximum. When the pulse voltage Vp exceeds Vtl, the cell current decreases to about 4 µA.

That is, as a result of negative pulse voltage application, the memory cell 105 once changes to the low resistance state of the intermediate level (half LR state). However, by applying a positive pulse voltage equal to or lower than Vtl, the memory cell 105 changes to the low resistance state (normal low resistance state) that is lower in resistance value than the low resistance state to which the memory cell 105 has been changed by the negative pulse voltage. After this, by applying a positive pulse voltage exceeding Vtl, the memory cell 105 changes to the high resistance state. Such characteristics are approximately the same as in FIG. 3(b), and belong to the characteristic type 2.

FIG. 6(b) shows the result of the second measurement on the same sample as in FIG. 6(a) according to the same evaluation method and measurement condition. In this case, first the memory cell 105 is in the high resistance state. However, when the pulse voltage Vp falls below Vth, the memory cell 105 changes to the low resistance state (normal low resistance state). When the pulse voltage Vp is decreased further, the cell current increases to about 64 μA. After this, the pulse voltage Vp is changed from the negative voltage side to the positive voltage side, but the cell current remains at about the same level as in the case of negative pulse voltage application, until the pulse voltage Vp exceeds Vtl. When the pulse voltage Vp exceeds Vtl, the cell current decreases to about 7 μA.

That is, when the pulse voltage Vp falls below Vth as a result of negative pulse voltage application, the memory cell 105 changes to the low resistance state. Here, the memory cell 105 eventually changes to the sufficient low resistance state (normal low resistance state) by the negative pulse. This low resistance state is maintained approximately at the same level while the positive pulse voltage equal to or lower than Vtl is applied. When the positive pulse voltage exceeding Vtl is applied, the memory cell 105 changes to the high resistance state. Such characteristics are approximately the same characteristics as in FIG. 3(c), and belong to the characteristic type 1.

FIG. 6(c) shows the result of the fourth measurement on the same sample as in FIG. 6(a) according to the same evaluation method and measurement condition. In FIG. 6(c), the cell current follows approximately the same path as in FIG. 6(a).

That is, as a result of negative pulse voltage application, the memory cell 105 once changes to the low resistance state of the intermediate level (half LR state). However, by applying a positive pulse voltage equal to or lower than Vtl, the memory cell 105 changes to the low resistance state (normal low resistance state) that is lower in resistance value than the low resistance state to which the memory cell 105 has been changed by the negative pulse voltage. Further, by applying a positive pulse voltage exceeding Vtl, the memory cell 105 changes to the high resistance state. Such characteristics are approximately the same as in FIG. 6(a), and belong to the characteristic type 2.

In the sample used for the measurement of FIG. 6, the characteristic type 2 shown in FIG. 6(c) occasionally appears when the same evaluation method is repeated as shown in FIGS. 6(b) and (c).

The pulse V-I characteristics of the third type are described next.

FIG. 7(a) is a pulse V-I characteristic graph from the initial state immediately after manufacturing, where the initial resistance state is the high resistance state. When the pulse voltage Vp is applied while changing it from 0 V to the negative voltage side, first the memory cell 105 is in the high resistance state, but changes to the low resistance state when the pulse voltage Vp falls below Vth0. Hence, a forming step is completed. However, the resistance level of the low resistance state at this time is about 40 μA in cell current. That is, the memory cell 105 is in the half LR state. After this, the pulse voltage Vp is changed from the negative voltage side to the positive voltage side. When the pulse voltage Vp is near Vtl, the cell current increases to 63 μA. When the pulse voltage Vp exceeds Vtl, the cell current decreases to about 4 μA.

That is, as a result of negative pulse voltage application, the memory cell 105 once changes to the low resistance state of the intermediate level (half LR state). However, by applying a positive pulse voltage equal to or lower than Vtl, the memory cell 105 changes to the low resistance state (normal low resistance state) that is lower in resistance value than the low resistance state to which the memory cell 105 has been changed by the negative pulse voltage. Further, by applying a positive pulse voltage exceeding Vtl, the memory cell 105 changes to the high resistance state. Such characteristics are approximately the same as in FIG. 3(b), and belong to the characteristic type 2.

FIGS. 7(b) and (c) shows the results of the second measurement and the third measurement on the same sample as in FIG. 7(a) according to the same evaluation method and measurement condition. In both FIGS. 7(b) and (c), though the resistance level of the half LR state is different from FIG. 7(a), the cell current tends to increase when the positive voltage pulse near Vtl is applied, so that the memory cell 105 once becomes the normal low resistance state.

That is, as a result of negative pulse voltage application, the memory cell 105 once changes to the low resistance state of the intermediate level (half LR state). However, by applying a positive pulse voltage equal to or lower than Vtl, the memory cell 105 changes to the low resistance state (normal low resistance state) that is lower in resistance value than the low resistance state to which the memory cell 105 has been changed by the negative pulse voltage. Further, by applying a positive pulse voltage exceeding Vtl, the memory cell 105 changes to the high resistance state. Such characteristics are approximately the same as in FIG. 7(a), and belong to the characteristic type 2.

In the sample shown in FIG. 7, when the same evaluation method is repeated as shown in FIGS. 7(b) and (c), the characteristic type 2 appears almost each time.

The following can be understood from the pulse V-I characteristics of the first to third types (FIGS. 3, 6, and 7) described above. Though the evaluation samples in FIGS. 3, 6, and 7 are different, they all have the same structure as the memory cell 105 shown in FIG. 2. All samples have the characteristic type 2 in the first pulse V-I characteristic graph immediately after manufacturing. From the second measurement onward, however, each sample differs in characteristic type such that only the characteristic type 1 appears in FIG. 3, both the characteristic type 1 and the characteristic type 2 appear in the sample in FIG. 6, and only the characteristic type 2 appears in the sample in FIG. 7. A particular feature is the pulse V-I characteristics such as the characteristic type 2. The present inventors have found that there is a memory cell having such new characteristics, and that the new characteristics always appear in the initial stage.

The following describes a nonvolatile variable resistance memory device that uses the above variable resistance element in the embodiment of the present invention. The nonvolatile variable resistance memory device in the embodiment of the present invention is a nonvolatile memory device that includes the 1T1R memory cell formed by series-connecting the variable resistance element and the MOS transistor shown in FIG. 2.

Figure 10:
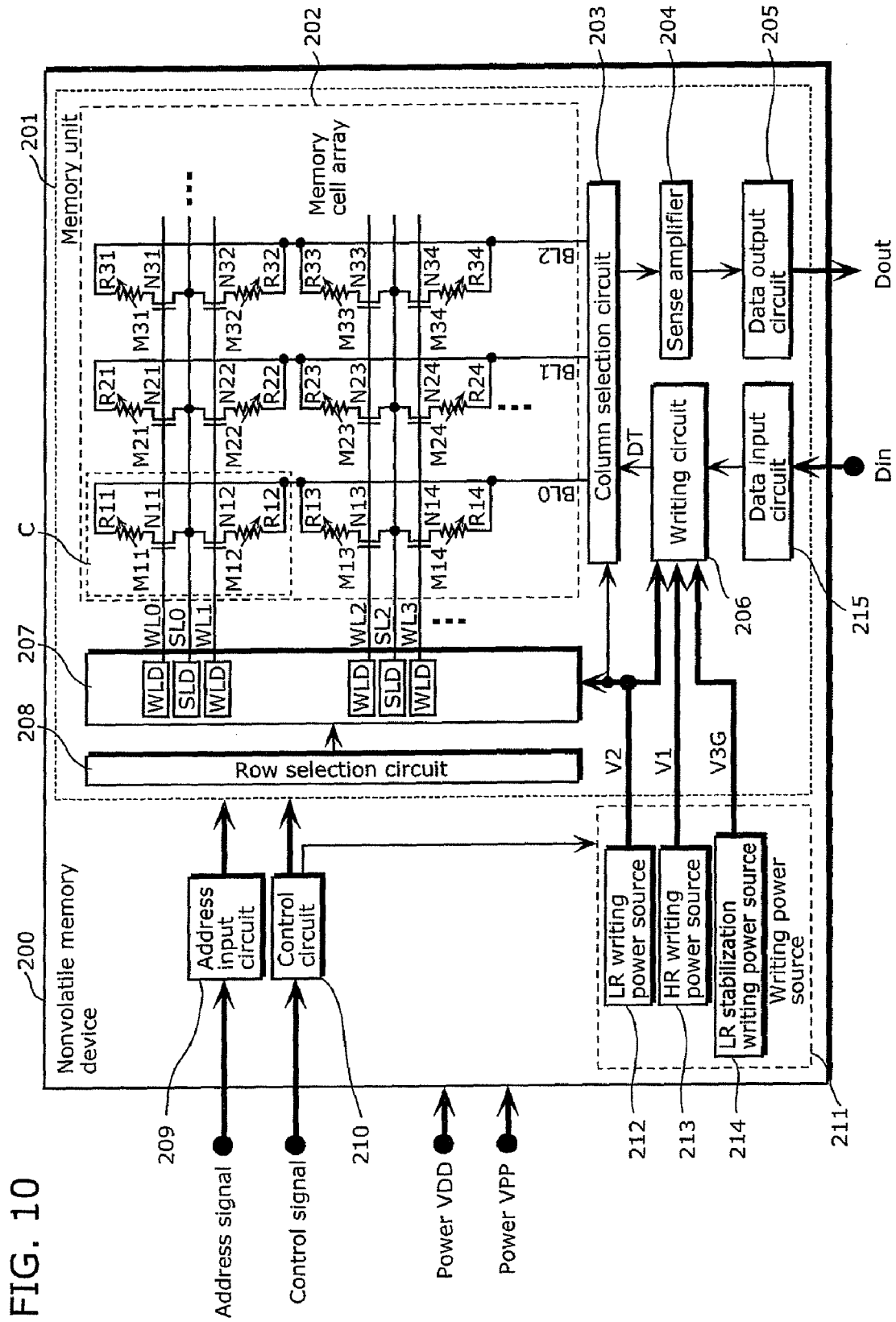
FIG. 10 is a diagram showing a structure of a nonvolatile memory device in the embodiment of the present invention.

FIG. 10 is a block diagram showing a structure of a nonvolatile memory device 200 in the embodiment of the present invention.

As shown in FIG. 10, the nonvolatile memory device 200 in this embodiment includes a memory unit 201 on a semiconductor substrate. The memory unit 201 includes a memory cell array 202, a row selection circuit 208, a row driver 207 including a word line driver WLD and a source line driver SLD, a column selection circuit 203, a writing circuit 206 for writing data, a sense amplifier 204 that detects a current value flowing through a selected bit line and determines whether written data is "0 (low resistance state)" or "1 (high resistance state)", a data input circuit 215 that performs input processing of input data via a terminal Din, and a data output circuit 205 that performs output processing of output data via a terminal Dout.

Moreover, the nonvolatile memory device 200 includes a writing power source 211 that includes a low resistance (LR) writing power source 212, a high resistance (HR) writing power source 213, and a low resistance (LR) stabilization writing power source 214. An output V2 of the low resistance (LR) writing power source 212 is supplied to the row driver 207 and the writing circuit 206. An output V1 of the high resistance (HR) writing power source 213 and an output V3G of the low resistance (LR) stabilization writing power source 214 are supplied to the writing circuit 206.

Furthermore, the nonvolatile memory device 200 includes an address input circuit 209 that receives address signals from outside, and a control circuit 210 that controls the operation of the memory unit 201 and the operation of the writing power source 211 on the basis of a control signal from outside.

The memory cell array 202 includes a plurality of word lines WL0, WL1, WL2, . . . , a plurality of bit lines BL0, BL1, BL2, . . . , a plurality of NMOS transistors N11, N12, N13, N21, N22, N23, N31, N32, N33, . . . (hereafter written as "transistors N11, N12, . . . "), and a plurality of variable resistance elements R11, R12, R13, R21, R22, R23, R31, R32, R33, . . . (hereafter written as "variable resistance elements R11, R12, . . . "), which are formed on the semiconductor substrate and constitute memory cells M11, M12, M13, M21, M22, M23, M31, M32, M33, . . . (hereafter written as "memory cells M11, M12, . . . "). The word lines WL0, WL1, WL2, . . . and the bit lines BL0, BL1, BL2, . . . are arranged so as to intersect with each other. The transistors N11, N12, . . . are provided corresponding to crosspoints of the word lines WL0, WL1, WL2, . . . and the bit lines BL0, BL1, BL2, . . . . The variable resistance elements R11, R12, . . . are connected in series with the transistors N11, N12, . . . in a one-to-one correspondence. Here, each pair of the variable resistance elements R11, R12, . . . and the transistors N11, N12, . . . form a memory cell described above as the basic data of the present invention.

As shown in FIG. 10, the transistors N11, N21, N31, . . . each have a gate connected to the word line WL0. The transistors N12, N22, N32, . . . each have a gate connected to the word line WL1. The transistors N13, N23, N33, . . . each have a gate connected to the word line WL2. The transistors N14, N24, N34, . . . each have a gate connected to the word line WL3.

Moreover, the transistors N11, N21, N31, . . . and the transistors N12, N22, N32, . . . are commonly connected to a source line SL0. The transistors N13, N23, N33, . . . and the transistors N14, N24, N34, . . . are commonly connected to a source line SL2.

Meanwhile, the variable resistance elements R11, R12, R13, R14, . . . are connected to the bit line BL0. The variable resistance elements R21, R22, R23, R24, . . . are connected to the bit line BL1. The variable resistance elements R31, R32, R33, R34, . . . are connected to the bit line BL2.

The address input circuit 209 receives address signals from an external device (not shown), and provides row address signals to the row selection circuit 208 and column address signals to the column selection circuit 203 according to the received address signals. Here, the address signals are signals showing an address of a specific memory cell selected from the plurality of memory cells M11, M12, . . . .

The control circuit 210 controls the writing power source 211 and the writing circuit 206 so that data is written to a variable resistance element in a memory cell selected by a selection unit described later, in a data writing cycle. In detail, the control circuit 210 provides a voltage setting signal indicating a voltage level of a pulse voltage in writing, to the writing power source 211. The control circuit 210 also provides a write command signal instructing to apply a write voltage, to the writing circuit 206 according to the input data Din provided to the data input circuit 215. In a data reading cycle, on the other hand, the control circuit 210 provides a read command signal instructing to perform a reading operation, to the sense amplifier 204.

The row selection circuit 208 receives the row address signals from the address input circuit 209. According to the received row address signals, the row selection circuit 208 applies a predetermined voltage to a word line selected from the plurality of word lines WL0, WL1, WL2, . . . , by a word line driver circuit WLD corresponding to the selected word line in the row driver 207.

Likewise, the row selection circuit 208 receives the row address signals from the address input circuit 209. According to the received row address signals, the row selection circuit 208 applies a predetermined voltage to a source line selected from the plurality of source lines SL0, WL2, . . . , by a source line driver circuit SLD corresponding to the selected source line in the row driver 207.

Meanwhile, the column selection circuit 203 receives the column address signals from the address input circuit 209. According to the received column address signals, the column selection circuit 203 selects a bit line from the plurality of bit lines BL0, BL1, BL2, . . . . The column selection circuit 203 applies a write voltage or a read voltage to the selected bit line, and a non-selection voltage to an unselected bit line.

Note that the row selection circuit 208 and the column selection circuit 203 constitute the selection unit that selects at least one memory cell in the memory cell array 202.

The writing circuit 206 performs control so that a voltage pulse based on power supplied from the writing power source 211 is applied to a variable resistance element in a memory cell selected by the selection unit, under control of the control circuit 210. Upon receiving the write command signal instructing to apply a write voltage from the control circuit 210, the writing circuit 206 applies a write pulse according to a voltage set in a writing mode, to a bit line selected by the column selection circuit 203.

The sense amplifier 204 detects a current value flowing through a selected bit line that is subject to reading according to one suitable detection level out of a plurality of detection levels, in a data reading cycle. The sense amplifier 204 generates a logic result of "0 (low resistance state)" or "1 (high resistance state)" showing whether or not the current value flowing through the bit line exceeds the detection level, to determine the state of written data. Output data Dout obtained as a result is provided to the external device via the data output circuit 205.

The writing power source 211 includes the LR writing power source 212 that supplies power for generating a pulse voltage in low resistance (LR) writing (also simply referred to as writing), the HR writing power source 213 that supplies power for generating a pulse voltage in high resistance (HR) writing (also simply referred to as erasing), and the LR stabilization writing power source 214 that supplies power for generating a pulse voltage in low resistance (LR) stabilization writing. The output of the LR writing power source 212 is supplied to the row driver 207 and the writing circuit 206, whereas the outputs of the HR writing power source 213 and the LR stabilization writing power source 214 are supplied to the writing circuit 206.

The variable resistance element writing functions of the control circuit 210 can be summarized as follows. As the variable resistance element writing functions, the control circuit 210 has: (i) a high resistance (HR) writing unit that controls the writing power source 211 and the writing circuit 206 so that a positive first voltage required to create the high resistance state is applied to the variable resistance element with the supply of power from the high resistance (HR) power source 213; (ii) a low resistance (LR) writing unit that controls the writing power source 211 and the writing circuit 206 so that a negative second voltage required to create the low resistance state is applied to the variable resistance element with the supply of power from the low-resistance (LR) power source 212; and (iii) a LR stabilization writing unit that controls the writing power source 211 and the writing circuit 206 so that a positive third voltage required to reliably (or additionally) create the low resistance state is applied to the variable resistance element with the supply of power from the LR stabilization writing power source 214, after the application of the negative second voltage by the LR writing unit. As mentioned above, as a result of the application of the negative second voltage by the LR writing unit, the variable resistance element changes to either the low resistance state or the half LR state. The application of the positive third voltage by the LR stabilization writing unit is intended to reliably set the variable resistance element to the low resistance state, in the case where the variable resistance element is in the half LR state as a result of the application of the negative second voltage by the LR writing unit.

Note that the three functions (the HR writing unit, the LR writing unit, and the LR stabilization writing unit) are achieved by the writing circuit 206 under control of the control circuit 210. Accordingly, the three functions can also be regarded as the functions of the writing circuit 206, given that they are writing functions.

Figure 11:
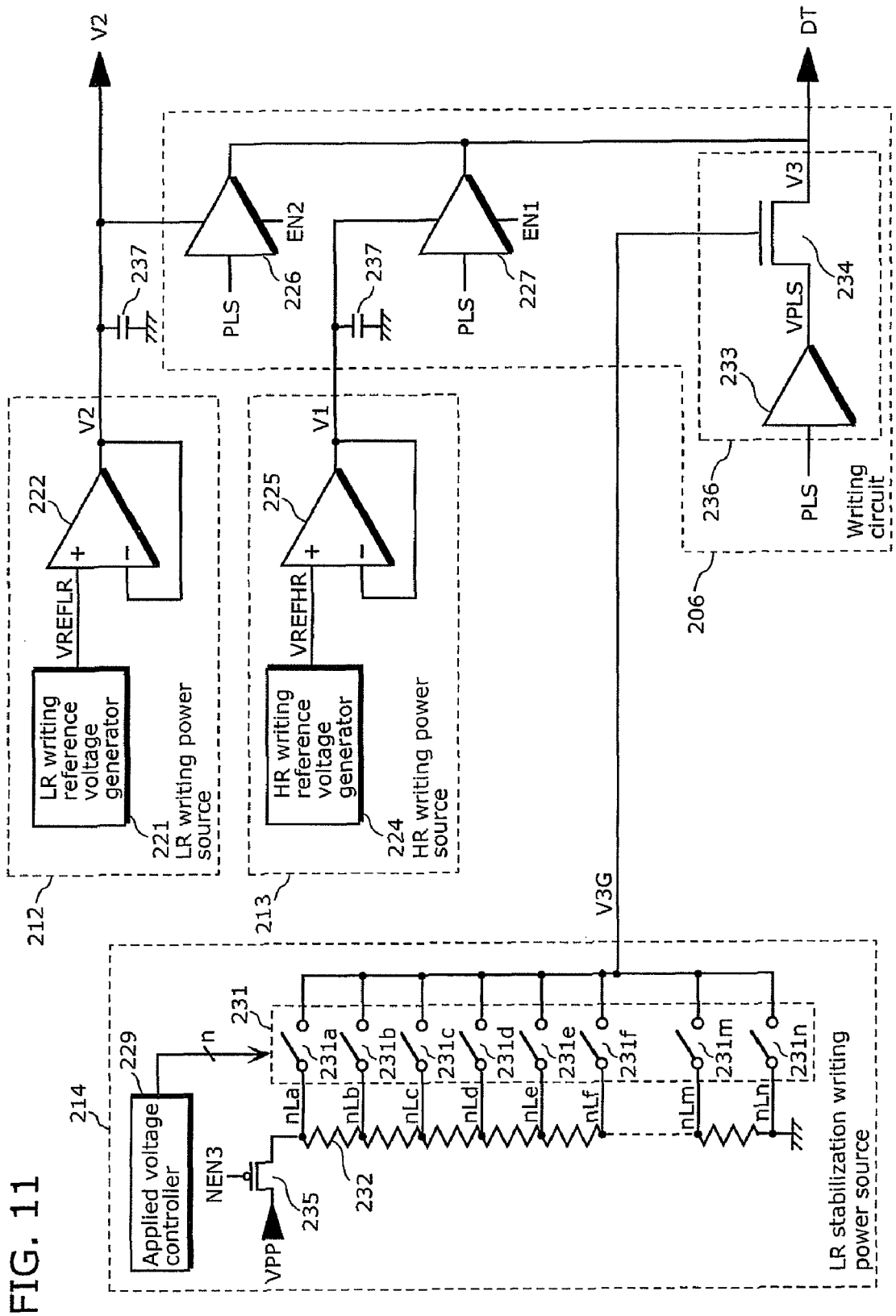
FIG. 11 is a diagram showing a detailed structure of a power source and a writing circuit included in the nonvolatile memory device in the embodiment of the present invention.

FIG. 11 shows an implementable circuit for the writing power source 211 and the writing circuit 26 in a writing circuit system used in data writing, in detail. The following describes an operation of the circuit.

FIG. 11 shows detailed circuit and connection structures of the LR writing power source 212, the HR writing power source 213, the LR stabilization writing power source 214, and the writing circuit 206. Though not shown, VDD denotes a source voltage fed to the circuit in FIG. 11 from outside.

In FIG. 11, the LR writing power source 212 includes a LR writing reference voltage generator 221 and a differential amplifier circuit 222. The LR writing reference voltage generator 221 is a reference potential generator that generates a pulse voltage level VREFLR of a write pulse in LR writing. The differential amplifier circuit 222 has a typical structure in which one input has the output voltage VREFLR of the LR writing reference voltage generator 221 and the other input has feedback of the output V2. The differential amplifier circuit 222 is an amplifier circuit (voltage follower) that receives the reference voltage VREFLR and generates the voltage V2 of the same voltage as VREFLR with an amplified current capability.

The HR writing power source 213 includes a HR writing reference voltage generator 224 and a differential amplifier circuit 225. The HR writing reference voltage generator 224 is a reference potential generator that generates a pulse voltage level VREFHR of a write pulse in HR writing. The differential amplifier circuit 225 has a typical structure in which one input has the output voltage VREFHR of the HR writing reference voltage generator 224 and the other input has feedback of the output V1. The differential amplifier circuit 225 is an amplifier circuit (voltage follower) that receives the reference voltage VREFHR and generates the voltage V1 of the same voltage as VREFHR with an amplified current capability.

The LR stabilization writing power source 214 has the following internal structure. A plurality of fixed resistors 232 are connected in series between a VPP terminal and a ground terminal. Terminals nLa to nLn of the fixed resistors 232 on the VPP side are drawn and connected to terminals of a plurality of switches 231a to 231n in a one-to-one correspondence, whereas the output V3G is connected to the other terminal of each of the switches 231a to 231n. The switches 231a to 231n operate in such a manner that one of the switches is ON (conductive) and the other switches are OFF according to an instruction from an applied voltage controller 229. In this way, an arbitrary voltage obtained by voltage division between VPP and the ground is selected by the switches 231a to 231n and supplied to V3G. The applied voltage controller 229 provides a signal to all switches 231a to 231n so that one of the switches 231a to 231n in the switch group 231 becomes conductive, according to selected voltage indication from the control circuit 210. According to this structure, the LR stabilization writing power source 214 selects and supplies one of a plurality of voltages in order, thereby supplying a stepwise increasing positive voltage.

The writing circuit 206 includes a driver 226 that functions as the above-mentioned LR writing unit, a driver 227 that functions as the above-mentioned HR writing unit, and a LR stabilization writing circuit 236 that functions as the above-mentioned LR stabilization writing unit.

The driver 226 is a three-state driver for a LR pulse that generates one of the voltage V2 and the ground voltage according to a pulse signal PLS from the control circuit 210 when an output enable signal EN2 from the control circuit 210 is High, and generates Hi-z (high impedance state) when EN2 is Low. The driver 227 is a three-state driver for a HR pulse that generates one of the voltage V1 and the ground voltage according to the pulse signal PLS when an output enable signal EN1 is High, and generates Hi-z when EN1 is Low. A driver 233 generates a current-amplified pulse at an output terminal VPLS, when instructed by the write command pulse signal PLS from the control circuit 210. An N-channel transistor 234 is provided as a voltage clamp for the output VPLS of the driver 233, and generates a voltage (V3=V3G−Vt) that is lower than the voltage V3G received in its gate by a threshold Vt (a threshold voltage of the N-channel transistor 234), at an output terminal DT as a maximum voltage. For example, in the case where the output VPLS of the driver 233 is a rectangular pulse of 0 V→VDD→0 V according to a change in PLS signal, the output of the N-channel transistor 234 (the voltage at the output terminal DT) is a rectangular pulse of 0 V→V3→0 V (when VDD≧V3).

The following describes an example of an overall operation of the writing power source 211 and the writing circuit 206 shown in FIG. 11.

In the case of HR writing, under control of the HR writing unit in the control circuit 210, first the same voltage V1 as VREFHR is generated. The enable signal EN1 from the control circuit 210 is set to High, to put the driver 227 in a Lo-z (low impedance) output state. The enable signal EN2 is set to Low, to put the driver 226 in a Hi-z output state. The gate voltage of the N-channel transistor 234 is set to 0 V, to put the N-channel transistor 234 in an OFF state. Following this, upon receiving the write command pulse signal PLS from the control circuit 210, the driver 227 feeds a pulse of 0 V→V1 (VREFHR)→0 V to the output terminal DT. The pulse fed to the output terminal DT is applied to a selected memory cell via the column selection circuit 203.

In the case of LR writing, under control of the LR writing unit in the control circuit 210, first the same voltage V2 as VREFLR is generated. The enable signal EN2 from the control circuit 210 is set to High, to put the driver 226 in a Lo-z output state. The enable signal EN1 is set to Low, to put the driver 227 in a Hi-z output state. The gate voltage of the N-channel transistor 234 is set to 0 V, to put the N-channel transistor 234 in an OFF state. Following this, upon receiving the write command pulse signal PLS from the control circuit 210, the driver 226 feeds a pulse of 0 V→V2 (VREFLR)→0 V to the output terminal DT. The pulse fed to the output terminal DT is applied to a selected memory cell via the column selection circuit 203.

In the case of LR stabilization writing, under control of the LR stabilization writing unit in the control circuit 210, first the enable signals EN1 and EN2 from the control circuit 210 are set to Low, to put the drivers 226 and 227 in a Hi-z state. Following this, according to an instruction from the control circuit 210, one of the plurality of switches 231a to 231n becomes conductive by the applied voltage controller 229, and the gate of the N-channel transistor 234 has the set voltage V3G. Subsequently, upon receiving the write command pulse signal PLS from the control circuit 210, the driver 233 feeds a pulse of 0 V→VDD→0 V to the VPLS node. The N-channel transistor 234 clamps the High level VDD of the pulse to "V3G−Vt" by the voltage V3G received at the gate, and feeds a pulse of 0 V→V3 (V3G−Vt)→0 V to the output terminal DT. The pulse provided to the output terminal DT is applied to a selected memory cell via the column selection circuit 203.

The series of writing operations are performed in this manner.

Figure 12:
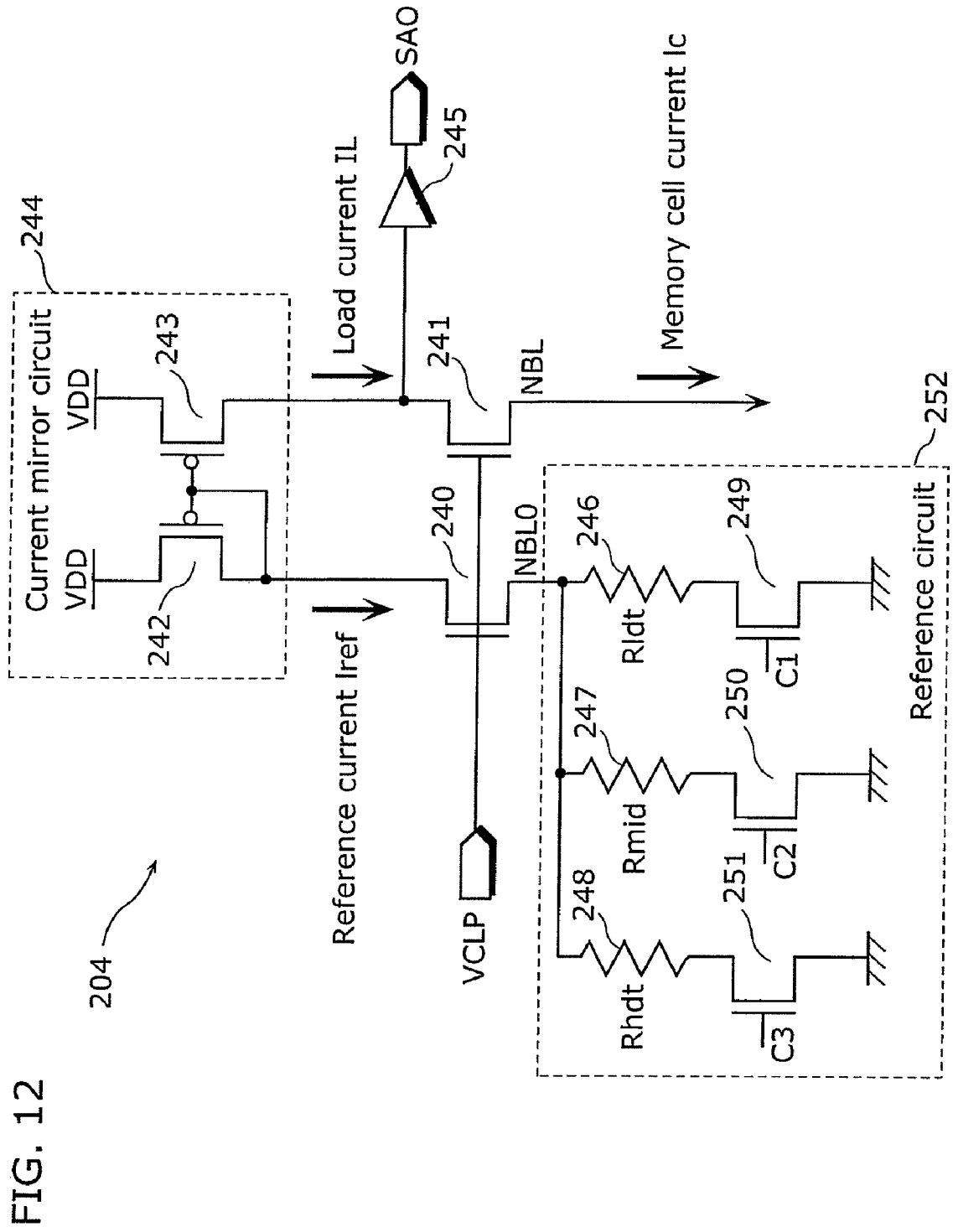
FIG. 12 is a diagram showing a detailed structure of a sense amplifier in the embodiment of the present invention.

FIG. 12 is a circuit diagram showing an example of a detailed structure of the sense amplifier 204 in FIG. 10. The sense amplifier 204 includes a current mirror circuit 244 with a mirror ratio of 1:1, clamp transistors 240 and 241 that are equal in size, a reference circuit 252, and a buffer 245.

In the reference circuit 252, one terminal of a branch where a select transistor 249 and a low resistance (LR) verification reference resistor 246 are connected in series is connected to the ground potential, and the other terminal is connected to a source terminal of the clamp transistor 240. A LR verification enable signal C1 from the control circuit 210 is fed to a gate terminal of the select transistor 249, so that the select transistor 249 is switched between conductive and nonconductive by the LR verification enable signal C1.

Likewise, one terminal of a branch where a select transistor 250 and a reading reference resistor 247 are connected in series is connected to the ground potential, and the other terminal is connected to the source terminal of the clamp transistor 240. A read enable signal C2 from the control circuit 210 is fed to a gate terminal of the select transistor 250, so that the select transistor 250 is switched between conductive and nonconductive by the read enable signal C2. Moreover, one terminal of a branch where a select transistor 251 and a high resistance (HR) verification reference resistor 248 are connected in series is connected to the ground potential, and the other terminal is connected to the source terminal of the clamp transistor 240. A HR verification enable signal C3 from the control circuit 210 is fed to a gate terminal of the select transistor 251, so that the select transistor 251 is switched between conductive and nonconductive by the HR verification enable signal C3.

The clamp transistors 240 and 241 each have a gate terminal to which VCLP (0.9 V) is fed, in order to limit nodes NBL0 and NBL to a clamped voltage (0.4 V). A source terminal of the clamp transistor 241 is connected to a memory cell via the column selection circuit 203 and a bit line. Drain terminals of the clamp transistors 240 and 241 are respectively connected to drain terminals of transistors 242 and 243 in the current mirror circuit 244. A potential of the drain terminal of the clamp transistor 241 is inverted and amplified by the buffer 245, and conveyed to the data output circuit 205 as a sense amplifier output SAO.

Figure 13:
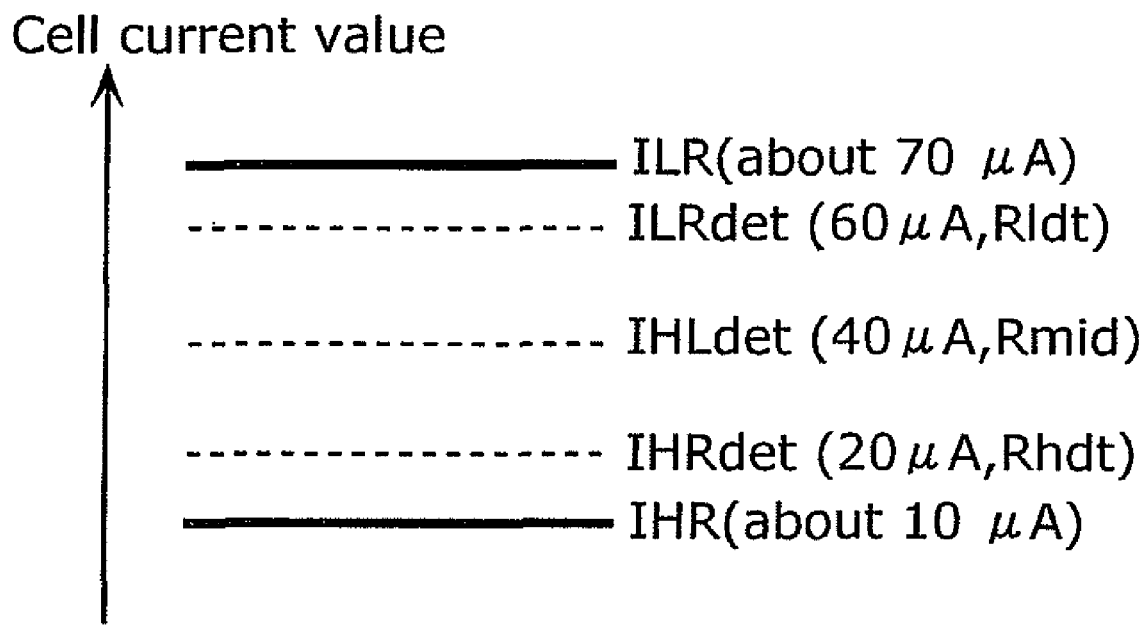
FIG. 13 is an explanatory diagram of a detection current level of the sense amplifier in the embodiment of the present invention.

FIG. 13 is a diagram explaining detection levels of the sense amplifier 204.

As shown in FIG. 13, the sense amplifier 204 has a reference current IHLdet (40 µA) for reading as a first detection level, a reference current IHRdet (20 µA) for high resistance (HR) verification as a second detection level, and a reference current ILRdet (60 µA) for low resistance (LR) verification as a third detection level, between a cell current ILR (about 70 µA) of a memory cell in the low resistance (LR) state and a cell current IHR (about 10 µA) of a memory cell in the high resistance (HR) state.

In the sense amplifier 204 shown in FIG. 12, the low resistance (LR) verification reference current ILRdet (60 µA) is generated by applying the clamped voltage to a reference memory cell formed by the resistor 246 of a resistance value Rldt and the select transistor 249. The reading reference current IHLdet (40 µA) is generated by applying the clamped voltage to a reference memory cell formed by the resistor 247 of a resistance value Rmid and the select transistor 250. The high resistance (HR) verification reference current IHRdet (20 µA) is generated by applying the clamped voltage to a reference memory cell formed by the resistor 248 of a resistance value Rhdt and the select transistor 251.

The following describes the determination output of the sense amplifier 204 and the purpose of using the detection levels.

In a data reading cycle, the sense amplifier 204 shown in FIG. 10 detects a cell current of a selected memory cell that is subject to reading, as a current value flowing through the selected memory cell via a selected bit line. The sense amplifier 204 generates a logic value "0" when the current is higher than a set detection level, and generates a logic value "1" when the current is lower than the set detection level. The detection level is set from among the above three types.

The first detection level is a detection level for determining whether the resistance state of the selected memory cell is the high resistance state or the low resistance state. Accordingly, the first detection level is set to an intermediate level (for example, 40 µA) between a cell current (for example, 10 µA in FIG. 3(c)) of a memory cell in the high resistance state and a cell current (for example, 70 µA in FIG. 3(c)) of a memory cell in the low resistance state.

The second detection level is a verification detection level for determining whether or not the resistance state of the selected memory cell is the high resistance state of a sufficiently high resistance value. In particular, the second detection level is used for the purpose of determining, after high resistance writing of the selected memory cell, whether or not the memory cell is set to the high resistance state with a sufficient margin with respect to the first detection level, and determining, in a subsequent reading cycle, whether or not the current of the memory cell is in the high resistance state (for example, equal to or lower than 20 µA).

The third detection level is a verification detection level for determining whether or not the resistance state of the selected memory cell is the normal low resistance state. In particular, the third detection level is used for the purpose of determining, after low resistance writing of the selected memory cell, whether or not the memory cell is set to the low resistance state with a sufficient margin with respect to the first detection level, and determining, in a subsequent reading cycle, whether or not the current of the memory cell is in the low resistance state (for example, equal to or higher than 60 μA). Note that the third detection level can be used together with the first detection level in order to detect the half LR state. That is, in the case where the cell current of the selected memory cell is higher than the first detection level but lower than the third detection level, the variable resistance element in the selected memory cell is determined to be in the half LR state.

The variable resistance elements R11, R12, ... shown in FIG. 10 each have the same sectional structure as in FIG. 1(a), (b), or (c).

Moreover, the memory cells M11, M21, ... are formed by series connection (R11+N11, R21+N21, ...) of the variable resistance elements R11, R21, ... and the N-channel transistors N11, N21, ..., and each have the same structure as in FIG. 2.

The following describes connection relations between the memory cell 105 in FIG. 2 and the LR stabilization writing circuit 236 in FIG. 11, and resistance change directions.

The metal wire 17 (the terminal U) drawn from the upper electrode 11 in the variable resistance element 10a by the via 19 is connected to a bit line (such as BL0) that runs vertically in the memory cell array 202 in FIG. 10, and the bit line is connected to the output terminal DT of the LR stabilization writing circuit 236 through the column selection circuit 203. Therefore, a positive voltage pulse generated by the LR stabilization writing circuit 236 is applied to the upper electrode 11 in the variable resistance element 10a. In the case of FIG. 3(b), when a positive pulse near the voltage Vtl is applied to the upper electrode 11, the memory cell 105 can be changed from the half LR state to the low resistance state. When a positive pulse exceeding the voltage Vtl is applied to the upper electrode 11, the memory cell 105 changes to the high resistance state. Such resistance change characteristics of changing to the high resistance state when a positive voltage pulse exceeding the high resistance writing threshold voltage Vtl is applied to the bit line (that is, the upper electrode in the variable resistance element) from the writing circuit 206 are referred to as "B mode". Conversely, resistance change characteristics of changing to the low resistance state when a positive voltage pulse exceeding the voltage Vtl is applied to the bit line from the writing circuit 206 are referred to as "A mode". The resistance change characteristics of the A or B mode are inherent in the variable resistance element. In the case of changing the variable resistance element of the B mode to the low resistance state, a negative voltage pulse is applied to the metal wire 17 (the terminal U), with respect to the metal wire 18 (the terminal S) drawn from the diffusion region 302a of the transistor 104 connected to the lower electrode by the via 21. Note that "positive pulse" means a pulse of a positive voltage, and "negative pulse" means a pulse of a negative voltage.

The variable resistance elements shown in FIG. 1(a) to (c) all change in resistance in the B mode.

Note that, in order to obtain the same resistance change characteristics as in FIG. 3 using the memory cell of the A mode, the metal wire 18 (the terminal 5) needs to be connected to the bit line.

Thus, the pulse V-I characteristics of the memory cells M11, M21, ... in FIG. 10 are similar to the characteristics shown in FIG. 3(b) to (d), FIG. 6(a) to (c), or FIG. 7(a) to (c).

Accordingly, in a writing operation, the absolute value of the write voltage necessary for low resistance writing is equal to or higher than the absolute value of Vth in FIG. 3. The LR writing power source 212 is a power circuit whose output voltage V2 has an absolute value that enables a negative voltage exceeding Vth to be applied to the variable resistance element. On the other hand, the write voltage necessary for high resistance writing is equal to or higher than Vtl in FIG. 3. The HR writing power source 213 is a power circuit whose output voltage V1 enables a positive voltage exceeding Vtl to be applied to the variable resistance element.

Figure 14:
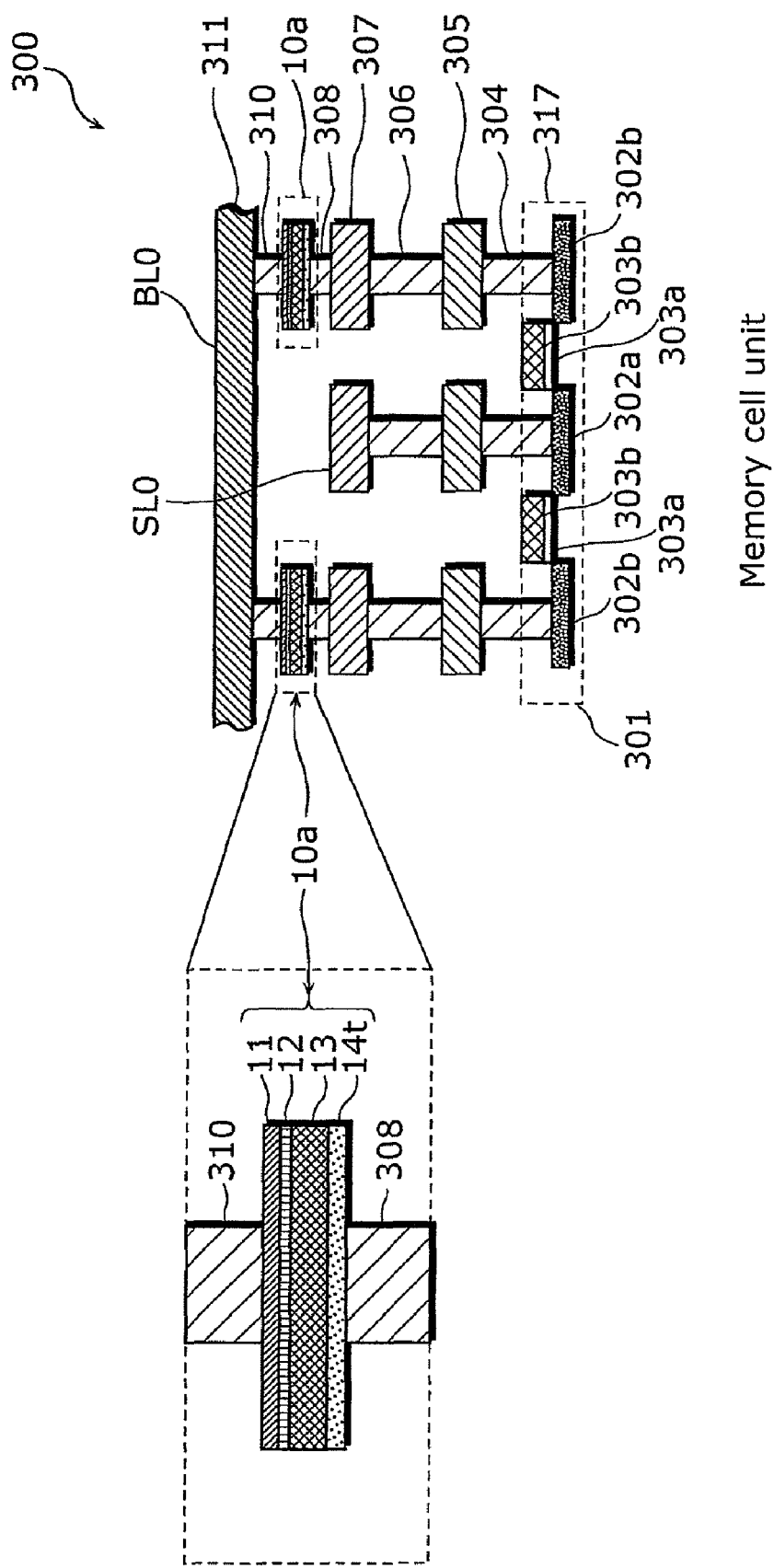
FIG. 14 is a sectional view showing an example of a structure of a memory cell unit in the nonvolatile variable resistance memory device in the embodiment of the present invention.

FIG. 14 is a sectional view showing a structure of a memory cell 300 (for 2 bits) corresponding to a C portion in FIG. 10, and an enlarged view of the variable resistance element 10a.

A transistor 317 and the variable resistance element 10a respectively correspond to the transistors N11 and N12 and the variable resistance elements R11 and R12 in FIG. 10.

In the memory cell 300, the second N-type diffusion layer region 302a, the first N-type diffusion layer region 302b, the gate insulation film 303a, the gate electrode 303b, a first via 304, a first wiring layer 305, a second via 306, a second wiring layer 307, a third via 308, the variable resistance element 10a, a fourth via 310, and a third wiring layer 311 are formed in this order on a semiconductor substrate 301.

The third wiring layer 311 connected to the fourth via 310 corresponds to the bit line BL0, and the first wiring layer 305 and the second wiring layer 307 connected to the second N-type diffusion layer region 302a in the transistor 317 correspond to the source line SL0 that runs vertically in FIG. 14.

The semiconductor substrate 301 has a voltage of 0 V, which is supplied from a power line of 0 V (not shown) by a typically known structure.

As shown in the enlarged view (left view) in FIG. 14, the variable resistance element 10a has the lower electrode 14t, the variable resistance layer 13, the oxide layer 12, and the upper electrode 11 which are formed in a sandwich state on the third via 308, and is connected to the fourth via 310 that is connected to the third wire 311.

Here, the oxide layer 12 and the variable resistance layer 13 comprise oxygen-deficient tantalum oxide. The lower electrode 14t and the upper electrode 11 use different materials. In detail, the lower electrode 14t comprises tantalum nitride (TaN) which is an electrode material that does not easily change in resistance (more easily oxidizable than the upper electrode material), and connected to the first N-type diffusion layer region 302b through the via. The upper electrode 11 comprises platinum (Pt) which is a material that easily changes in resistance (less easily oxidizable than the metal forming the variable resistance layer), and connected to the bit line BL0 formed by the third wiring layer 311 through the via.

[Timing Charts of the Nonvolatile Variable Resistance Memory Device]

The following describes operation examples of the nonvolatile variable resistance memory device 200 with the above structure in a writing cycle corresponding to low resistance writing, high resistance writing, and low resistance stabilization writing (also referred to as additional writing) when writing data and a reading cycle when reading data, with reference to timing charts shown in FIG. 15(a) to (d).

Figure 15:
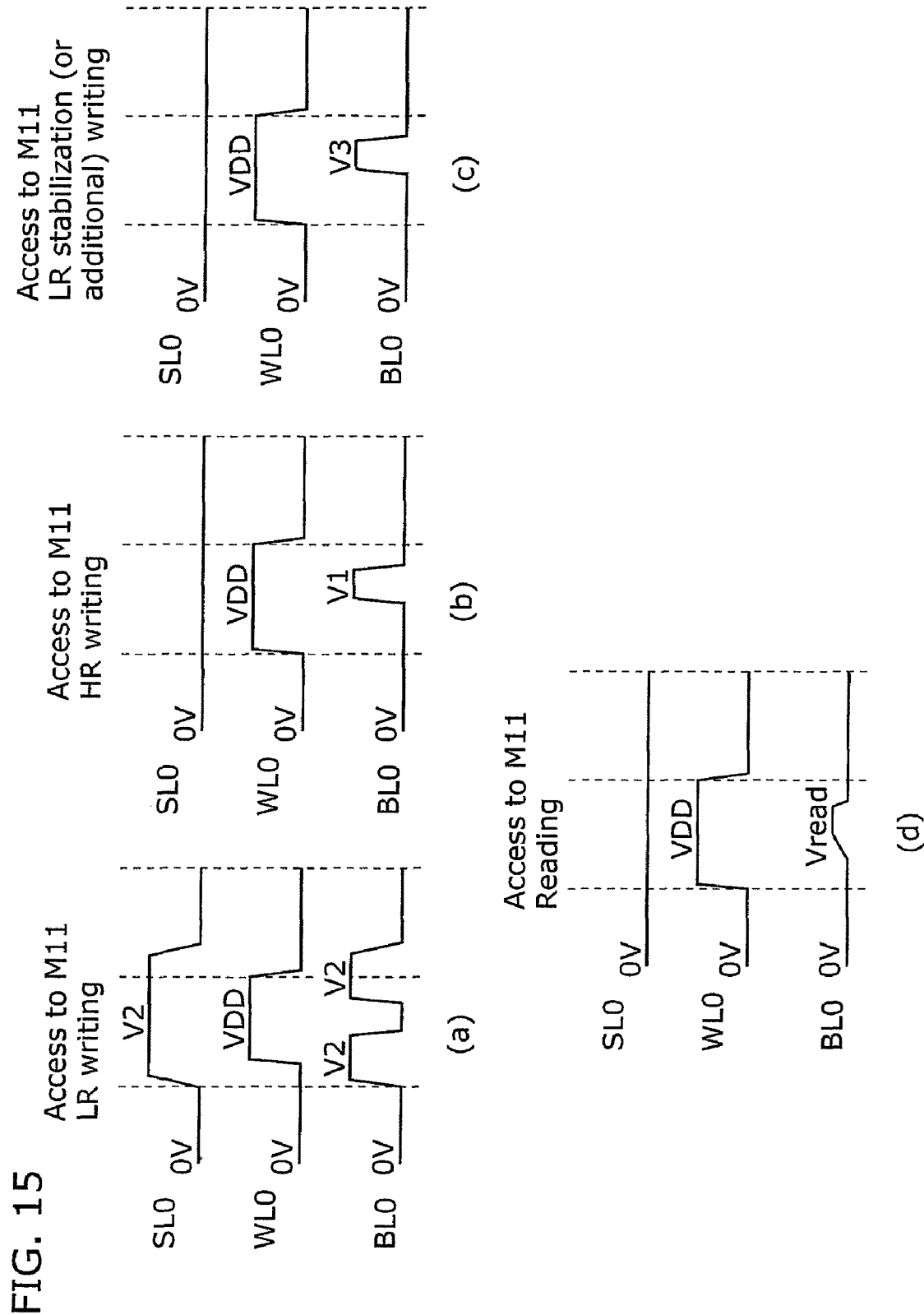
FIG. 15(a) to (d) is a diagram showing various sequences for the memory cell in the embodiment of the present invention.

FIG. 15(a) to (d) is a timing chart showing operation examples of the nonvolatile memory device in the embodiment of the present invention. Here, the operation examples are shown on an assumption that data "1" is assigned to the case where the variable so resistance layer is in the high resistance state and data "0" is assigned to the case where the variable resistance layer is in the low resistance state. Moreover, the description only concerns the case where data writing and reading are performed on the memory cell M11. FIG. 15(a) is a timing chart when low resistance writing is performed on the variable resistance element under control of the LR writing unit in the control circuit 210. FIG. 15(b) is a timing chart when high resistance writing is performed on the variable resistance element under control of the HR writing unit in the control circuit 210. FIG. 15(c) is a timing chart when low resistance stabilization writing is performed on the variable resistance element under control of the LR stabilization writing unit in the control circuit 210.

In FIG. 15(a), the voltage V2 generated in the LR writing power source 212 is set to such a value that a voltage value effectively applied to the variable resistance elements R11, R12, . . . exceeds the absolute value of the low resistance writing threshold voltage Vth.

In FIG. 15(b), the voltage V1 generated in the HR writing power source 213 and supplied to the bit line BL0 through the writing circuit 206 is set to such a value that a voltage value effectively applied to the variable resistance elements R11, R12, . . . exceeds the absolute value of the high resistance writing threshold voltage Vtl.

In FIG. 15(c), the voltage V3 generated in the writing circuit 206 is set to such a value that a voltage value effectively applied to the variable resistance elements R11, R12, . . . is close to and lower than the high resistance writing threshold voltage Vtl. The variable resistance voltage V3 by the LR stabilization writing power source 214 is applied to the variable resistance elements R11, R12, . . . .

In FIG. 15(d), Vread is a read voltage generated in the sense amplifier 204, and is set to such a value that a voltage value effectively applied to the variable resistance elements R11, R12, . . . is sufficiently lower than the high resistance writing threshold voltage Vtl.

In FIG. 15(a) to (d), VDD is a power voltage supplied to the nonvolatile memory device 200 from outside.

In the low resistance writing cycle of writing data "0" to the memory cell M11 shown in FIG. 15(a), the following control is performed under control of the selection unit, the LR writing unit in the control circuit 210, and the like. First, the selected bit line BL0 and source line SL0 are set to the voltage V2. Next, the selected word line WL0 is set to the voltage VDD, to turn ON the NMOS transistor N11 in the selected memory cell M11. At this stage, since the voltage V2 is applied to both of the second N-type diffusion layer region 302a and the first N-type diffusion layer region 302b in the transistor 317, no current flows through the transistor 317.

Following this, the selected bit line BL0 is set to the voltage of 0 V for a predetermined time. After the predetermined time, a pulse waveform of the voltage V2 is applied again. At this stage, a negative voltage whose absolute value exceeds the low resistance writing threshold voltage Vth is applied to the upper electrode 11 in the variable resistance element 10a with respect to the lower electrode 14t, thereby performing writing from the high resistance value to the low resistance value. Subsequently, the word line WL0 is set to the voltage of 0 V, to turn OFF the transistor 317. This completes writing of data "0".

In the high resistance writing cycle of writing data "1" to the memory cell M11 shown in FIG. 15(b), the following control is performed under control of the selection unit, the HR writing unit in the control circuit 210, and the like. First, the selected bit line BL0 and source line SL0 are set to the voltage of 0 V. Next, the selected word line WL0 is set to the voltage VDD, to turn ON the NMOS transistor N11 in the selected memory cell M11.

Following this, the selected bit line BL0 is set to the voltage V1 for a predetermined time. After the predetermined time, a pulse waveform of the voltage of 0 V is applied again. At this stage, a positive voltage whose absolute value exceeds the high resistance writing threshold voltage Vtl is applied to the upper electrode 11 in the variable resistance element 10a with respect to the lower electrode 14t, thereby performing writing from the low resistance value to the high resistance value. Subsequently, the word line WL0 is set to the voltage of 0 V. This completes writing of data "1".

In the low resistance stabilization writing cycle of writing data "0" to the memory cell M11 shown in FIG. 15(c), the following control is performed under control of the selection unit, the LR stabilization writing unit in the control circuit 210, and the like. First, the selected bit line BL0 and source line SL0 are set to the voltage of 0 V. Next, m the selected word line WL0 is set to the voltage VDD, to turn ON the NMOS transistor N11 in the selected memory cell M11.

Following this, the selected bit line BL0 is set to the voltage V3 for a predetermined time. After the predetermined time, a pulse waveform of the voltage of 0 V is applied again. At this stage, a positive voltage near the high resistance writing threshold voltage Vtl is applied to the upper electrode 11 in the variable resistance element 10a with respect to the lower electrode 14t, thereby performing writing from the half LR value to the low resistance value. Subsequently, the word line WL0 is set to the voltage of 0 V. This completes the low resistance stabilization writing cycle. This writing is characterized by applying a pulse equal to or lower than the voltage for high resistance writing, at the polarity of the voltage for high resistance writing.

In the reading cycle of reading data from the memory cell M11 shown in FIG. 15(d), the following control is performed under control of the selection unit, the control circuit 210, and the like. First, the selected bit line BL0 and source line SL0 are set to the voltage of 0 V. Next, the selected word line WL0 is set to the voltage VDD, to turn ON the NMOS transistor N11 in the selected memory cell M11.

Following this, the selected bit line BL0 is set to the read voltage Vread for a predetermined time. The sense amplifier 204 detects a current value flowing through the selected memory cell M11, to determine whether data written in the memory cell M11 is data "0" or data "1". Subsequently, the word line WL0 is set to the voltage of 0 V. This completes the data reading operation.

The following describes a specific example of a method of low resistance stabilization writing, in the case where the pulse V-I characteristics of the memory cell included in the nonvolatile memory device 200 shown in FIG. 10 exhibit both the characteristic type 1 and the characteristic type 2.

[Low Resistance Stabilization Writing by Positive Pulse Application Method (Writing Method in Wafer Inspection)]

As described above, the present inventors have noticed the following characteristics in the process of performing initial evaluation of the memory cell 105. In detail, even when initial low resistance writing (a forming step) is performed as shown in FIG. 3(a) immediately after manufacturing and then rewriting by alternating pulse application is performed as shown in FIG. 4, the resistance change characteristics are unstable. However, once the sequence of the pulse V-I characteristic evaluation shown in FIG. 3(b) is performed, and particularly when a positive voltage pulse close to and not exceeding Vtl is applied, it appears that oxygen ions near the lower electrode are released to thereby cause the oxide layer 15 near the lower electrode to change to the low resistance state, as shown in FIG. 8(d). As a result, the resistance change characteristics by alternating pulse application are stabilized as shown in FIG. 5. In the pulse V-I characteristics from the second measurement onward, the half LR state is resolved as shown in FIGS. 3(c) and (d). Thus, the memory cell 105 subsequently shows the normal characteristics of the characteristic type 1.

This demonstrates that the following method is effective for stabilizing the low resistance state. At the stage of wafer inspection immediately after manufacturing, in order to resolve the half LR state, after initial low resistance writing (the forming step), a positive voltage pulse close to and lower than the high resistance writing threshold voltage Vtl is applied to the variable resistance element, thereby changing the variable resistance element to the low resistance state (normal low resistance state) lower in resistance than the half LR state. After this, the variable resistance element is changed to the high resistance state.

This method is described below, using an example where the method is implemented in the nonvolatile memory device.

Hereafter, voltage application for stabilizing the resistance change characteristics of the variable resistance element is referred to as "stabilization writing". In this embodiment, "LR stabilization writing" of applying a positive voltage near Vtl is performed in order to change the variable resistance element from an unstable low resistance state including the half LR state to the normal low resistance state. Such "LR stabilization writing" is one type of "stabilization writing" for low resistance writing.

Figure 16A:
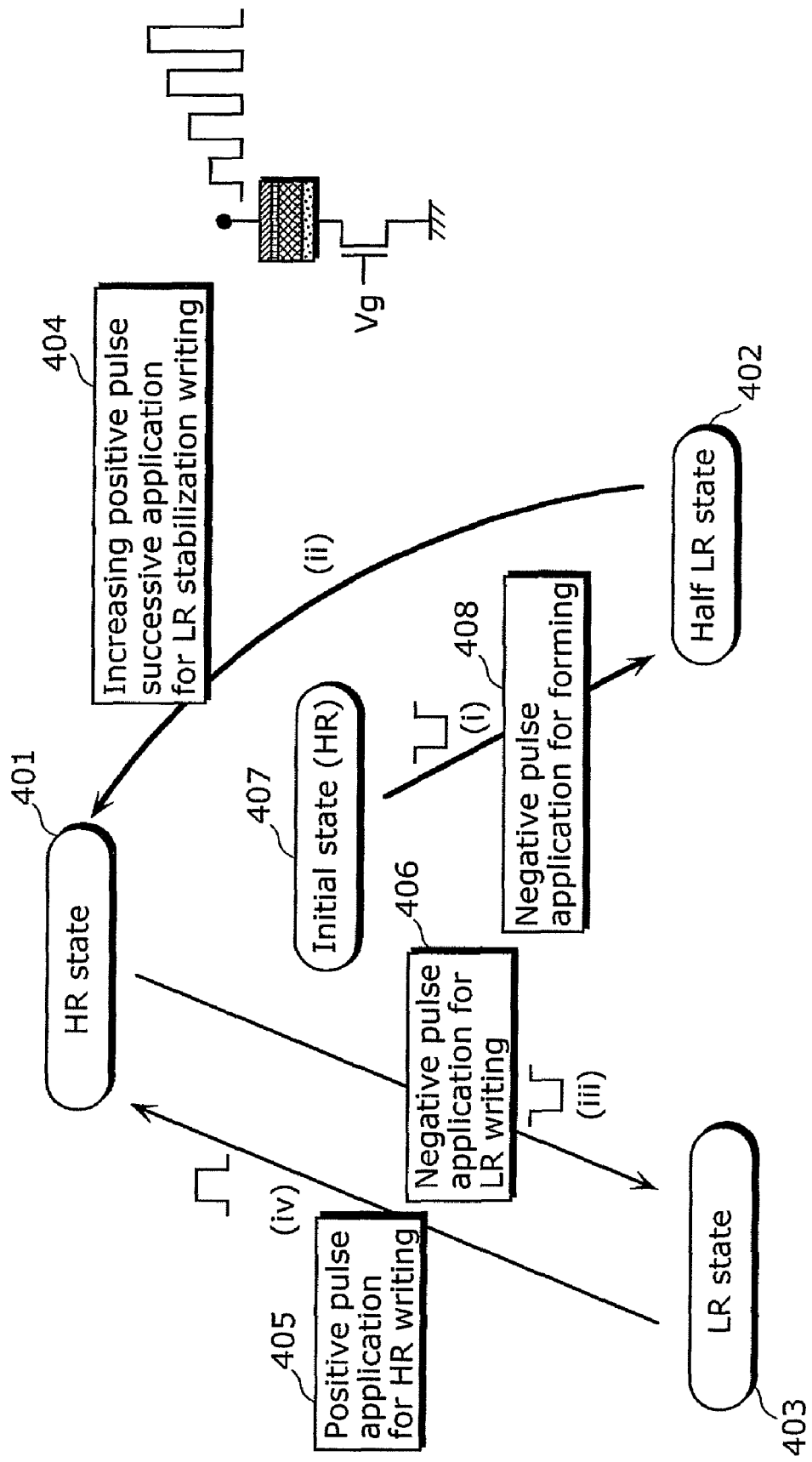
FIG. 16A is a rewriting state change diagram of a selected memory cell in the embodiment of the present invention.

FIG. 16A is a state change diagram showing an overview of processing from the initial state immediately after manufacturing to the stabilization of the low resistance state and further to the subsequent normal rewriting.

In FIG. 16A, a state 407 is the initial state immediately after manufacturing. The resistance state at this stage is a high resistance state higher in resistance value than the high resistance state during the normal operation. First, for the selected memory cell (variable resistance element) subject to rewriting, (i) a forming negative pulse application 408 (a forming step for changing the initial state to the low resistance state, i.e., application of a negative fourth voltage) below the forming threshold voltage Vth0 is performed, thereby changing the variable resistance element to a low resistance (half LR) state 402. At this time, the resistance state is the half LR state of the characteristic type 2. Following this, (ii) increasing positive pulse successive application 404 (low resistance stabilization writing step, i.e., stepwise application of the positive third voltage to the positive first voltage) of successively applying a write pulse voltage that gradually increases from a positive pulse voltage (the positive third voltage) lower than Vtl to a positive pulse voltage (the positive first voltage) for changing to the high resistance state is performed as low resistance stabilization writing, thereby changing the variable resistance element to the normal low resistance state and then to a high resistance state 401. Though the change from the half LR state 402 to the high resistance state 401 by the increasing positive pulse successive application 404 is shown in FIG. 16A, more precisely the normal low resistance state by application of a positive voltage near the high resistance writing threshold voltage Vtl is included during this change.

As a result of the above state changes, the half LR state is resolved. Subsequently, the variable resistance element undergoes the following normal resistance change according to need. In the case of changing from the high resistance state 401 to a low resistance state 403, negative voltage pulse application 406 (low resistance writing step, i.e., application of the negative second voltage) below the low resistance writing threshold voltage Vth is performed as low resistance writing. In the case of changing from the low resistance state 403 to the high resistance state 401, positive voltage pulse application 405 (high resistance writing step, i.e., application of the positive first voltage) exceeding the high resistance writing threshold voltage Vtl is performed as high resistance writing.

Figure 17A:
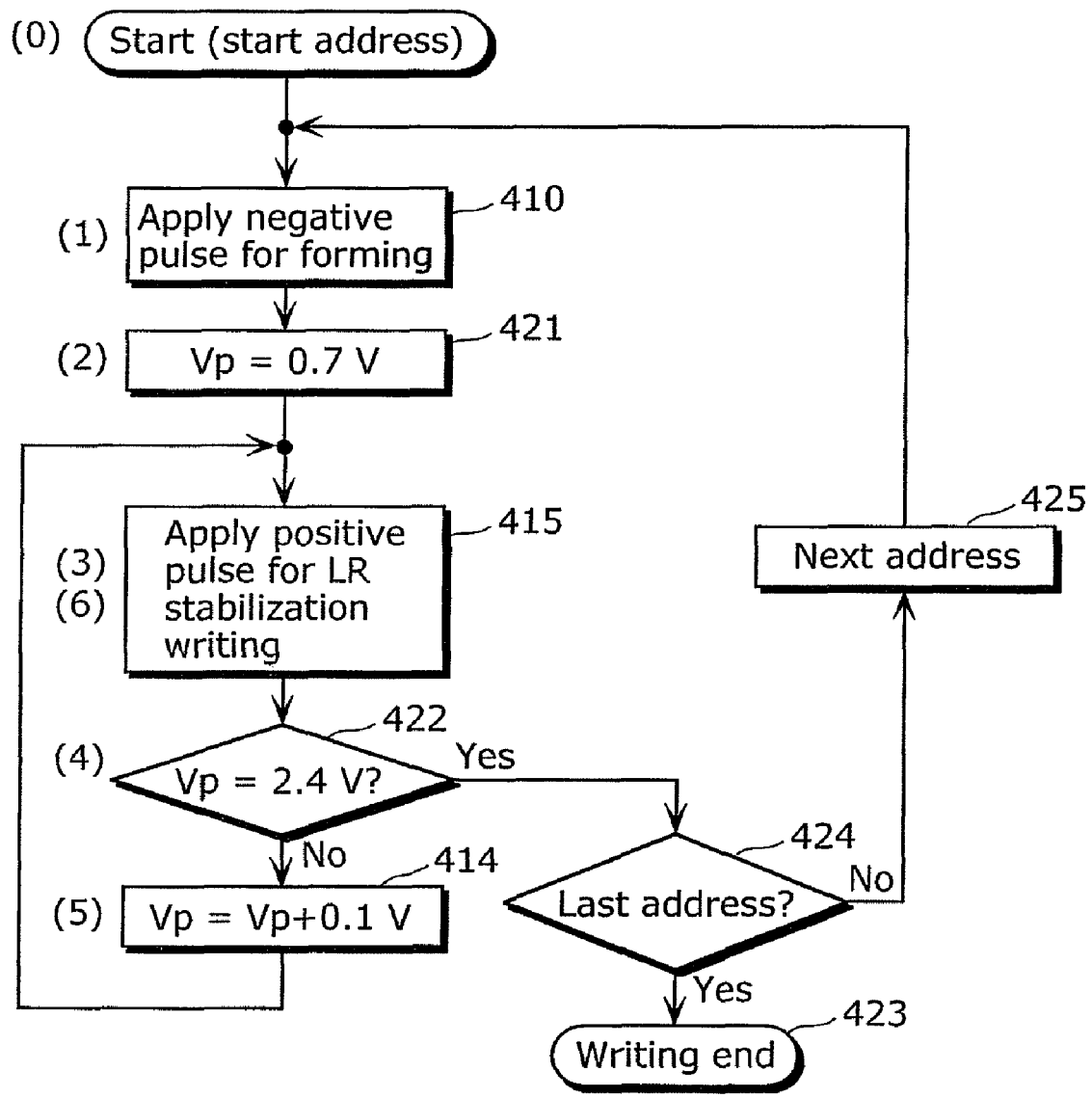
FIG. 17A is a flowchart of low resistance stabilization writing in the embodiment of the present invention.

FIG. 17A is a flowchart of the stabilization of the low resistance state from the initial state immediately after manufacturing. This flowchart shows detailed processing of (i) to (ii) in the state change diagram in FIG. 16A, which is executed at the beginning of functional inspection in wafer inspection.

In FIG. 17A, the following processing is performed on the selected memory cell in the initial state immediately after manufacturing.

(0) The selected memory cell is set as a start address.

(1) First, a forming step is performed in a process 410.

(2) Next, the initial positive pulse voltage Vp for low resistance stabilization writing is set to 0.7 V in a process 421.

(3) Next, the positive voltage pulse for low resistance stabilization writing is applied to the memory cell 105 in a process 415.

(4) Next, whether or not the positive pulse voltage Vp reaches a positive voltage VHR for high resistance writing (2.4 V in this example) is determined in a determination process 422.

When the positive pulse voltage Vp reaches VHR (process 422: "Yes"), the processing advances to a process 424 to determine whether or not the selected memory cell is a last address.

When the selected memory cell is the last address (process 424: "Yes"), the processing ends (423).

When the selected memory cell is not the last address (process 424: "No"), the address is incremented to the next address in a process 425, and the processing is repeated from the forming process 410 of the above (1).

When the positive pulse voltage Vp does not reach the positive voltage of 2.4 V for high resistance writing in the determination process (process 422: "No"), the processing advances to a process 414.

(5) The positive pulse voltage Vp is increased by 0.1 V in the process 414.

(6) After this, the positive voltage pulse for low resistance stabilization writing is applied to the memory cell 105 again, in the process 415. This is the same process as the above (4).

Subsequently, when the positive pulse voltage Vp does not reach the positive voltage of 2.4 V for high resistance writing in the determination process 422 (process 422: "No"), (5) the process 414→(3) the process 415→(4) the determination process 422 are repeated while increasing the positive pulse voltage.

The initial positive pulse voltage Vp is lower than the resistance change threshold voltage Vtl. Relations between the voltages including the positive voltage VHR=2.4 V for high resistance writing are 2.4 V>Vtl>0.7 V.

Through the above initialization to the low resistance state, by initially applying a positive voltage pulse near Vtl, the memory cell state of the characteristic type 2 can be changed to the characteristic type 1.

FIG. 18A is a memory cell access sequence diagram (top) and an image diagram (bottom) of the resistance state of the selected memory cell based on the cell current, in the case where the processing of the flowchart shown in FIG. 17A is performed in the nonvolatile memory device 200. The selected memory cell in this sequence diagram is the memory cell M11 shown in FIG. 10.

In FIG. 18A, since the memory cell M11 is in an unselected state before the processing of the flowchart shown in FIG. 17A, the initial voltage states of the word line WL0, the bit line BL0, and the source line SL0 are all 0 V.

First, to execute the forming process (negative voltage pulse application) of the process 410 in period "te" shown in FIG. 18A, the output voltage V2 of the LR writing power source 212 is applied to all of the bit lines BL0, BL1, BL2, . . . and the source line SL0. After this, the voltage VDD sufficient to turn ON the transistor N11 is applied to the word line WL0. At this time, all of the memory cells M11, M21, M31, . . . on the same word line are turned ON, but no resistance change occurs in the variable resistance elements R11, R21, R31, . . . because the bit line and the source line are equal in voltage. Next, having received the pulse signal PLS from the control circuit 210, the writing circuit 206 changes the voltage of the selected bit line BL0 as V2→0 V→V2 according to the pulse signal, so that the resistance state of the selected memory cell M11 changes from the high resistance state immediately after manufacturing to a low resistance (half LR) state. After this, to end low resistance writing of the process 410, 0 V is applied to the word line WL0, and further 0 V is applied to all of the bit lines BL0, BL1, BL2, . . . and the source line SL0.

Next, the low resistance stabilization writing of the process 415 is executed in periods "tp1" to "tpn". The output of the LR stabilization writing power source 214 is set to V31G in the process 421 so that a first-time pulse voltage V31 (=V31G−Vt) is generated by the writing circuit 206. Here, in the LR stabilization writing power source 214, only an arbitrary one of the switches 231a to 231n is turned ON (for example, the switch 231f is ON and the other switches are OFF) in the voltage selection switch group 231 according to an instruction from the applied voltage controller 229, and the potential V31G of an intermediate node of the series-connected fixed resistors 232 is supplied to V3G (for example, the potential of the node nLf is supplied when the switch 231f is ON).

After this, in low resistance stabilization writing of the process 415, the voltage VDD sufficient to turn ON the transistor N11 is applied to the word line WL0. Next, having received the pulse signal PLS from the control circuit 210, the writing circuit 206 changes the voltage of the selected bit line BL0 as 0 V→V31→0 V according to a pulse time of the pulse signal, so that the resistance state of the selected memory cell M11 changes to a lower resistance (LR) state.

The control circuit 210 then determines whether or not the pulse voltage Vp reaches VHR, in the determination process 422. When the pulse voltage Vp does not reach VHR, to generate a second-time pulse voltage V32 (=V32G−Vt) of the write pulse voltage from the writing circuit 206, the output of the LR stabilization writing power source 214 is set to V32G in the process 414. Here, in the LR stabilization writing power source 214, the selection of the ON switch is changed in a voltage increasing direction among the switches 231a to 231n (for example, the switch 231f is OFF and the switch 231e is ON) in the voltage selection switch group 231 according to an instruction from the applied voltage controller 229, and the potential V32G of an intermediate node of the series-connected fixed resistors 232 is supplied to V3G (for example, the potential of the node nLe is supplied when the switch 231e is ON).

After this, in low resistance stabilization writing of the process 415, having received the pulse signal PLS from the control circuit 210, the writing circuit 206 changes the voltage of the selected bit line BL0 as 0 V→V32→0 V according to the pulse time of the pulse signal, so that the resistance state of the selected memory cell M11 changes to a lower resistance (LR) state. At this time, the voltage of the word line WL0 is maintained at VDD from the first time.

In the same manner, the flow of the determination process 422→the process 414→the process 415 is repeated where the selection of the ON switch is changed again in the voltage increasing direction among the switches 231a to 231n in the voltage selection switch group 231 in the LR stabilization writing power source 214 according to an instruction from the applied voltage controller 229 to thereby increase the output voltage of V3G in the process 414, and the writing circuit 206 applies a pulse voltage increased from the previous time to the selected bit line BL0 in the process 415. As the flow of the determination process 422→the process 414→the process 415 is repeated, the write pulse voltage that increases stepwise to the pulse voltage V1 for high resistance writing is successively applied to the bit line BL0. During this time, the resistance value of the variable resistance element is not read, so that the above processing can be performed at high speed. Though it is desirable to increase the pulse voltage by equal to or lower than 0.1 V on the basis of FIGS. 3, 6, and 7, there is no problem even when the amount of increase is coarser such as about 0.2 V for faster processing.

From "tp1" to immediately before "tp(n-k)", the selected memory cell M11 gradually decreases in resistance value (increases in cell current) from the half LR state. Once the write pulse voltage exceeds Vtl, the selected memory cell M11 changes to the high resistance state (the change to the high resistance state occurs at V3 (n-k) in FIG. 18A).

As described above, in this embodiment, without knowledge of the level of the voltage (high resistance writing threshold voltage) Vtl for starting the change from the low resistance state to the high resistance state, the positive write pulse voltage that sweeps from a low positive voltage so as to pass through the voltage Vtl is applied to the variable resistance element in the low resistance state (especially, the variable resistance element after a forming step, or the variable resistance element in the half LR state). This ensures that the positive write pulse voltage passes through a peak current state near Vtl, with it being possible to resolve the characteristic type 2. In other words, an unstable variable resistance element that can be in the half LR state is initialized to a stable variable resistance element that changes from the normal low resistance state to the high resistance state and vice versa.

In Embodiment 1 described above, the positive write voltage pulse that increases gradually is successively applied to the bit line relating to the selected memory cell, as shown in the low resistance stabilization writing sequence in FIG. 18.

A pulse width during low resistance stabilization writing is short such as 50 ns. An increase in increasing voltage setting time leads to an increase in whole rewriting time, which needs to be avoided as much as possible.

As a typical method for the low resistance stabilization writing circuit, a system in which a power circuit of the same differential amplifier type as the HR writing power source 213 is used and stable power of the power circuit is successively switched to thereby change the pulse voltage may be employed. In this system, however, a time of several hundred ns to several μs is taken for voltage setting. Since the present low resistance stabilization writing sequence merely sweeps the voltage successively, a circuit system for realizing the low resistance stabilization writing circuit by a relatively simple structure is examined.

The following describes an example of a circuit system that can accelerate an interval time of successive pulse application associated with the above voltage increase.

As shown in FIG. 11, the low resistance stabilization writing circuit includes the low resistance stabilization writing circuit 236 in the writing circuit 206 and the LR stabilization writing power source 214. The structure and operation of each circuit are described below. The low resistance stabilization writing circuit 236 includes the driver 233 and the N-channel transistor 234. The driver 233 feeds a write pulse of 0 V→VDD→0 V to the output VPLS using VDD as power, upon receiving the pulse signal PLS. The N-channel transistor 234 connects the output VPLS of the driver 233 to one diffusion node (for example, the drain), and generates a voltage obtained by clamping VDD at the other diffusion node (for example, the source). The voltage generated at the source terminal (the output terminal DT) of the N-channel transistor 234 is (V3G−Vt) when Vt denotes the threshold voltage of the N-channel transistor 234 and V3G denotes the gate voltage (where (V3G−Vt)≦VDD).

Thus, the clamped voltage at the output terminal DT is determined by the gate voltage V3G, so that the gate voltage V3G can be set according to the voltage at the output terminal DT.

In order to shorten the pulse application interval time, it is important to complete the setting of the gate voltage in a short time. So, the high voltage level of the pulse output to the output terminal DT in low resistance stabilization writing should be increased by a gate voltage change amount ΔV of the output V3G, each time the pulse application is performed. This can be achieved by the LR stabilization writing power source 214. The LR stabilization writing power source 214 has an internal structure in which the plurality of fixed resistors 232 are connected in series between the VPP terminal and the ground terminal, and one intermediate node in the series resistors is selected by the switches 231a to 231n and supplied. Since this structure does not involve feedback connection unlike the LR writing power source 212, no smoothing capacitance is necessary for the capacitance of the output node V3G. As a load capacitance, there is only a gate capacitance of the N-channel transistor 234, which is extremely small such as 100 fF at a maximum. Therefore, by setting the current flowing in the series resistors between the VPP terminal and the ground terminal to an optimum value, the ON switch in the intermediate node selection switch group 231 can be shifted by one to the VPP terminal side, as a result of which the voltage setting time in the case of increasing the voltage by ΔV can be made very short such as about several ns. For example, when the gate capacitance of the N-channel transistor 234 is 100 fF, the voltage change amount ΔV of the output V3G by switching is 0.1 V, the current flowing in the series resistors is 100 μA, and a current for charging the output V3G upon voltage change is 10 μA which is about one-tenth of the current flowing in the series resistors, a time ΔTv required for the voltage change of the output V3G is 100 fF×0.1 V/10 μA=1 ns.

In this way, the pulse voltage setting in low resistance stabilization writing is completed in a very short time with respect to the pulse application time. Hence, the low resistance stabilization writing sequence in FIG. 18A can be completed in a very short time that is determined by "((pulse application time of one pulse application)+ΔTv)×(pulse count)".

Moreover, the switch selection in the switch group 231 in the low resistance stabilization writing sequence is made merely by shifting to a switch closer to the VPP side one at a time, in order to increase the output voltage V3G by ΔV in each pulse application. Accordingly, the applied voltage controller 229 can perform control merely by sequentially incrementing the number of switch by its output signal. This enables the applied voltage controller 229 to be realized by a simple structure such as a shift register.

Embodiment 2

The following describes a variable resistance element writing method and a nonvolatile memory device in Embodiment 2 of the present invention.

As shown in FIG. 6(c), there is the case where the low resistance state becomes half LR state in rare occasions even after low resistance stabilization writing is performed in the initial stage immediately after manufacturing. In such a case, a possibility of erroneous reading arises. One way to deal with this problem is a method using error correction such as ECC. Another way is a method typically used in nonvolatile memories, that is, a method of performing verification upon writing and, when the verification results in "No", performing additional writing (low resistance stabilization writing). The following describes the latter method of performing verification and additional writing (low resistance stabilization writing).

After performing low resistance writing, the low resistance state is determined. In the case where the low resistance state is an abnormal state such as the half LR state as shown in FIG. 6(c), there is a need to resolve the abnormal state by performing low resistance stabilization writing again.

FIG. 16B is a state change diagram of processing in the case where low resistance stabilization writing is performed again during the resistance change by positive and negative alternating pulse application.

In FIG. 16B, in the case where the high resistance state or the low resistance state is normally rewritten by positive and negative alternating pulse application, the LR writing negative pulse application 406 (low resistance writing step, i.e., application of the negative second voltage) induces the change from a high resistance state or low resistance state 401a to the low resistance state 403 (arrow (iii)). On the other hand, in the case where the LR writing negative pulse application 406 (low resistance writing step, i.e., application of the negative second voltage) induces the change from the high resistance state or low resistance state 401a to the half LR state 402 (arrow (i)), the increasing positive pulse successive application 404 (low resistance stabilization writing step, i.e., application of the positive third voltage) for low resistance stabilization writing is executed to once return to the high resistance state 401 through the low resistance state, in order to resolve the half LR state. After this, the LR writing negative pulse application 406 (low resistance writing step, i.e., application of the negative second voltage) is performed again. As a result, the high resistance state 401 is changed to the low resistance state 403 this time, due to the low resistance stabilization writing 404 performed earlier. Though the change from the half LR state 402 to the high resistance state 401 by the increasing positive pulse successive application 404 is shown in FIG. 16B, more precisely the normal low resistance state by application of a voltage near Vt1 is included during this change.

Hence, it is necessary to determine whether or not the low resistance state is normal, after performing the LR writing negative pulse application 406 (low resistance writing step, i.e., application of the negative second voltage).

Meanwhile, when changing from the low resistance state 403 to the high resistance state 401, the positive voltage pulse application 405 (high resistance writing step, i.e., application of the positive first voltage) equal to or higher than Vt1 is executed as high resistance writing.

Figure 17B:
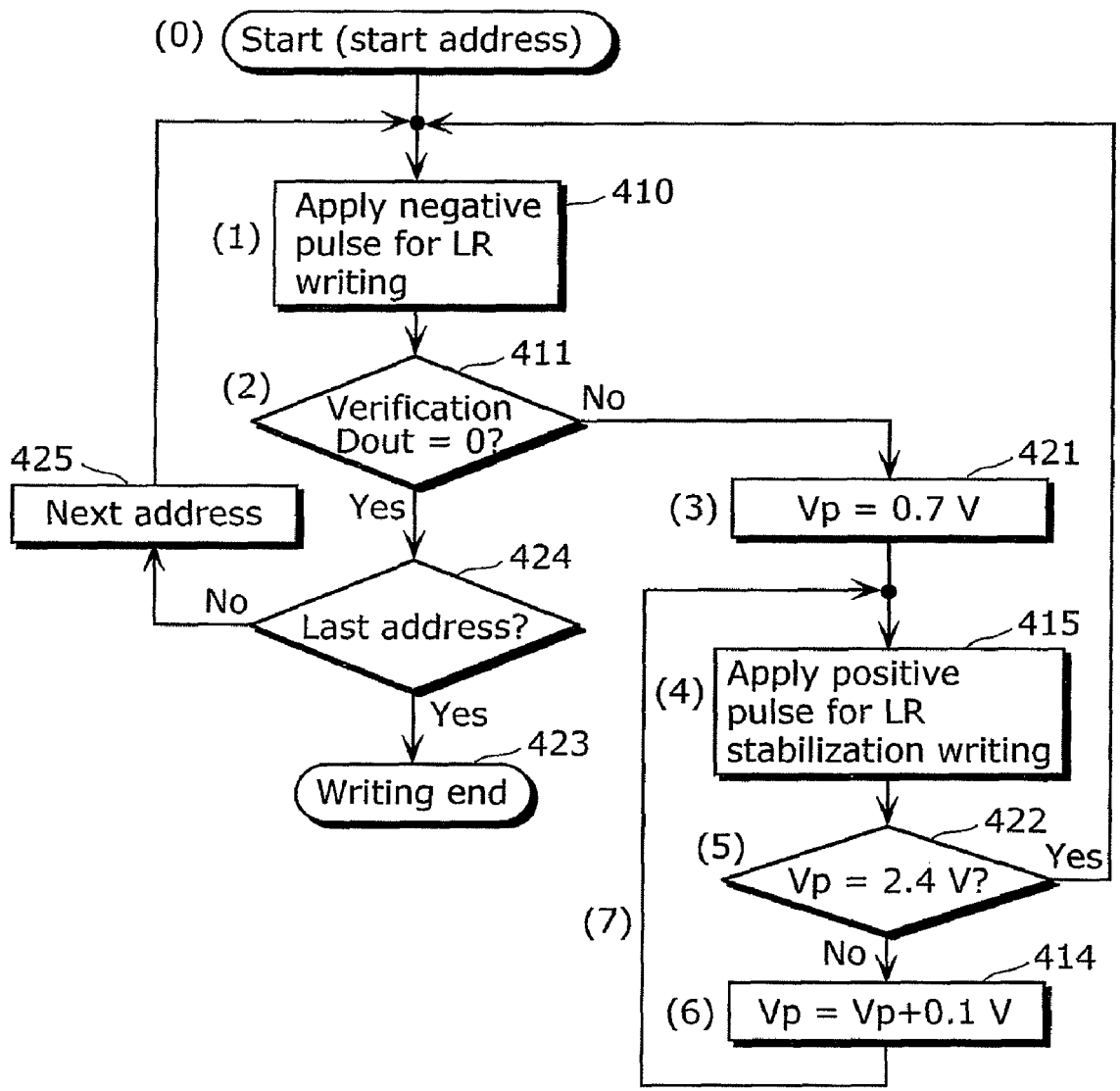
FIG. 17B is a flowchart of low resistance stabilization writing in the embodiment of the present invention.

FIG. 17B is a flowchart of determining whether or not the low resistance state is the half LR state and stabilizing the low resistance state to resolve the half LR state when the low resistance state is the half LR state, in the case of performing low resistance writing sequentially on a plurality of memory cells. This flowchart shows processing of the determination of whether or not the selected memory cell is in the half LR state 402 and the details of the low resistance stabilization writing 404 (ii) in the state change diagram of FIG. 16B, which is performed in ordinary use.

In FIG. 17B, the following processing is performed on the selected memory cell.

(0) The selected memory cell is set as the start address.

(1) The negative voltage pulse for low resistance writing below Vth is applied to execute low resistance writing in the process 410.

(2) Next, the sense amplifier 204 shown in FIG. 12 determines the low resistance state on the basis of whether or not the cell current is equal to or higher than the specified current ILRdet in a determination process 411 (verification step). Here, to set the specified current to ILRdet in the sense amplifier 204, the control circuit 210 sets the signals fed to the gates in the reference circuit 252 as C1=VDD, C2=0 V, and C3=0 V. When the current of the selected memory cell is equal to or higher than the specified current ILRdet, the output SAO is 0 V, and as a result the data output terminal Dout shown in FIG. 10 is "0" (process 411: "Yes"). When the current of the selected memory cell is lower than the specified current ILRdet, the output SAO is the voltage VDD, and as a result the data output terminal Dout is "1" (process 411: "No").

When the cell current is equal to or higher than ILRdet, the data output terminal Dout is "0" according to the output of the sense amplifier 204 (process 411: "Yes"). As a result, the external device recognizes the low resistance state as the normal low resistance state. The processing then advances in the "Yes" direction to complete low resistance writing of the selected memory cell. After this, whether or not the selected memory cell is the last address is determined (process 424). When the selected memory cell is not the last address (process 424: "No"), the address is incremented (process 425), and the processing is repeated from the process 410.

On the other hand, when the cell current is lower than ILRdet, the data output terminal Dout is "1" according to the output of the sense amplifier 204. As a result, the external device recognizes the low resistance state as the abnormal half LR state. The processing then advances in the "No" direction from the process 411, and the following low resistance stabilization writing flow (processes 421 to 414) is executed.

This low resistance stabilization writing flow is the same as the first low resistance stabilization writing flow immediately after manufacturing in FIG. 17A.

(3) First, the initial positive pulse voltage Vp for low resistance stabilization writing is set to 0.7 V in the process 421.

(4) Next, the positive voltage pulse for low resistance stabilization writing is applied to the memory cell 105 in the process 415.

(5) Next, whether or not the positive pulse voltage Vp reaches the positive voltage of 2.4 V for high resistance writing is determined in the determination process 422.

When the positive pulse voltage Vp reaches 2.4 V (process 422: "Yes"), low resistance stabilization writing is completed and the processing advances to the process 410.

When the positive pulse voltage Vp does not reach 2.4 V (process 422: "No"), the processing advances to the process 414.

(6) The positive pulse voltage Vp is increased by 0.1 V in the process 414.

(7) After this, the positive voltage pulse for low resistance stabilization writing is applied to the memory cell 105 again, in the process 415. This is the same process as the above (4).

Subsequently, when the positive pulse voltage Vp does not reach the positive voltage VHR for high resistance writing (2.4 V in this example) in the determination process 422 (process 422: "No"), the process 414→the process 415→the determination process 422 are repeated while increasing the positive pulse voltage.

The initial positive pulse voltage Vp is lower than the resistance change threshold voltage Vtl. Relations between the voltages including VHR=2.4 V are 2.4 V>Vtl>0.7 V.

Through the above procedure of resistance state determination (verification step) and low resistance stabilization writing, the memory cell in the half LR state can be changed to the low resistance state.

Figure 18B:
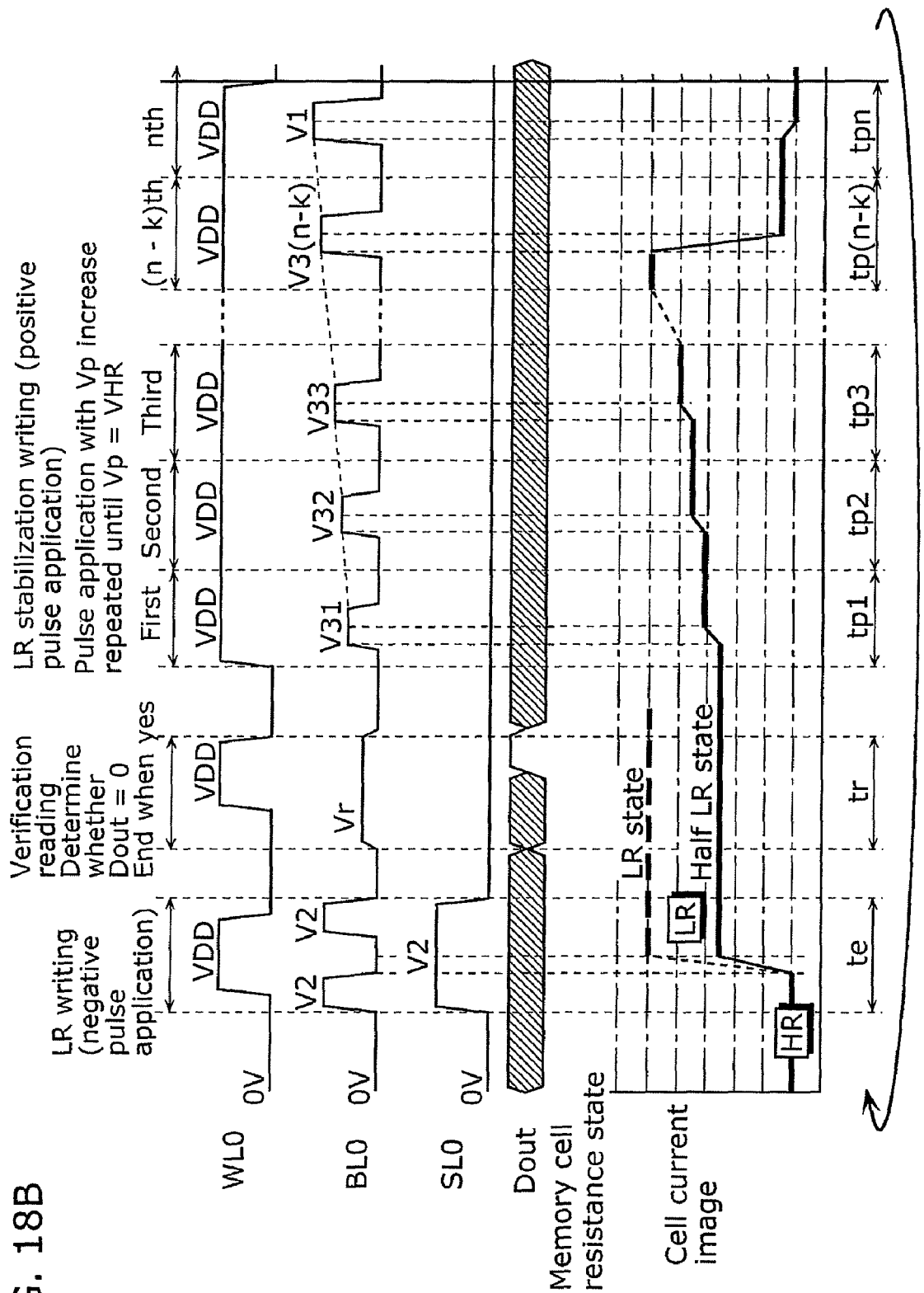
FIG. 18B is a sequence diagram of low resistance stabilization writing and a selected memory cell state image diagram in the embodiment of the present invention.

FIG. 18B is a memory cell access sequence diagram (top) and an image diagram (bottom) of the resistance state of the selected memory cell based on the cell current, in the case where the processing of the flowchart shown in FIG. 17B is performed in the nonvolatile memory device 200. The selected memory cell in this sequence diagram is the memory cell M11 shown in FIG. 10.

In FIG. 18B, since the memory cell M11 is in an unselected state before the processing of the flowchart shown in FIG. 17B, the initial voltage states of the word line WL0, the bit line BL0, and the source line SL0 are all 0 V.

First, low resistance writing of the process 410 is performed in period "te" shown in FIG. 18B. This operation is the same as that in FIG. 18A, and so its detailed description is omitted.

As a result of low resistance writing, the resistance state changes from the high resistance state (HR) to the low resistance state. In order to determine whether or not the resistance state is the half LR state, the sense amplifier 204 performs verification reading in period "tr" which follows. In verification reading, the reference circuit 252 in the sense amplifier 204 is set to C1=VDD, C2=0 V, and C3=0 V. This allows the detection current ILRdet to be supplied to the selected bit line upon determination. First, the sense amplifier 204 applies the precharge voltage Vr that is equal to or lower than the high resistance writing threshold voltage Vtl and causes no resistance change, to the selected bit line BL0. The bit line current supplied from the sense amplifier 204 during this time has a large current capability, for fast charging of the bit line. Next, the voltage VDD sufficient to turn ON the transistor N11 is applied to the selected word line WL0, and at the same time the current capability from the sense amplifier 204 is set to the memory cell state detection current ILRdet. When the resistance state of the selected memory cell is the half LR state, the bit line voltage does not drop. When the resistance state of the selected memory cell is the low resistance state, the bit line voltage drops. The sense amplifier 204 detects this difference in voltage, and provides the detection result to the data output circuit 205 as a logic signal. When the detection result of the sense amplifier 204 shows the low resistance state, the data output terminal Dout is "0", and accordingly the external device ends low resistance writing at this point. When the detection result of the sense amplifier 204 shows the half LR state, the data output terminal Dout is "1", and accordingly the external device executes the low resistance stabilization writing sequence of the process 415 from tp1 onward. Note that the low resistance stabilization writing sequence operation is the same as that shown in FIG. 18A, and so its detailed description is omitted. Since the state of the memory cell after low resistance stabilization writing is completed is the high resistance state (HR), low resistance writing of the process 410 is then performed again to change the memory cell to the low resistance state.

Thus, the half LR state is resolved and the low resistance state is recovered.

As described above, in this embodiment, for the variable resistance element after a forming step, the positive voltage pulse that increases stepwise is successively applied to the bit line relating to the selected memory cell, with it being possible to perform low resistance stabilization writing at high speed. Moreover, in actual read and write operations following such initialization, verification is performed after low resistance writing, and low resistance stabilization writing is carried out only when the half LR state occurs. In this way, the process for avoiding the half LR state can be reliably carried out regardless of whether the variable resistance element is in the initial state immediately after manufacturing or in the subsequent actual operation state.

Embodiment 3

The following describes a variable resistance element writing method and a nonvolatile memory device in Embodiment 3 of the present invention, where low resistance stabilization writing by a positive voltage pulse is performed without verification.

The data shown in FIGS. 7(b) and (c) indicates the following possibility. In the case where the half LR state of the characteristic type 2 frequently occurs in low resistance writing even after low resistance stabilization writing is performed immediately after manufacturing, the problem cannot be resolved by the correction method described in Embodiment 1. Besides, even when the correction method described in Embodiment 2 is employed, the correction step needs to be performed almost every time.

The present inventors have devised a method of correcting the half LR state of the memory cell having such writing characteristics of the frequent occurrence of the characteristic type 2, to the low resistance state.

In the pulse V-I characteristic graph shown in FIG. 7, when the negative voltage pulse equal to or lower than the low resistance writing threshold voltage Vth is applied in FIG. 7(c) of the characteristic type 2, the resistance change stops at the half LR state where the cell current is about 37 μA. However, when the pulse voltage is subsequently increased to the positive side, the change to the low resistance state takes place near the high resistance writing threshold voltage Vtl. The maximum cell current when the pulse voltage is near Vtl is 60 μA, which is similar to the current value in the low resistance state.

On the basis of this phenomenon, the present inventors have devised a new method for correcting the half LR state to the low resistance state. In this method, low resistance stabilization writing is performed while setting (fixing) the pulse voltage near Vtl. In other words, low resistance stabilization writing is performed by applying the voltage near Vtl only once, instead of repeating voltage application while gradually increasing the voltage.

Despite demands for high-speed writing, the verification method described above performs reading on all bits subject to low resistance writing, which causes a decrease in writing speed. In view of this, the determination step of the sense amplifier is omitted in this embodiment. As a specific method that also achieves such high-speed writing, there is a method whereby, after low resistance writing by the negative voltage pulse, the positive voltage pulse equal to or lower than the high resistance writing threshold voltage Vtl is applied only once, on an assumption that the resistance state of the memory cell is the half LR state of the characteristic type 2. That is, after the negative voltage pulse is applied to the variable resistance element, low resistance stabilization writing by the voltage close to and not higher than Vtl is performed only once, without determining the resistance state after the application. This enables the memory cell in the half LR state to be changed to the low resistance state at high speed.

As can be seen from FIG. 3(d) (characteristic type 1), when the negative voltage pulse equal to or lower than Vth is applied to the variable resistance element which is in the normal low resistance state by negative voltage pulse application, the variable resistance element is in the low resistance state of about 70 μA in cell current. This state is unchanged even when the pulse voltage is then increased to the positive side, until Vtl is reached. This indicates that, in the case where the resistance state of the memory cell becomes the low resistance state of the characteristic type 1 after the write pulse for low resistance writing is applied, the resistance state is unaffected even when the positive voltage pulse equal to or lower than the high resistance writing threshold voltage Vtl is applied next. Hence, there is no problem even when low resistance stabilization writing is performed without checking the resistance state after the application of the write pulse for low resistance writing.

Therefore, a method shown in a state change diagram of FIG. 19 is effective as a rewriting sequence for the nonvolatile memory device having the characteristic type 2. In this method, (i) and (ii) are performed on the memory cell 105 in the low resistance or high resistance state. (i) is the process 406 (low resistance writing step, i.e., application of the negative second voltage) of applying the negative pulse for low resistance (LR) writing, in order to cause the change to the low resistance state. (ii) is the process 407 (low resistance stabilization writing step, i.e., application of the positive third voltage) of applying the positive pulse (equal to or lower than Vtl) for low resistance (LR) stabilization writing in order to cause the change to the normal low resistance state 403, on an assumption that the memory cell 105 is in the half LR state 402 as a result of the process of (i). That is, in the case of changing to the low resistance state, the process of (i) is always followed by the process of (ii).

By performing (i)→(ii) in this way, the variable resistance element can be reliably put in the normal low resistance state, regardless of whether the variable resistance element is the characteristic type 1 or the characteristic type 2.

In the case where the variable resistance element changes from the high resistance state 401 or 401a to the normal low resistance state 403 of the characteristic type 1 by the low resistance (LR) writing negative pulse application 406, the normal low resistance state is unchanged even when the positive pulse for low resistance (LR) stabilization writing of (ii) is applied to the variable resistance element in the normal low resistance state 403. Hence, the execution of (ii) poses no problem.

Accordingly, (i) and (ii) for changing to the low resistance state can be performed without regard to the characteristic type.

Note that, in the case of changing from the low resistance state to the high resistance state, positive voltage pulse application (high resistance writing step, i.e., application of the positive first voltage) equal to or higher than Vtl is performed as high resistance writing.

Embodiment 4

The following describes a variable resistance element writing method and a nonvolatile memory device in Embodiment 4 of the present invention for reliably changing the variable resistance element form the high resistance state to the low resistance state.

As a method for reliably changing the variable resistance element to the low resistance state, a method using verification is described first.

As shown in FIG. 7(c) (characteristic type 2), in the cell current change from the half LR state to the low resistance state by the voltage equal to or lower than the high resistance writing threshold voltage Vtl, the cell current Ir sharply increases from 36 μA to 60 μA by 24 μA when the pulse voltage Vp changes by 0.5 V near Vtl. Besides, when the voltage higher than Vtl exceeding the maximum current is applied, the resistance state changes to the high resistance state (low cell current state). Once the resistance state has changed to the high resistance state, the resistance state cannot be changed to the low resistance state unless the negative voltage pulse equal to or lower than the low resistance writing threshold voltage Vth is applied. Accordingly, in order to change to the low resistance state, low resistance writing by negative voltage pulse application needs to be repeated. Such rewriting of the memory cell which has unintentionally become the high resistance state to the low resistance state again has disadvantages such as loss of time.

In view of this, the present inventors have conceived to introduce verification (resistance state check by reading) in order to reliably change the memory cell to the low resistance state while preventing the change to the high resistance state, in low resistance writing.

The following describes a method of low resistance writing with verification.

Figure 20:
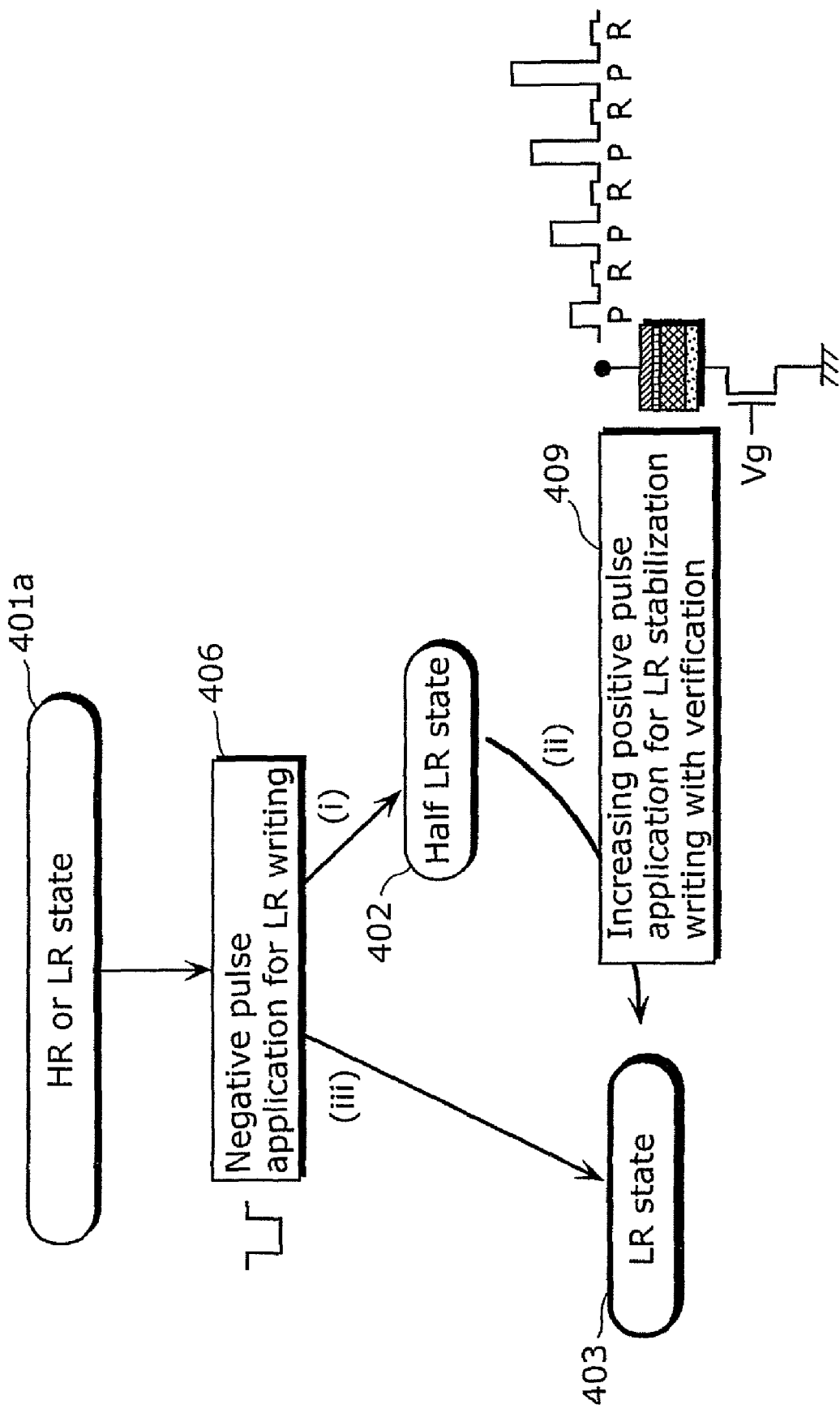
FIG. 20 is a rewriting state change diagram of the selected memory cell in the embodiment of the present invention.

FIG. 20 is a state change diagram when verification for the memory cell 105 is introduced.

In FIG. 20, the process 406 (low resistance writing step, application of the negative second voltage) of applying the low resistance writing negative pulse for changing to the low resistance state is applied to the memory cell 105 in the high resistance or low resistance state 401a. When the rewriting to the low resistance state is normally performed, the memory cell 105 changes from the high resistance or low resistance state 401a to the low resistance state 403 by the LR writing negative pulse application 406 (arrow (iii)). On the other hand, when the resistance state after the LR writing negative pulse application 406 is performed on the memory cell 105 in the high resistance state 401a is the half LR state 402 as shown by the arrow (i), low resistance stabilization writing with verification 409 (low resistance stabilization writing step, i.e., application of the positive third voltage) is performed to resolve the half LR state 402. Low resistance stabilization writing is completed once the low resistance state 403 is attained.

Meanwhile, when changing from the low resistance state to the high resistance state, the positive voltage pulse application (high resistance writing step, i.e., application of the positive first voltage) equal to or higher than Vtl is executed as high resistance writing.

Figure 21:
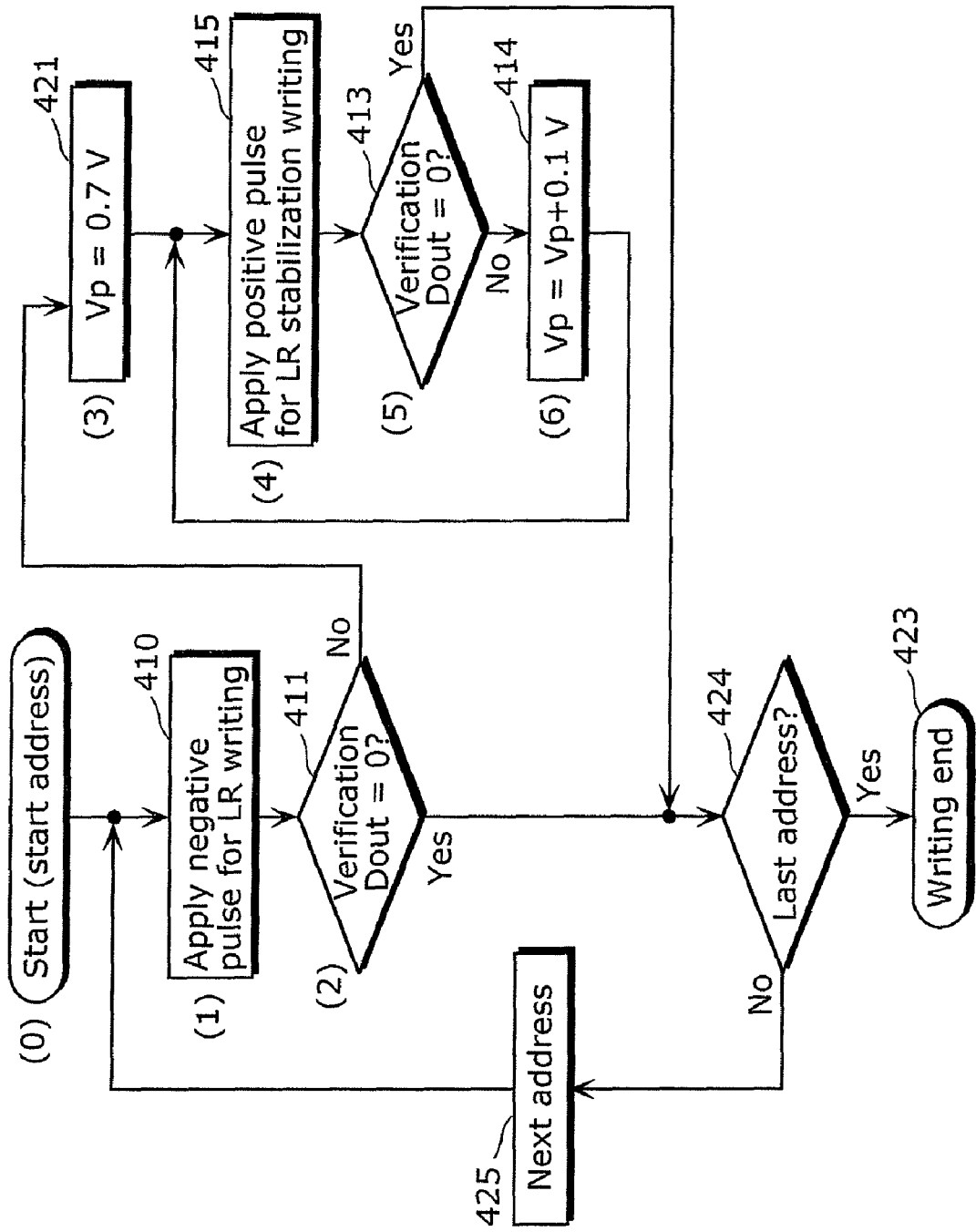
FIG. 21 is a flowchart of low resistance stabilization writing in the embodiment of the present invention.

FIG. 21 is a flowchart of low resistance writing with verification for the memory cell 105. This flowchart shows details of processing related to (i), (ii), and (iii) for changing from the high resistance state to the low resistance state in the state change diagram of FIG. 20.

In FIG. 21, the following processing is performed on the selected memory cell.

(0) The selected memory cell is set as the start address.

(1) Low resistance writing of applying the negative voltage pulse equal to or lower than the low resistance writing threshold voltage Vth is performed to change the selected memory cell to the low resistance state in the process 410.

(2) Next, the sense amplifier 204 determines the low resistance state on the basis of whether or not the cell current is equal to or higher than the specified current ILRdet in the determination process 411. Here, to set the specified current to ILRdet in the sense amplifier 204, the control circuit 210 sets the signals fed to the gates in the reference circuit 252 as C1=VDD, C2=0 V, and C3=0 V. When the current of the selected memory cell is equal to or higher than the specified current ILRdet, the output SAO is 0 V, and as a result the data output terminal Dout shown in FIG. 10 is "0" (process 411: "Yes"). When the current of the selected memory cell is lower than the specified current ILRdet, the output SAO is the voltage VDD, and as a result the data output terminal Dout is "1" (process 411: "No").

When the cell current is equal to or higher than ILRdet, the data output terminal Dout is "0" according to the output of the sense amplifier 204 (process 411: "Yes"). As a result, the external device recognizes the low resistance state as the normal low resistance state. The processing then advances in the "Yes" direction from the process 411, to complete low resistance writing of the selected memory cell. After this, whether or not the selected memory cell is the last address is determined (process 424). When the selected memory cell is not the last address (process 424: "No"), the address is incremented (process 425), and the processing is repeated from the process 410.

On the other hand, when the cell current is lower than ILRdet, the data output terminal Dout is "1" according to the output of the sense amplifier 204. As a result, the external device recognizes the low resistance state as the abnormal half LR state. The processing then advances in the "No" direction from the process 411, and the following low resistance stabilization writing flow. (processes 421 to 414) is executed.

(3) The positive pulse voltage Vp equal to or lower than the high resistance writing threshold voltage Vtl is set to 0.7 V in order to perform low resistance stabilization writing, in the process 421.

(4) The positive voltage pulse for low resistance stabilization writing is applied in the process 415. The positive pulse voltage Vp used here starts from a value (for example, 0.7 V in FIG. 7) sufficiently lower than the high resistance writing threshold voltage Vtl.

(5) Next, in order to determine again whether or not the resistance state changes to the low resistance state, the sense amplifier 204 performs verification reading to determine whether or not the cell current is equal to or higher than the detection level on the basis of the logic value result of verification reading, in a determination process 413. The setting in the sense amplifier 204 is the same as in the determination process 411.

When the cell current is equal to or higher than the detection current ILRdet (process 413: "Yes"), low resistance writing of the selected memory cell is completed, and the processing advances to the determination process 424.

(6) When the cell current is lower than the detection current ILRdet (process 413: "No"), the positive pulse voltage Vp is increased by 0.1 V in the process 414, and the processing returns to the process 415 of the above (4).

After the low resistance stabilization writing of the process 415 ends, the verification reading and the resistance state determination of the determination process 413 are performed as in the above (5).

In this manner, the pulse voltage increase of the process 414 and the low resistance stabilization writing of the process 415 are repeated until the cell current becomes equal to or higher than the detection current ILRdet in the verification reading determination of the determination process 413.

Thus, according to the low resistance stabilization writing method accompanied by the verification reading determination 413, the half LR state can be corrected to the normal low resistance state as close as possible.

Figure 22:
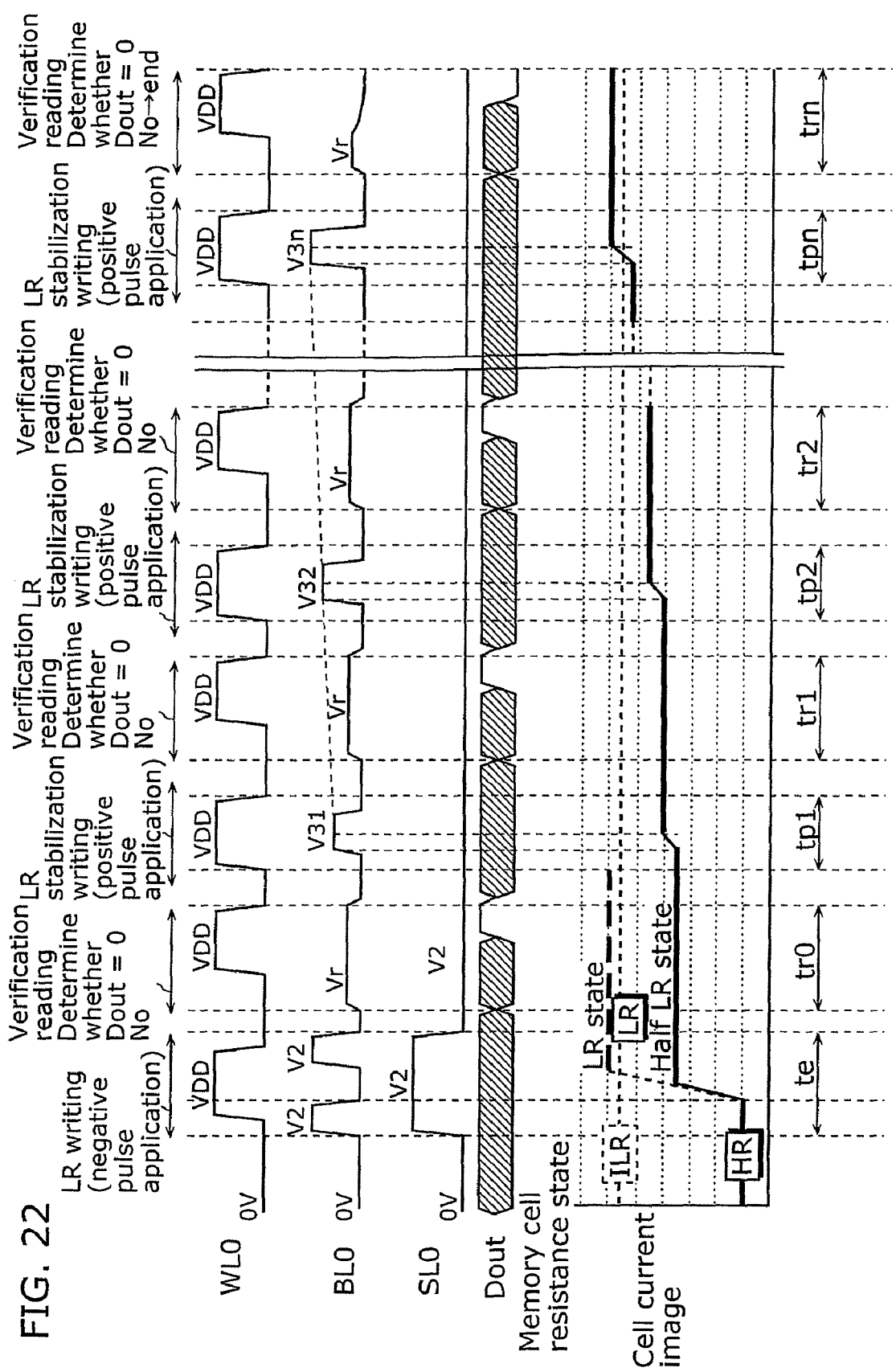
FIG. 22 is a sequence diagram of low resistance stabilization writing and a selected memory cell state image diagram in the embodiment of the present invention.

FIG. 22 is a memory cell access sequence diagram (top) and an image diagram (bottom) of the resistance state of the selected memory cell based on the cell current, in the case where the processing of the flowchart shown in FIG. 21 is performed in the nonvolatile memory device 200. The selected memory cell in this sequence diagram is the memory cell M11 shown in FIG. 10.

In FIG. 22, since the memory cell M11 is in an unselected state before the processing of the flowchart shown in FIG. 21, the initial voltage states of the word line WL0, the bit line BL0, and the source line SL0 are all 0 V.

First, low resistance writing (negative voltage pulse application) of the process 410 is performed in period "te" shown in FIG. 22. This operation in the timing chart is the same as that in FIG. 18A, and so its detailed description is omitted.

Next, in order to determine whether or not the resistance state is the half LR state, verification reading is performed in period "tr0". Since the verification reading operation is the same as in FIG. 18B, its detailed description is omitted. When the detection result of the sense amplifier 204 in verification reading shows the normal low resistance state, the data output terminal Dout is "0", and accordingly the external device ends the low resistance writing at this point. When the detection result of the sense amplifier 204 shows the half LR state, the data output terminal Dout is "1", and accordingly the external device executes the low resistance stabilization writing of the process 415 from "tp1" onward.

In the case of executing the low resistance stabilization writing of the process 415 in period "tp1", as a preliminary preparation, the output of the LR stabilization writing power source 214 is set to V31G in the process 421 so that the first-time pulse voltage V31 (=V31G−Vt) is generated by the writing circuit 206. Here, in the LR stabilization writing power source 214, only an arbitrary one of the switches 231a to 231n is turned ON (for example, the switch 231f is ON and the other switches are OFF) in the voltage selection switch group 231 according to an instruction from the applied voltage controller 229, and the potential V31G of an intermediate node of the series-connected fixed resistors 232 is supplied to V3G. For example, the potential of the node nLf is supplied when the switch 231f is ON.

After this, in the low resistance stabilization writing of the process 415 in period "tp1", the voltage VDD sufficient to turn ON the transistor N11 is applied to the word line WL0. Next, having received the pulse signal PLS from the control circuit 210, the writing circuit 206 changes the voltage of the selected bit line BL0 as 0 V→V31→0 V according to the pulse time of the pulse signal, so that the resistance state of the selected memory cell M11 changes to a lower resistance (LR) state. Subsequently, in order to end the low resistance stabilization writing, the word line WL0 is returned to 0 V to turn OFF the transistor N11.

Next, in order to determine whether or not the resistance state is still unable to reach the normal low resistance state, verification reading is performed again in period "tr1". When the detection result of the sense amplifier 204 in verification reading shows the normal low resistance state, the data output terminal Dout is "0", and accordingly the external device ends the low resistance writing at this point. When the detection result of the sense amplifier 204 shows the half LR state, the data output terminal Dout is "1", and accordingly the external device executes the low resistance stabilization writing of the process 415 in period "tp2".

In the case of executing the low resistance stabilization writing of the process 415 in period "tp2", as a preliminary preparation, the output of the LR stabilization writing power source 214 is set to V32G in the process 421 so that the second-time pulse voltage V32 (=V32G−Vt) is generated by the writing circuit 206. After this, the low resistance stabilization writing of the process 415 is executed.

Next, in order to determine whether or not the resistance state is still unable to reach the normal low resistance state, verification reading is performed again in period "tr2". When the detection result of the sense amplifier 204 in verification reading shows the normal low resistance state, the data output terminal Dout is "0", and accordingly the external device ends the low resistance writing at this point. When the detection result of the sense amplifier 204 shows the half LR state, the data output terminal Dout is "1", and accordingly the external device executes the low resistance stabilization writing of the process 415 in period "tp3".

In this way, the low resistance stabilization writing by the stepwise increasing positive pulse voltage and the verification reading determination by the sense amplifier 204 are repeated until the sense amplifier 204 determines that the low resistance state in which the cell current is equal to or higher than the detection current ILRdet is reached.

As another method for reliably changing the variable resistance element to the low resistance state, a method of repeating low resistance writing in the case where the variable resistance element is unintentionally changed to the high resistance state as a result of low resistance stabilization writing is described next.

As shown by the second and third measurement results of FIGS. 7(b) and (c), there is the case where the pulse V-I characteristics of the characteristic type 2 frequently occur. However, the cell current does not necessarily follow the same path each time, and has some variations. For instance, regarding the maximum cell current near Vtl in FIG. 7, the maximum cell current is 70 µA in FIGS. 7(b), and 60 µA in FIG. 7(c). Thus, the maximum cell current is higher in the second measurement of FIG. 7(b).

In such characteristics, when the flowchart of FIG. 21 is executed in the case where the cell current detection level in low resistance writing verification reading is set to be equal to or higher than the maximum current of the low resistance state near Vtl in FIG. 7(c), such as 62 µA, the change to the high resistance state occurs while the loop of the processes 413 to 415 is being repeated. This makes it impossible to exit from the loop of the processes 413 to 415. The present inventors have conceived that this can be effectively avoided by providing a second detection level for determining whether or not the resistance state is the high resistance state.

Figure 23:
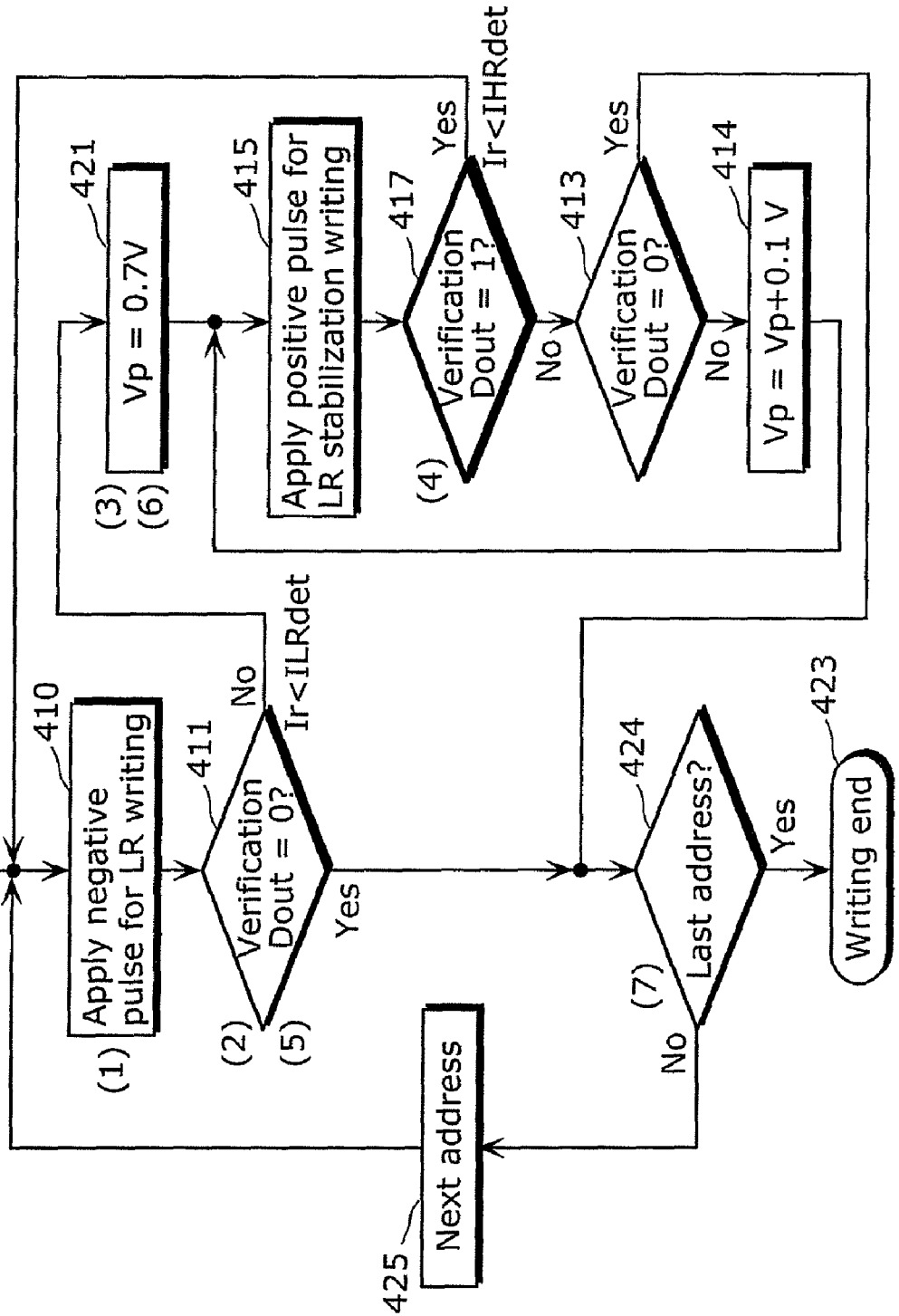
FIG. 23 is a flowchart of low resistance stabilization writing in the embodiment of the present invention.

FIG. 23 is an example of a flowchart of low resistance rewriting to which the second detection level for determining the high resistance state is added. In this flowchart, a determination process 417 is inserted between the process 415 and the determination process 413 in FIG. 21. In the determination process 417, the sense amplifier 204 determines whether or not the selected memory cell changes to the high resistance state equal to or lower than the cell current detection level IHRdet (that is, whether or not "(cell current Ir)<(cell current detection level IHRdet)" holds). When the selected memory cell is not in the high resistance state (the output terminal Dout is "1" in the high resistance state) (process 417: "No"), the processing advances to the determination process 413 in which the sense amplifier 204 determines whether or not the selected memory cell is in the low resistance state. On the other hand, when the selected memory cell is in the high resistance state (process 417: "Yes"), the processing returns to low resistance writing by negative pulse application in the process 410. The other processing blocks and flows are the same as those in FIG. 21, and so their description is omitted.

The operation of this flowchart is described below, using the memory cell characteristics shown in FIG. 7 as an example. It is supposed here that the first cell current detection level IHRdet for determining the low resistance state is 62 µA, and the second cell current detection level IHRdet for determining the high resistance state is 20 µA. It is also supposed that the characteristics shown in FIG. 7(c) are the result of the nth low resistance rewriting, and the characteristics shown in FIG. 7(b) are the result of the (n+1)th low resistance rewriting.

In FIG. 23, the following processing is performed on the selected memory cell.

(0) The selected memory cell is set as the start address.

(1) Next, the selected memory cell is changed to the low resistance state in the process 410.

(2) Next, the sense amplifier 204 determines the low resistance state on the basis of whether or not the cell current is equal to or higher than the specified current ILRdet in the determination process 411. Here, to set the specified current to ILRdet in the sense amplifier 204, the control circuit 210 sets the signals fed to the gates in the reference circuit 252 as C1=VDD, C2=0 V, and C3=0 V.

When the current of the selected memory cell is equal to or higher than the specified current ILRdet, the output SAO is 0 V, and as a result the data output terminal Dout shown in FIG. 10 is "0" (process 411: "Yes"). When the current of the selected memory cell is lower than the specified current ILRdet, the output SAO is the voltage VDD, and as a result the data output terminal Dout is "1" (process 411: "No").

The low resistance state is determined with the above setting in the sense amplifier 204. Since the memory cell is in the half LR state of the characteristics shown in FIG. 7(c), the cell current is about 37 µA, which is lower than the first cell current detection level ILRdet. Accordingly, the data output terminal Dout shows "1" as the sense amplifier determination result. The processing then advances to the process 421 by the external device.

(3) The positive pulse voltage Vp is set to the initial value of 0.7 V in the process 421. Following this, low resistance stabilization writing is performed in the process 415.

(4) Whether or not the selected memory cell changes to the high resistance state equal to or lower than the second cell current detection level IHRdet is determined in the determination process 417. Here, to set the specified current to IHRdet in the sense amplifier 204, the control circuit 210 sets the signals fed to the gates in the reference circuit 252 as C1=0 V, C2=0 V, and C3=VDD. When the current of the selected memory cell is equal to or higher than the specified current IHRdet, the output SAO is 0 V, and as a result the data output terminal Dout shown in FIG. 10 is "0" (process 411: "No"). When the current of the selected memory cell is lower than the specified current IHRdet, the output SAO is the voltage VDD, and as a result the data output terminal Dout is "1" (process 411: "Yes").

When the selected memory cell is not in the high resistance state, that is, when the current of the selected memory cell is equal to or higher than the specified current IHRdet, the output SAO is 0 V, and as a result the data output terminal Dout is "0" (process 417: "No"). The processing then advances to the determination process 413 by the external device. The loop of the processes 415 to 414 is repeated until the cell current is determined to be higher than the first cell current detection level ILRdet (low resistance state) in the determination process 413 (process 413: "Yes") or the cell current is determined to be lower than the second cell current detection level IHRdet (high resistance state) in the determination process 417 (process 417: "Yes"). During this time, the low resistance stabilization writing of the process 415 is performed while gradually increasing the positive pulse voltage for low resistance stabilization writing. The maximum cell current of the low resistance state in the characteristics shown in FIG. 7(c) is 60 µA, which is lower than the first cell current detection level ILRdet=62 µA. Accordingly, the verification condition in the determination process 413 is not met, and so the processing does not advance in the "Yes" direction. The positive pulse voltage Vp is then incremented and the loop of the processes 415 to 414 is repeated. As a result, the positive pulse voltage Vp eventually becomes 1.6 V equal to or higher than Vtl, and the memory cell changes to the high resistance state. Hence, the verification condition in the determination process 417 is met, and the processing advances in the "Yes" direction. In this case, the memory cell is returned to the low resistance state again in the process 410, and as a result becomes the half LR state (54 µA) shown in FIG. 7(b).

(5) Next, the low resistance state is determined in the determination process 411. Since the memory cell is in the half LR state of the characteristics shown in FIG. 7(b) and the cell current is about 54 µA which is lower than the first cell current detection level ILRdet (process 411: "No"), the processing advances to the process 421.

(6) The positive pulse voltage Vp is set to the initial value of 0.7 V in the process 421, and low resistance stabilization writing is performed in the process 415. Whether or not the selected memory cell changes to the high resistance state equal to or lower than the second cell current detection level IHRdet is determined in the determination process 417. When the selected memory cell is not in the high resistance state (process 417: "No"), the processing advances to the determination process 413. The loop of the processes 415 to 414 is repeated until the cell current is determined to be higher than the first cell current detection level ILRdet (low resistance state) in the determination process 413 (process 413: "Yes") or the cell current is determined to be lower than the second cell current detection level IHRdet (high resistance state) in the determination process 417 (process 417: "Yes"). During this time, the low resistance stabilization writing of the process 415 is performed while gradually increasing the positive pulse voltage for low resistance stabilization writing. The maximum cell current of the low resistance state in the characteristics shown in FIG. 7(b) is 70 µA, which is higher than the first cell current detection level ILRdet=62 µA. Accordingly, when the low resistance stabilization writing is repeatedly performed with the pulse voltage increase, the cell current eventually becomes equal to or higher than the first cell current detection level ILRdet. Hence, the verification condition in the determination process 413 is met, and the processing advances in the "Yes" direction. Since the low resistance writing is completed, the processing advances to the determination process 424.

(7) Whether or not the selected memory cell is the last address is determined in the determination process 424. When the selected memory cell is not the last address, the processing advances in the "No" direction. The address is incremented to the next address in the process 425 to select the next memory cell, and the processing of the above (1) to (6) is repeated.

Thus, when the high resistance state occurs due to variations in memory cell change and the like while low resistance stabilization writing is being performed, the resistance state can be reliably set to the low resistance state by executing the flow of low resistance writing again.

Note that, when executing the processing of the flowchart of FIG. 21 or 23 in the nonvolatile memory device 200 shown in FIG. 10, the determination and instruction for execution in each mode step are typically performed by the external device (not shown) outside the nonvolatile memory device 200. That is, in the case of writing, upon receiving a control signal and address signals from the external device, the nonvolatile memory device 200 sets the write voltage by the writing power source 211, so that the writing circuit 206 and the row driver 207 execute the writing operations of FIG. 15(a) to (c). In the case of verification reading, according to a control signal and address signals from the external device, the reading operation including the selection of the memory cell and the current detection level setting of the sense amplifier is executed, and the read data showing whether or not the cell current is equal to or higher than the detection level is provided to the terminal Dout. The external device receives the data from the terminal Dout, and performs branch determination (for example, in the branch (determination process 413) of the flowchart, the "Yes" direction when the data of the terminal Dout is "0", and the "No" direction when the data of the terminal Dout is "1") to next operation determination and instruction for execution.

Figure 24:
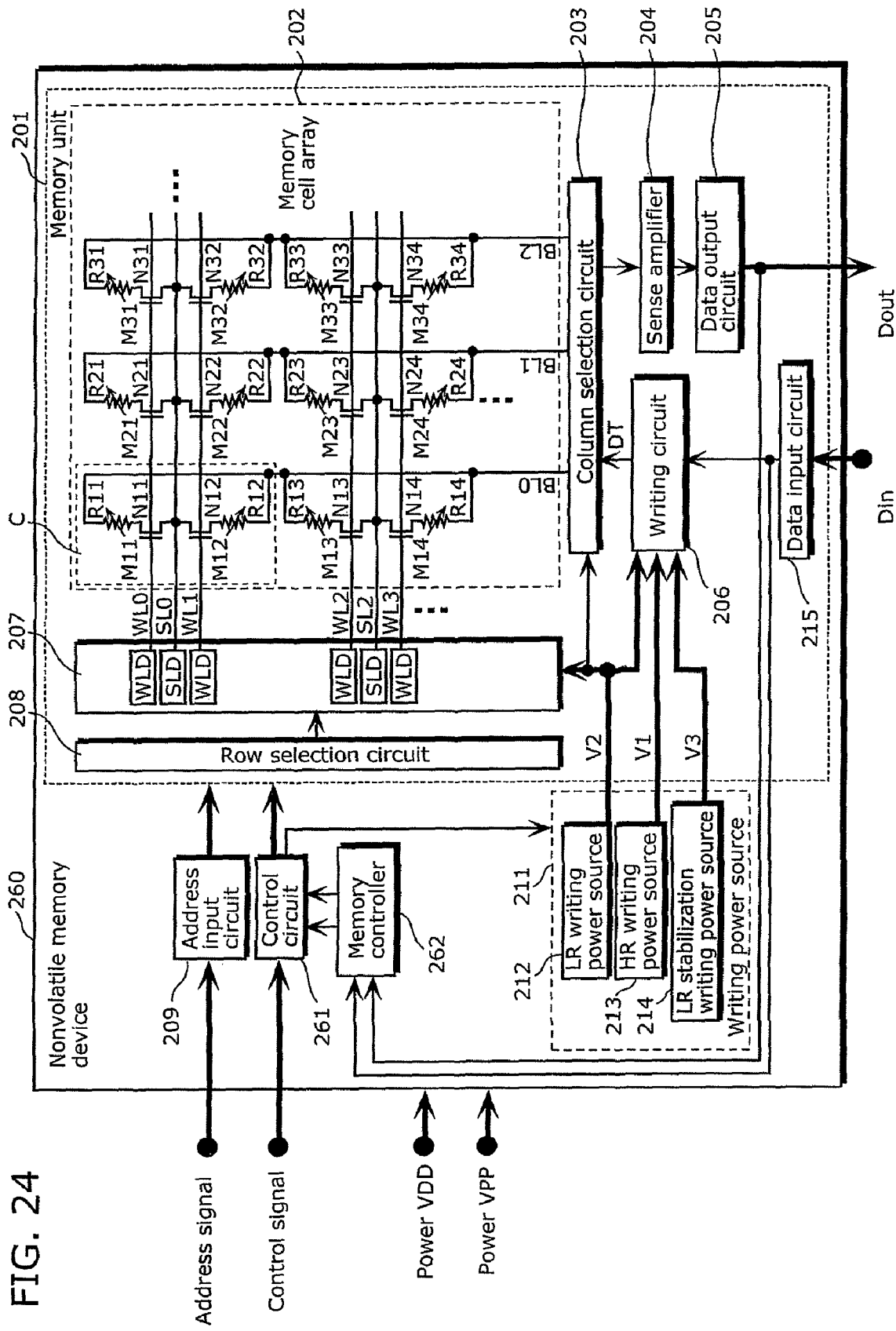
FIG. 24 is a diagram showing another structure of the nonvolatile memory device in the embodiment of the present invention.

However, the nonvolatile memory device according to the present invention is not limited to such a device that performs the whole writing process under control of the external device, and may be realized as a nonvolatile memory device including such control functions of the external device. In detail, in another nonvolatile memory device 260 shown in FIG. 24, the output of the data input circuit 215 holding write data and the output of the data output circuit 205 holding sense amplifier read data are fed to a control circuit 261 through a memory controller 262. The memory controller 262 executes the operation determination, instruction for execution, and the like instead of the external device, and the control circuit 261 performs control under the memory controller 262. This makes it possible to execute the whole writing shown in each flowchart from start to end (i.e., all processing including low resistance stabilization writing, verification reading, and determination), in the nonvolatile memory device 260. In such a case, since writing is executed from start to end in the nonvolatile memory device, an advantageous effect of a shorter writing completion time than in the case of involving the external device can be produced.

Embodiment 5

The following describes a variable resistance element writing method and a nonvolatile memory device in Embodiment 5 of the present invention that can simplify the setting of the voltage for low resistance stabilization writing.

In the low resistance stabilization writing with verification reading in Embodiment 4 described above, since the optimum high resistance writing threshold voltage Vtl of the positive pulse Vp for changing the half LR state to the normal low resistance state is unknown, the positive pulse Vp is set to sweep from a value sufficiently lower than the high resistance writing threshold voltage Vtl. This increases the number of times the processing is repeated in the flowchart of FIG. 21 or 23, causing a problem of a longer time taken for setting the low resistance state. Besides, due to the sharpness of the resistance change near Vtl (the peak current near Vtl has a voltage range of about 0.4 V), there is a problem of difficulty in controlling by the method using verification as described in Embodiment 4.

To solve these problems, the present inventors have examined a method for knowing the optimum voltage value Vtl of the positive pulse for low resistance stabilization writing beforehand.

The present inventors have focused on the characteristics of the variable resistance element alone having two terminals as shown in FIG. 1, in order to solve the problems.

FIGS. 25(a) and (b) is a pulse V-I characteristic graph of the variable resistance element alone. FIG. 25(a) shows the variable resistance element characteristics of the characteristic type 2, whereas FIG. 25(b) shows the variable resistance element characteristics of the characteristic type 1. A threshold voltage Vtrl of changing from the low resistance state to the high resistance state is about 2.0 V in both of the characteristics shown in FIG. 25(a) and (b). The variable resistance element changes to the high resistance state when a larger voltage pulse than Vtrl is applied. In the characteristic type 2 shown in FIG. 25(a), the resistance state of the variable resistance element becomes lowest at the voltage Vtrl.

As a result of obtaining such characteristic graphs of a large number of samples, the present inventors have found that the high resistance writing threshold voltage Vtrl of changing from the low resistance state to the high resistance state is approximately equal in magnitude to the negative pulse voltage (−Vprl) for low resistance writing. That is, the relation of expression 1 holds.

$$|Vtrl|=|-Vprl| \qquad \text{(Expression 1)}$$

Accordingly, the magnitude of the voltage Vtrl can be determined from the magnitude of the negative pulse voltage applied in the preceding low resistance writing. In the case of the variable resistance element alone, $Vtrl=|-Vprl|$.

Figure 26:
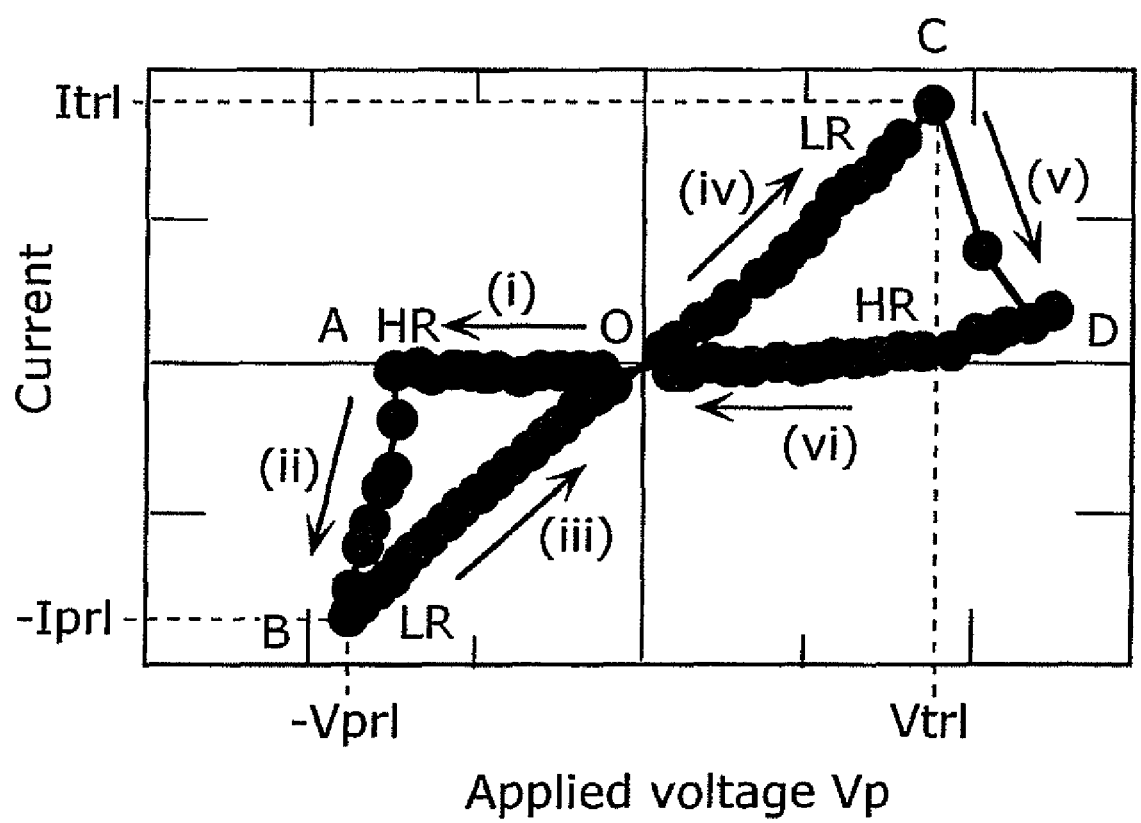
FIG. 26 is a voltage-current characteristic diagram in rewriting of the variable resistance element alone in the embodiment of the present invention.

FIG. 26 is a V-I characteristic graph showing the relation between the pulse voltage Vp and the pulse current I in resistance change writing, when the pulse voltage Vp is applied to the variable resistance element alone with respect to the lower electrode. First, a voltage pulse of |Vp| in magnitude is applied to the lower electrode with respect to the upper electrode in the variable resistance element which is in the high resistance (HR) state (point O) (the applied voltage is −Vp because the characteristic graph is shown with respect to the lower electrode). When the applied voltage is increased in magnitude to the negative side as shown by (i) in FIG. 26, the resistance change of low resistance (LR) writing occurs once the applied voltage exceeds a magnitude of some voltage (point A), exhibiting characteristics of (ii) in FIG. 26. At this time, the pulse voltage magnitude |−Vprl| (−Vprl in the characteristic graph) is set as a maximum applied voltage, and the low resistance writing is stopped at point B. Next, when the pulse voltage is decreased in magnitude, the low resistance state is unchanged and point O is reached, exhibiting ohmic characteristics ((iii) in FIG. 26). Furthermore, a voltage pulse of |Vp| in magnitude is applied to the upper electrode with respect to the lower electrode (the applied voltage is +Vp because the characteristic graph is shown with respect to the lower electrode). When the applied voltage is increased in magnitude to the positive side as shown by (iv) in FIG. 26, the resistance change of high resistance (HR) writing occurs once the applied voltage exceeds Vtrl (point C), and point D is reached, exhibiting characteristics of (v) in FIG. 26. After this, even when the pulse voltage is decreased in magnitude to point A, the high resistance state is unchanged, exhibiting characteristics of (vi) in FIG. 26.

Thus, in the case where the V-I characteristics during rewriting are obtained while changing the applied pulse voltage, the hysteresis characteristics shown by (i) to (vi) are exhibited according to the resistance change.

Here, −Iprl denotes a current flowing through the variable resistance element when the maximum voltage |"Vprl| of low resistance writing is applied, and Itrl denotes a current flowing through the variable resistance element when the high resistance writing start voltage Vtrl (high resistance writing threshold voltage) of starting the resistance change from the low resistance state to the high resistance state is applied.

As noted above, the variable resistance element has the feature that |−Vprl| which is the magnitude of the minimum voltage in low resistance change and |Vtrl| which is the magnitude of the high resistance writing start voltage are approximately equal to each other. The present inventors have further found that the variable resistance element also has the feature that |−Iprl| which is the magnitude of the current when the low resistance change maximum voltage |−Vprl| is applied and |Itrl| which is the magnitude of the current when the high resistance writing start voltage Vtrl is applied are equal to each other. That is, the relation of expression 2 holds.

$$|Itrl|=|-Iprl| \quad \text{(Expression 2)}$$

In other words, the variable resistance element has the feature that the magnitude of the high resistance writing start voltage of starting the resistance change from the low resistance state to the high resistance state and the magnitude of the corresponding current are equal to the magnitude of the pulse voltage applied in low resistance writing and the magnitude of the corresponding current. As mentioned earlier, the high resistance writing start voltage Vtrl is a positive voltage applied for low resistance (LR) stabilization writing of changing the variable resistance element which has become the half LR state as a result of negative voltage application, to the low resistance state. Therefore, by applying, to the variable resistance element, such a positive voltage that causes a flow of a current having the same value as and the opposite direction to the current flowing through the variable resistance element in low resistance writing (including half LR state), it is possible to reliably change the variable resistance element from the half LR state to the normal low resistance state.

In the 1T1R memory cell 105 using the variable resistance element 10a shown in FIG. 2, the variable resistance element 10a has the features of relational expressions 1 and 2. Hence, the optimum voltage Vtl (i.e., high resistance writing threshold voltage) of the positive pulse when performing low resistance stabilization writing in the memory cell 105 in FIG. 3 can be determined from operating point analysis of the variable resistance element 10a and the transistor 104 during writing.

Figure 27:
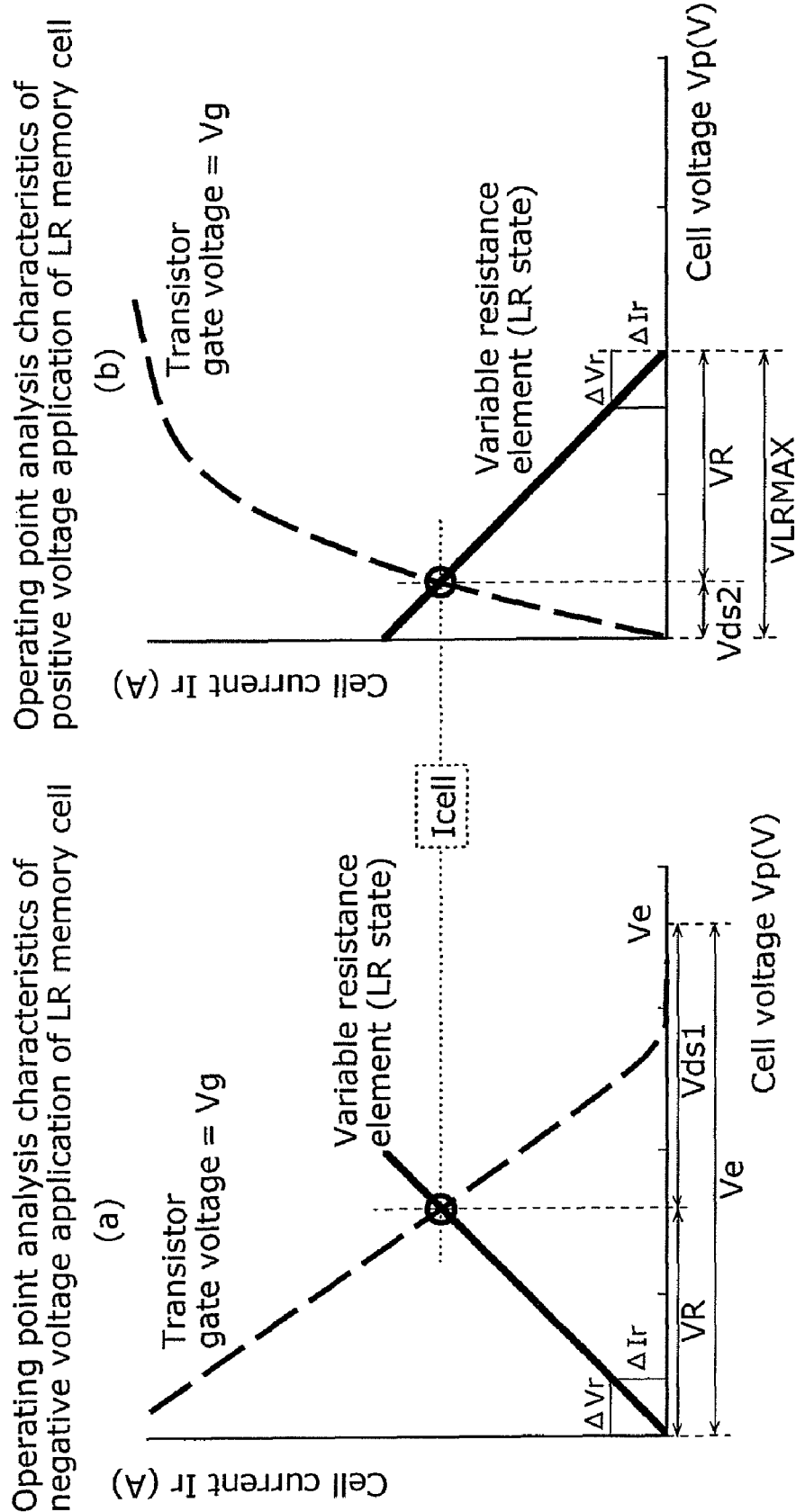
FIGS. 27(a) and (b) is a graph explaining a pulse voltage setting method of the memory cell in the embodiment of the present invention.
Figure 28:
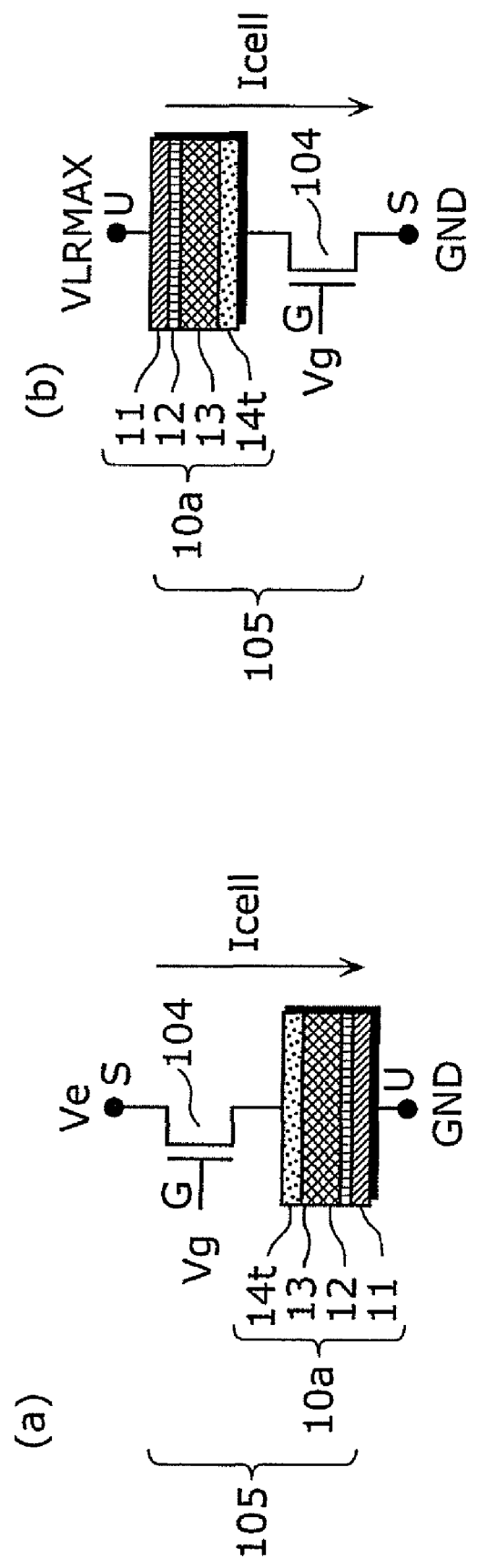
FIGS. 28(a) and (b) is a diagram explaining voltage application to the memory cell in the embodiment of the present invention.

FIGS. 27(a) and (b) is an operating point analysis graph of the variable resistance element 10a and the transistor 104 during writing. The horizontal axis represents the voltage between the terminals U and S of the memory cell 105 shown in FIG. 2 (the voltage applied to the terminal S with respect to the terminal U), and the vertical axis represents the current flowing between the terminals U and S (the current flowing from the terminal S to the terminal U). FIG. 27(a) is an operating point analysis characteristic diagram when a voltage Vg is applied to the gate terminal G, a ground GND is applied to the terminal U, and a voltage Ve is applied to the terminal S in the memory cell 105 as shown in FIG. 28(a). That is, FIG. 27(a) is an operating point analysis characteristic diagram when a negative voltage is applied to the variable resistance element to perform low resistance writing. Note that the diagram in FIG. 28(a) is in a vertically flipped state with respect to FIG. 28(b) so that the voltage Ve is located on the top side. In FIG. 27(a), the solid line indicates voltage-current characteristics of the variable resistance element 10a at the time of resistance change. The variable resistance element 10a has characteristics that the resistance value changes in such a manner that VR is always constant, when a voltage that causes the voltage between the two terminals of the variable resistance element 10a upon resistance change exceeds the resistance change threshold voltage. The dashed line indicates voltage-current characteristics of the transistor 104. For better understanding of operating point analysis, the transistor graph line (dashed line) is inverted in the voltage direction, with the base point being set at Ve. An intersection point of the characteristics of the variable resistance element 10a and the characteristics of the transistor 104 is a cell current Icell that flows between the terminals U and S of the memory cell 105.

FIG. 27(b) is an operating point analysis characteristic diagram when the voltage Vg is applied to the gate terminal G, the ground GND is applied to the terminal S, and a voltage VLRMAX (the above-mentioned high resistance writing threshold voltage Vtl, i.e., the voltage at which the resistance of the variable resistance element in the half LR state is lowest) is applied to the terminal U in the memory cell 105 in a bias application direction shown in FIG. 28(b) which is opposite in current direction to FIG. 28(a) (the diagram in FIG. 28(b) is vertically flipped with respect to FIG. 27(a)). That is, FIG. 27(b) is an operating point analysis characteristic diagram when a positive voltage is applied to the variable resistance element to perform low resistance stabilization writing (LR additional writing). The solid line indicates voltage-current characteristics of the variable resistance element 10a. The characteristic line has the same gradient as the variable resistance element in FIG. 27(a), according to relational expressions 1 and 2 defined above. The characteristic line is inverted in the voltage direction, with the base point being set at VLRMAX. The dashed line indicates voltage-current characteristics of the transistor 104. An intersection point of the characteristics of the variable resistance element 10a and the characteristics of the transistor 104 is the cell current Icell that flows between the terminals U and S of the memory cell 105.

In detail, when low resistance writing is performed by applying the pulse voltage Ve, the cell current Icell flows as shown in the operating point analysis diagram at the time of rewriting in FIG. 27(a). In the case where a bias of an opposite polarity to the preceding low resistance writing is applied to the memory cell which is in the low resistance state after the application of the pulse voltage Ve, the pulse voltage Vp is set (to VLRMAX in this example) in the memory cell so that the corresponding cell current is the same as the cell current (i.e., Icell) of the preceding low resistance writing according to relational expression 2, as shown in FIG. 28(b). In such a case, this voltage is the high resistance writing start voltage Vtl of the memory cell 105.

Thus, the optimum positive pulse voltage Vtl of low resistance stabilization writing in the memory cell 105 can be determined from the applied voltage of low resistance writing.

Figure 29:
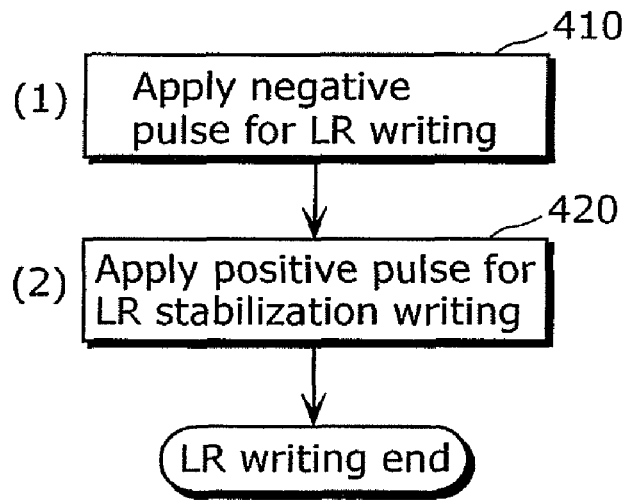
FIG. 29 is a flowchart of low resistance stabilization writing to the memory cell in the embodiment of the present invention.

Since the positive pulse voltage of low resistance stabilization writing can be determined by the above means, the flow of voltage application for low resistance writing can be simplified as shown in FIG. 29. (1) First, low resistance writing by pulse application of the negative voltage Ve is performed in the process 410. (2) Next, low resistance stabilization writing 420 by pulse application of the positive voltage Vtl determined by the above means (i.e., the method of determining the positive voltage that causes the flow of the cell current of the same value as the cell current in low resistance writing) is performed on an assumption that the memory cell has changed to the half LR state of the characteristic type 2. Since the positive voltage Vtl is set to the optimum voltage for changing to the normal low resistance state as determined by the above means, the writing is completed by performing the low resistance stabilization writing 420 only once.

Figure 30:
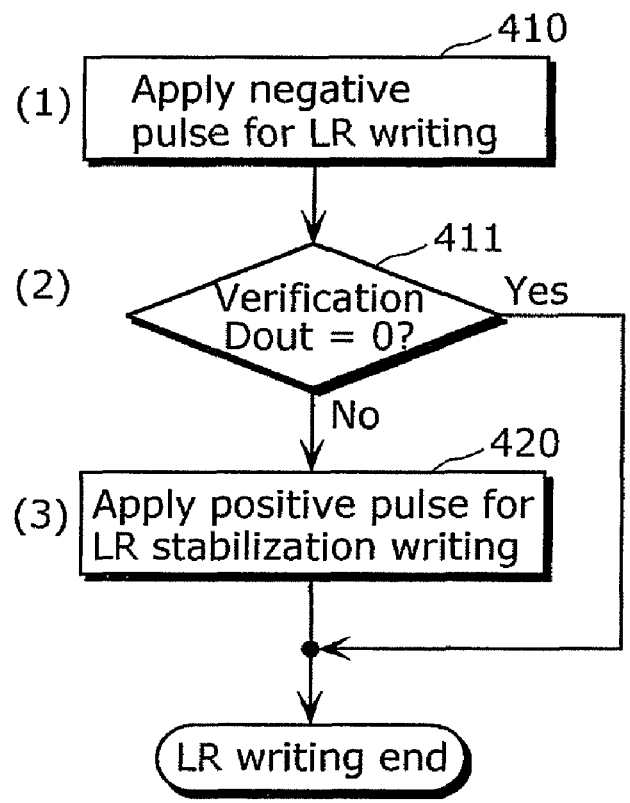
FIG. 30 is a flowchart of low resistance stabilization writing with verification in the embodiment of the present invention.

Moreover, FIG. 30 is a flowchart of low resistance writing that includes a verification process 411 of determining whether or not to perform the low resistance stabilization writing 420.

(1) First, low resistance writing by pulse application of the negative voltage Ve is performed in the process 410.

(2) Next, the sense amplifier 204 performs verification reading for determining whether or not the memory cell has changed to the low resistance state, and determines whether or not the cell current is equal to or higher than the detection level ILRdet on the basis of the logic value result of verification reading in the terminal Dout. When the cell current is equal to or higher than the detection level ILRdet, the data "0" is obtained at the output terminal Dout as the sense amplifier determination result (process 411: "Yes"). The processing advances in the "Yes" direction to complete the low resistance writing by the external device. When the cell current is lower than the detection level ILRdet, the data "1" indicating the characteristic type 2 is obtained at the output terminal Dout as the sense amplifier determination result (process 411: "No"). The processing then advances in the "No" direction by the external device.

(3) The low resistance stabilization writing process 420 by pulse application of the positive voltage Vtl determined by the above means is performed. Since the positive voltage Vtl is set to the optimum voltage for changing to the normal low resistance state as determined by the above means, the writing is completed by performing the low resistance stabilization writing 420 only once.

By performing the verification process in this manner, the additional writing (low resistance stabilization writing) can be omitted for the memory cell of the characteristic type 1. This contributes to a shorter total writing time.

Though FIG. 29 shows the method of setting the optimum positive pulse voltage for changing the memory cell to the normal low resistance state on an assumption that the memory cell has changed to the half LR state of the characteristic type 2, the same technique is also applicable to a method of setting a positive pulse voltage of high resistance writing after low resistance writing by pulse application of the negative voltage Ve is performed in the process 410. In this case, high resistance writing by pulse application of the positive voltage that is set to a voltage (for example, a voltage higher than Vtl by 0.5 V, that is, Vtl+0.5 V) slightly higher than the voltage Vtl determined by the above means may be performed.

Furthermore, the present inventors have devised a circuit that, from the low resistance writing pulse voltage of the above means, applies the low resistance stabilization writing pulse voltage to the selected memory cell so that the following positive voltage is applied to the variable resistance element in the selected memory cell. The positive voltage is such a voltage required to cause a current, which has the same value as a current flowing through the variable resistance element when a negative voltage for low resistance writing is applied to the variable resistance element, to flow in the opposite direction. Typically, when the same voltage is applied to the 1T1R memory cell in an opposite direction, a different current value flows through the memory cell due to self substrate bias effects produced in a transistor of the memory cell. Accordingly, it is difficult to cause the same current value as in low resistance writing to flow in an opposite direction.

Figure 31:
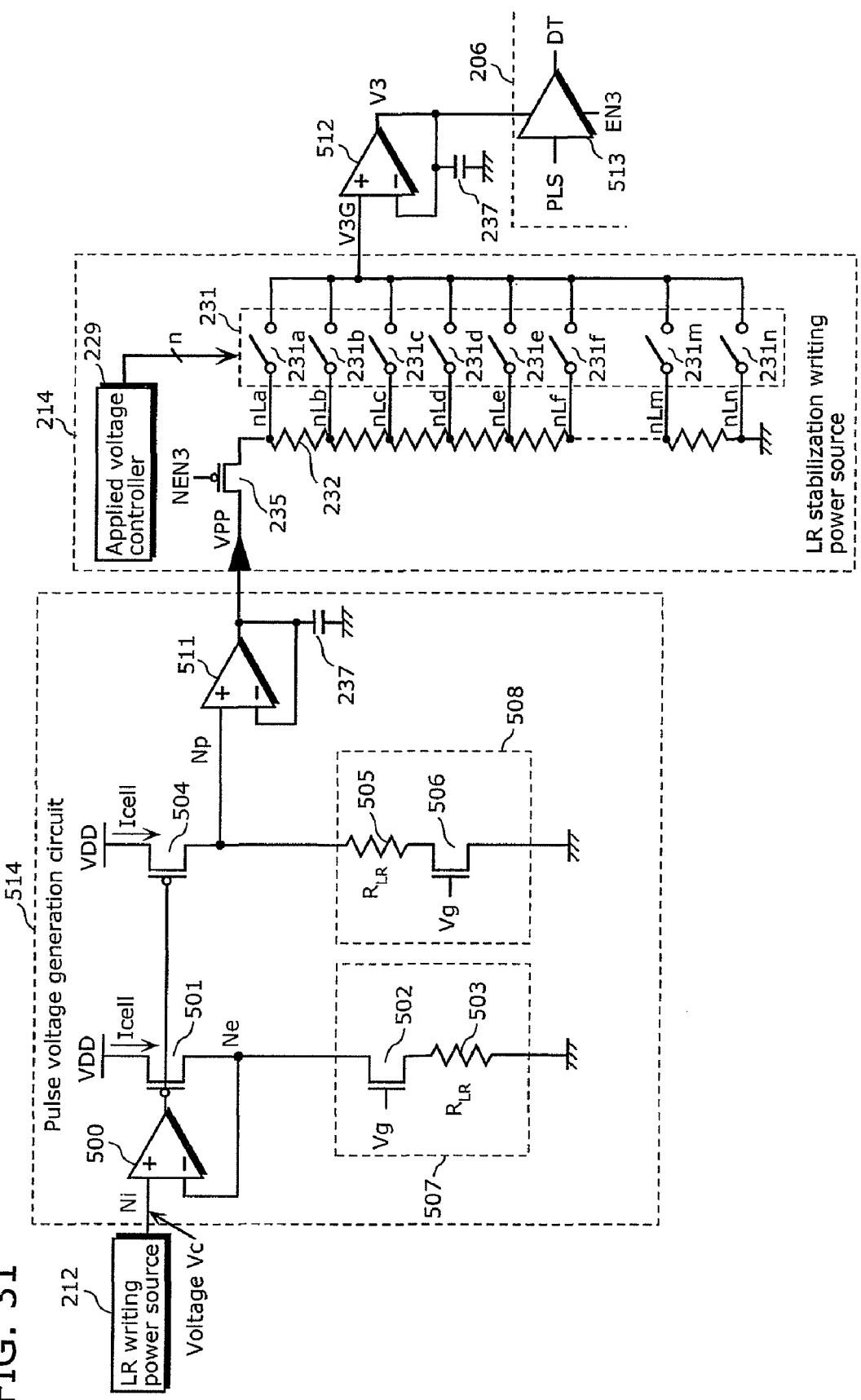
FIG. 31 is a diagram showing a structure of a pulse voltage generation circuit for low resistance stabilization writing in the embodiment of the present invention.
Figure 32:
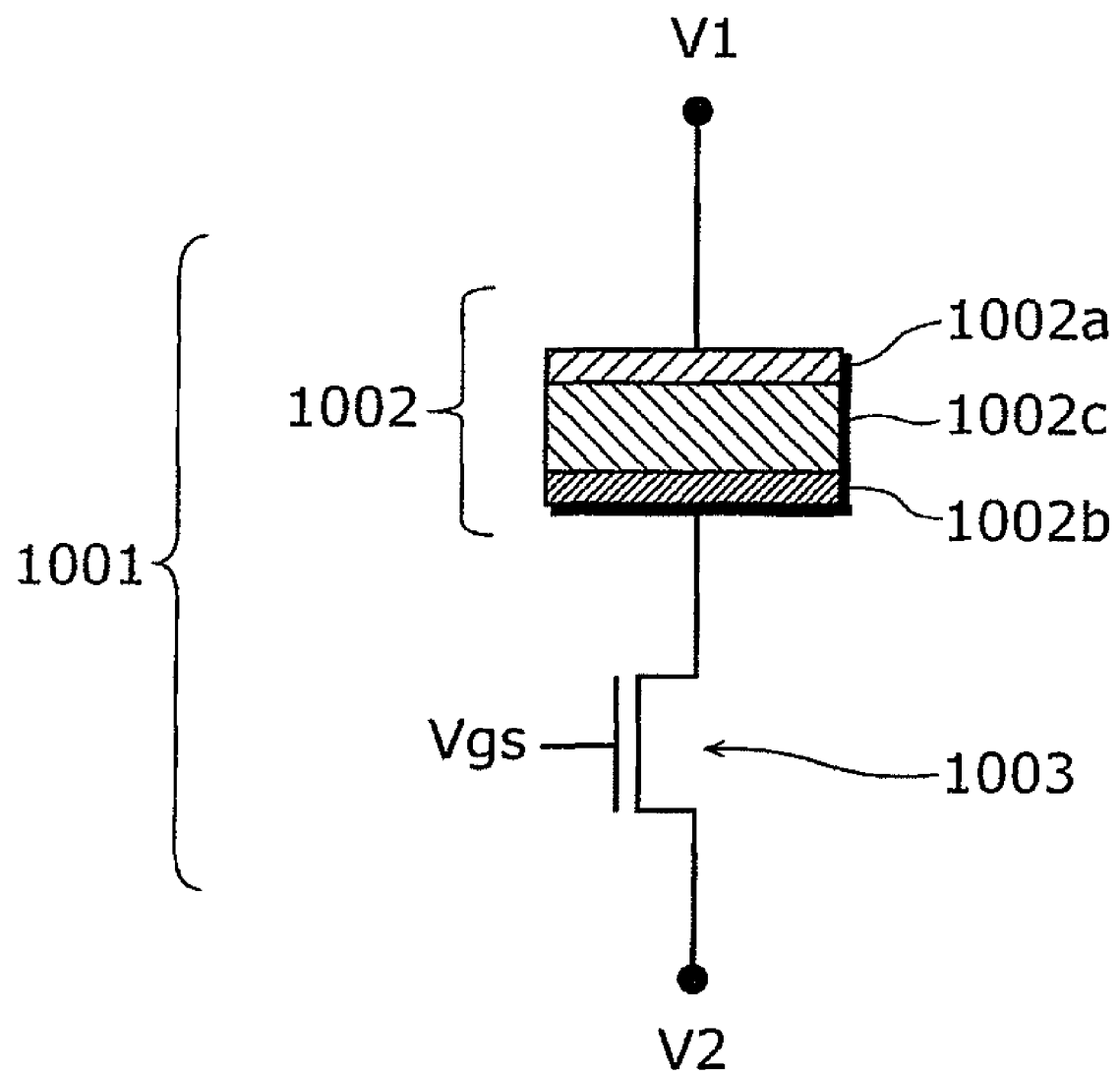
FIG. 32 is a diagram showing a structure of a memory cell described in PTL 1.
Figure 33:
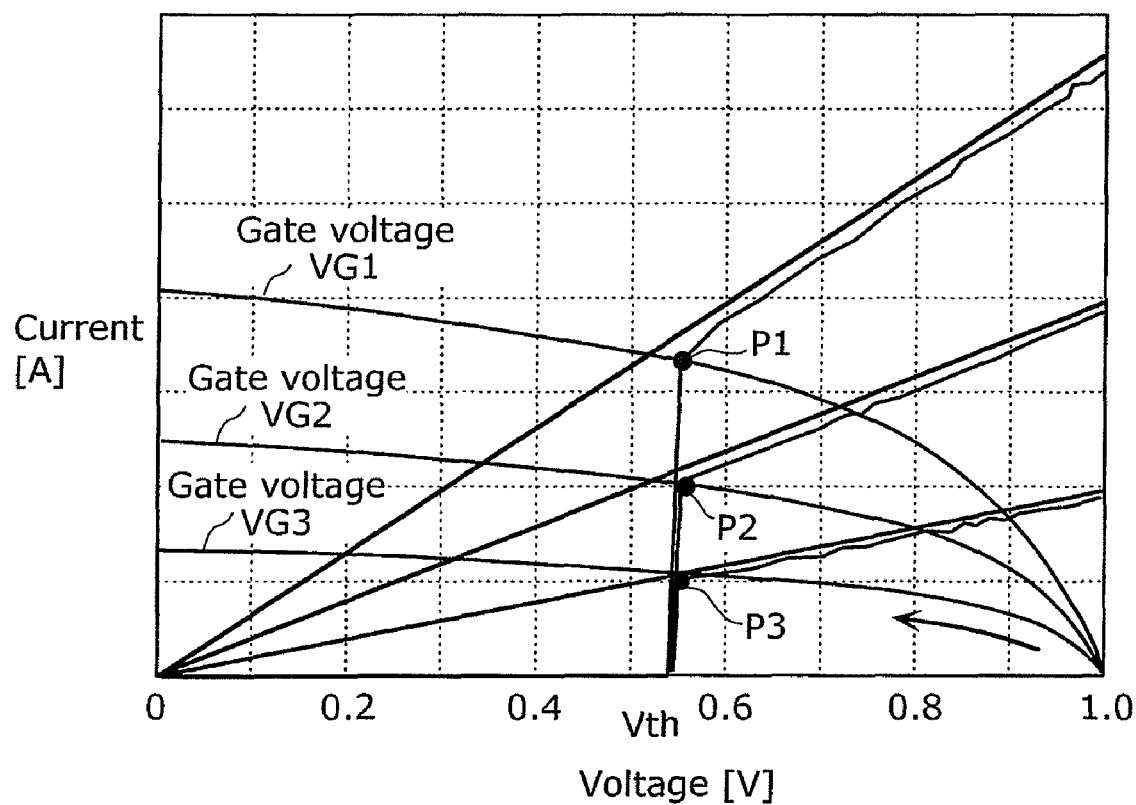
FIG. 33 is a write operating point analysis diagram of the memory cell described in PTL 1.
Figure 34:
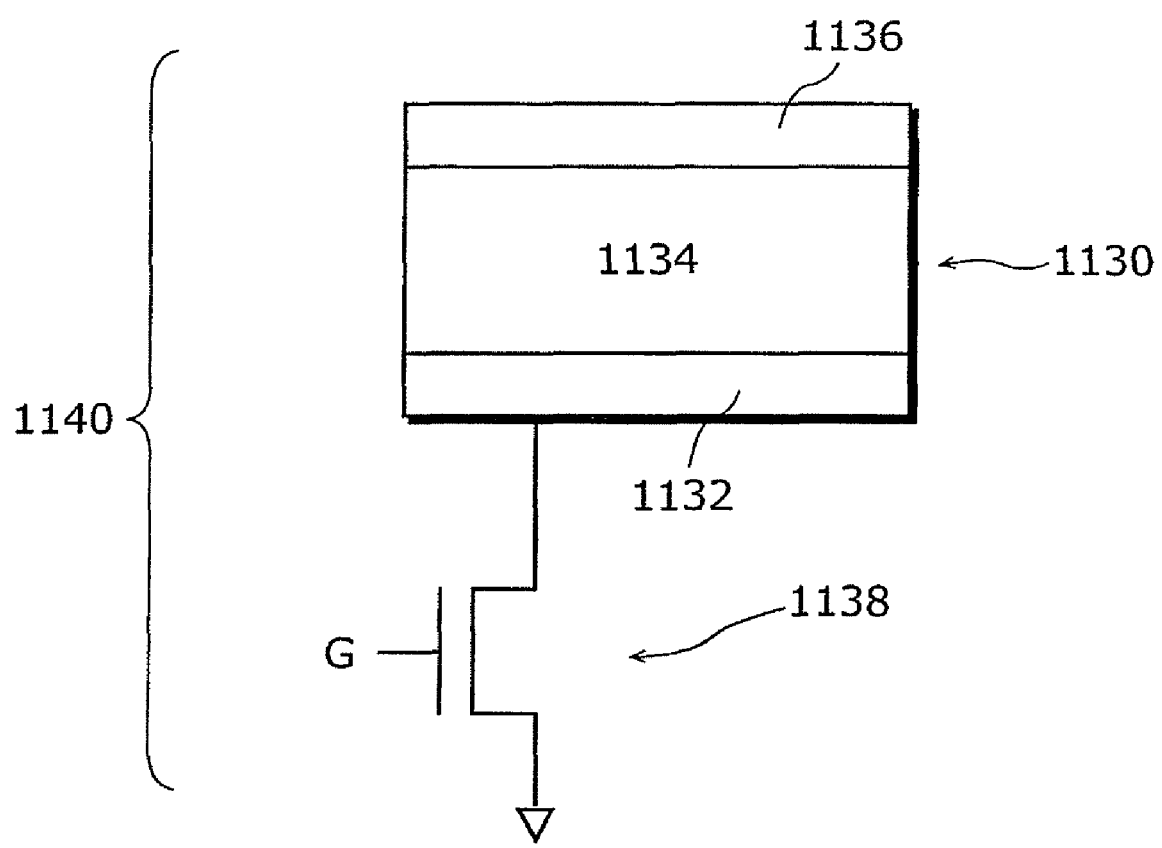
FIG. 34 is a diagram showing a structure of a memory cell described in PTL 2.

FIG. 31 shows an example of the low resistance stabilization writing unit including: a pulse voltage generation circuit 514 that uses the low resistance (LR) writing power source 212 as a power source; the low resistance (LR) stabilization writing power source 214 that receives the output voltage of the pulse voltage generation circuit 514; a buffer amplifier 512 that generates the same voltage as the output of the LR stabilization writing power source 214; and a driver 513 that uses the output of the buffer amplifier 512 as input power. The pulse voltage generation circuit 514 generates a low resistance stabilization writing pulse voltage. The low resistance stabilization writing unit is a circuit that applies, based on the power from the LR writing power source 212, a voltage to a memory cell selected by the selection unit (the row selection circuit 208, the column selection circuit 203) so that the following positive voltage is applied to a variable resistance element included in the memory cell. The positive voltage is such a voltage required to cause a current, which has the same value as a current flowing through the variable resistance element when a negative voltage for low resistance writing is applied to the variable resistance element, to flow in the opposite direction.

The low resistance stabilization writing unit includes: the pulse voltage generation circuit 514 including: pseudo memory cell circuits 507 and 508 in each of which a resistance element (a fixed resistor 503, 505) having the same resistance value as the variable resistance element in the low resistance state and a switch element (an N-channel transistor 502, 506) are connected in series with each other; a first buffer amplifier (a differential amplifier circuit 500) that receives power from the LR writing power source 212, and applies a voltage of the same value as a voltage applied to the selected memory cell for low resistance writing, to the pseudo memory cell circuit 507; a current mirror circuit (P-channel transistors 501 and 504) that generates a current of the same value as a current flowing through the pseudo memory cell circuit 507, and applies the generated current to the pseudo memory cell circuit 508; and a second buffer amplifier (a differential amplifier circuit 511) that receives a voltage across both ends of the pseudo memory cell circuit 508, and generates a voltage of the same value as the received voltage by current amplification; the LR stabilization writing power source 214 that divides the voltage generated by the second buffer amplifier (the differential amplifier circuit 511) by one voltage ratio selected from a plurality of voltage ratios, to generate an output voltage; a third buffer amplifier (the differential amplifier circuit 512) that receives the output voltage of the LR stabilization writing power source 214, and generates a voltage of the same value as the input voltage by current amplification; and the three-state driver 513 that generates a pulse having the voltage generated by the third buffer amplifier (the differential amplifier circuit 512).

Suppose one terminal of the resistance element (the fixed resistor 503, 505) and one terminal of the switch element (the N-channel transistor 502, 506) are connected to each other in each of the pseudo memory cell circuits 507 and 508. Then the first buffer amplifier (the differential amplifier circuit 500) applies the voltage to the other terminal of the switch element (the N-channel transistor 502) with respect to the other terminal of the resistance element (the fixed resistor 503) in the pseudo memory cell circuit 507. Moreover, the current mirror circuit (the P-channel transistors 501 and 504) applies the current so that the current flows from the other terminal of the resistance element (the fixed resistor 505) to the other terminal of the switch element (the N-channel transistor 506) in the pseudo memory cell circuit 508.

In FIG. 31, the transistors 501 and 504 are P-channel MOS transistors, the transistors 502 and 506 are N-channel MOS transistors of the same gate length and the same gate width as the transistor 104 in the memory cell 105, and the resistors 503 and 505 are fixed resistors including wiring formed in a diffusion layer on a semiconductor substrate or polysilicon with the same resistance value as the variable resistance element 10*a* in the normal low resistance state.

The pseudo memory cell circuit 507 is a circuit in which the N-channel transistor 502 and the fixed resistor 503 are connected in series, and has a structure where the variable resistance element 10*a* in the memory cell 105 is replaced with the fixed resistor 503. As a connection form having the same current direction as in the case where the memory cell in FIG. 28(*a*) changes from the high resistance state to the low resistance state, the end on the fixed resistor 503 side is connected to the ground and a voltage for low resistance writing is applied to the end on the N-channel transistor 502 side. The resistance state of the pseudo memory cell circuit 507 corresponds to when the variable resistance element changes to the low resistance state. In detail, when the voltage for low resistance writing is applied to the memory cell including the variable resistance element and the N-channel transistor, the variable resistance element changes from the high resistance state to the low resistance state. Suppose a current value flowing through this memory cell after changing to the low resistance state is a first current value. This being the case, when the voltage for low resistance writing is applied, with respect to a first terminal which is the other terminal of the fixed resistor 503, to a second terminal which is a diffusion layer terminal of the other terminal of the N-channel transistor 502 not connected to the fixed resistor 503 in the pseudo memory cell circuit 507, a current approximately equal to the first current value flows through the pseudo memory cell circuit 507.

On the other hand, the pseudo memory cell circuit 508 has a series connection form in which one end of a diffusion layer of the N-channel transistor 506 and one end of the fixed resistor 505 having the same resistance value as the fixed resistor 503 are connected to each other. The other end (the second terminal) of the diffusion layer of the N-channel transistor 506 is connected to the ground. The pseudo memory cell circuit 508 has the same connection structure (reverse connection in which the pseudo memory cell circuit 507 is vertically flipped) as in FIG. 28(*b*), with the variable resistance element 10*a* in the memory cell 105 being replaced with the fixed resistor 505.

The differential amplifier circuit 500 is a differential circuit (operational amplifier) for holding a node Ne at the low resistance (LR) writing voltage Ve, by adjusting the current value Icell of the P-channel transistor 501. The differential amplifier circuit 500 has a + terminal (non-inverting input terminal) to which an output node Ni of the LR writing power source 212 is connected (the LR writing voltage Ve is received), and a − terminal (inverting input terminal) to which the node Ne is feedback-connected.

A gate of the P-channel transistor 504 in the current mirror circuit is connected to the output of the differential amplifier circuit 500, as with a gate of the P-channel transistor 501. Accordingly, a source-to-drain current of the P-channel transistor 504 is the same current Icell as a source-to-drain current of the P-channel transistor 501. That is, the LR writing voltage Ve is applied to the node Ne, and the current Icell flows through the pseudo memory cell circuit 507. The same current Icell also flows through the pseudo memory cell circuit 508, as a result of which a voltage Vo is generated at a node Np. In this structure, the voltage Ve is applied to the pseudo memory cell circuit 507 similar to that in FIG. 28(*a*), and a voltage when the same current value as the current Icell flowing through the pseudo memory cell circuit 507 at this time flows through the pseudo memory cell circuit 508 similar to that in FIG. 28(*b*) is obtained at the node Np as the voltage Vo. Such a circuit structure represents the characteristic relations shown in FIG. 27, where the output voltage Vo is VLRMAX. This makes it possible to obtain a positive voltage required to cause, in the variable resistance element included in the memory cell, a flow of such a current that has the same value as and the opposite direction to a current flowing through the variable resistance element when a negative voltage for low resistance writing is applied to the variable resistance element.

The current capability is too small to use the voltage Vo generated at the node Np directly as the output of the writing circuit 206 (the voltage of the output terminal DT). Besides, though the voltage Vo is Vtl (pulse voltage corresponding to the maximum current) in FIG. 7, an additional circuit is provided also on an assumption that the procedure shown in the flowchart in FIG. 21 is performed starting from a voltage slightly lower than Vtl.

In more detail, to execute the processing shown in the flowchart in FIG. 21, the LR stabilization writing power source 214 is provided. Input power Vpp of the LR stabilization writing power source 214 is set to a voltage of the same potential obtained as a result of current amplification of the voltage Vo by the differential amplifier circuit 511. A capacitor 237 is a smoothing capacitor for stabilizing the output voltage of the differential amplifier circuit 511. A voltage equal to or lower than the voltage Vo is selectively generated by the LR stabilization writing power source 214 through the voltage selection switch group 231, and the output voltage is current-amplified by the differential amplifier circuit 512 and supplied to the three-state driver 513 for pulse generation.

According to this structure, the voltage Vo immediately before the change to the high resistance state can be generated by the pulse voltage generation circuit 514. In addition, a voltage pulse converted to a voltage equal to or lower than Vo can be supplied. This voltage Vo is a positive voltage applied to the variable resistance element so that the variable resistance element in the half LR state is reliably changed to the low resistance state (i.e., low resistance writing is performed). Note that a writing circuit structure in which the output V3G of the LR stabilization writing power source 214 is fed to the low resistance stabilization writing circuit 236 shown in FIG. 11 is also applicable.

Moreover, in the current mirror structure in which the gate terminal of the P-channel transistor 501 and the gate terminal of the P-channel transistor 504 are connected, the P-channel transistor 504 may be provided with a larger current capability than the P-channel transistor 501 so that the voltage Vo generated at the node Np is higher than the LR stabilization voltage Ve. In this case, it is also possible to generate a pulse voltage for high resistance writing of changing the variable resistance element from the low resistance state to the high resistance state, by using the voltage generated at the node Np as a reference voltage.

The above describes the case where the pseudo memory cell in which one end of the resistance element and one end of the diffusion layer of the N-channel transistor are connected has a structure where the first terminal is connected to the other end of the resistance element and the second terminal is connected to the other end of the diffusion layer of the N-channel transistor. Alternatively, the second terminal may be connected to the other end of the resistance element and the first terminal connected to the other end of the diffusion layer of the N-channel transistor. The above describes the case where the first buffer amplifier (the differential amplifier circuit 500) applies the voltage to the other terminal of the switch element (the N-channel transistor 502) with respect to the other terminal of the resistance element (the fixed resistor 503) in the pseudo memory cell circuit 507, and the current mirror circuit (the P-channel transistors 501 and 504) applies the current so that the current flows from the other terminal of the resistance element (the fixed resistor 505) to the other terminal of the switch element (the N-channel transistor 506) in the pseudo memory cell circuit 508. However, this may be reversed so that the first buffer amplifier (the differential amplifier circuit 500) applies the voltage to the other terminal of the resistance element (the fixed resistor 503) with respect to the other terminal of the switch element (the N-channel transistor 502) in the pseudo memory cell circuit 507, and the current mirror circuit (the P-channel transistors 501 and 504) applies the current so that the current flows from the other terminal of the switch element (the N-channel transistor 506) to the other terminal of the resistance element (the fixed resistor 505) in the pseudo memory cell circuit 508. That is, the connection may be made in such a manner that the other diffusion layer terminal (source) of the N-channel transistor 502 is connected to the reference voltage (ground) and the other terminal of the fixed resistor 503 is connected to the node Ne in the pseudo memory cell circuit 507, and the other diffusion layer terminal (drain) of the N-channel transistor 506 is connected to the node Np and the other terminal of the fixed resistor 505 is connected to the reference voltage (ground) in the pseudo memory cell circuit 508.

The above describes the case where the resistance element in each of the pseudo memory cell circuits 507 and 508 is a fixed resistance element. However, the resistance element may instead be a variable resistance element same as that used in the memory cell, with a resistance value of the variable resistance element being set to a resistance value in the low resistance state of the variable resistance element.

With the above circuit, even when the low resistance writing pulse voltage Ve varies, the low resistance stabilization writing pulse voltage VLRMAX corresponding to Ve can be set automatically.

The above embodiments mainly focus on the 1T1R memory cell. However, since the resistance change of the memory cell is carried out by the variable resistance element, similar characteristics can be seen in a memory device of a variable resistance element alone that is intended for use in a fuse element and the like. Hence, the rewriting sequence as shown in the state change diagram or flowchart of FIG. 16A, 16B, 19, 20, or 23 may also be applied to such a memory device.

Figure 25:
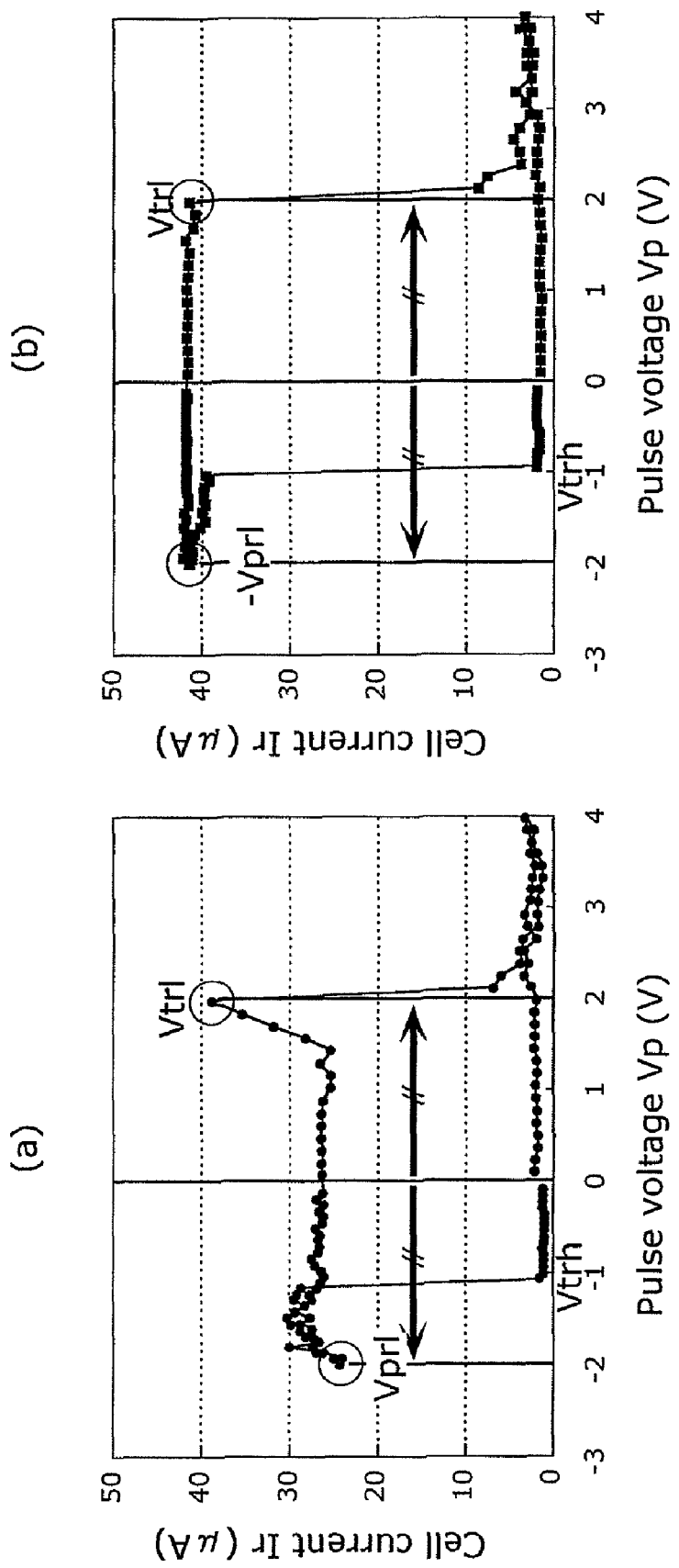
FIGS. 25(a) and (b) is a pulse V-I characteristic graph of a variable resistance element in the embodiment of the present invention.

A pulse voltage generation circuit for low resistance stabilization writing of the memory cell of the variable resistance element alone can be realized by replacing the pseudo memory cell circuits 507 and 508 in FIG. 31 with the resistance elements alone, as can be understood from the characteristics of the variable resistance element alone shown in FIG. 25. As a result, the same advantageous effects as the above can be achieved.

The same method and circuitry are also applicable to a memory cell or a pseudo memory cell in which a variable resistance element and a rectifier element (such as a bidirectional diode) are connected in series with each other.

The present invention may be realized not only as the nonvolatile memory device in the above embodiments, but also as a method of writing data to the variable resistance element in terms of data writing control in the nonvolatile memory device. That is, the present invention is a method of writing data to a variable resistance element that includes a first electrode and a second electrode and reversibly changes between a high resistance state and a low resistance state according to a polarity of a voltage applied across the first electrode and the second electrode, the writing method including: selecting at least one memory cell from a memory cell array including a plurality of memory cells in each of which a variable resistance element and a switch element are connected in series with each other; performing high resistance writing by applying, with the supply of power from a high resistance writing power source for setting the variable resistance element to the high resistance state, a voltage to the memory cell selected in the selecting so that a positive voltage is applied to the second electrode with respect to the first electrode in a variable resistance element included in the selected memory cell, the positive voltage being required to set the variable resistance element to the high resistance state; performing low resistance writing by applying, with the supply of power from a low resistance writing power source for setting the variable resistance element to the low resistance state, a voltage to the memory cell selected in the selecting so that a negative voltage is applied to the second electrode with respect to the first electrode in the variable resistance element included in the selected memory cell, the negative voltage being required to set the variable resistance element to the low resistance state; and performing low resistance stabilization writing by applying, with the supply of power from the low resistance writing power source, a voltage to the memory cell selected in the selecting so that a positive voltage is applied to the second electrode with respect to the first electrode in the variable resistance element included in the selected memory cell, the positive voltage being required to cause a current to flow from the second electrode to the first electrode in the variable resistance element, the current having the same value as a current that flows through the variable resistance element when the negative voltage is applied to the variable resistance element in the performing low resistance writing.

Though the variable resistance element writing method and the nonvolatile memory device according to the present invention have been described above by way of Embodiments 1 to 5, the present invention is not limited to the above embodiments. Modifications obtained by applying various changes conceivable by a person skilled in the art to the embodiments and any combinations of the components in the embodiments are also included in the present invention without departing from the scope of the present invention.

INDUSTRIAL APPLICABILITY

As described above, the method of writing the nonvolatile variable resistance memory element and the nonvolatile variable resistance memory device according to the present invention are a method and circuitry capable of setting a maximum resistance change window between a low resistance state and a high resistance state of a memory cell such as a 1T1R memory cell using a variable resistance element in the nonvolatile variable resistance memory device, so that the low resistance state can be stabilized. Therefore, the present invention is useful, for example, for achieving faster and more stable memory reading, and improved yields. The present invention is also useful in a state memory circuit as an alternative to a fuse element.

REFERENCE SIGNS LIST

10*a*, 10*b*, 10*c* Variable resistance element (nonvolatile variable resistance memory element)
11 Upper electrode
12 Oxide layer
13 Variable resistance layer 14p, 14t Lower electrode
15 Oxide layer
104 Transistor
105 Memory cell
200 Nonvolatile memory device (nonvolatile variable resistance memory device)
201 Memory unit
202 Memory cell array
203 Column selection circuit
204 Sense amplifier
205 Data output circuit
206 Writing circuit
207 Row driver
208 Row selection circuit
209 Address input circuit
210 Control circuit
211 Writing power source
212 Low resistance (LR) writing power source
213 High resistance (HR) writing power source
214 Low resistance (LR) stabilization writing power source
215 Data input circuit
221 LR writing reference voltage generator
222, 225, 500, 511, 512 Differential amplifier circuit
224 HR writing reference voltage generator
226, 227 Three-state driver
229 Applied voltage controller
231 Voltage selection switch group
232, 246, 247, 248, 503, 505 Fixed resistor
233, 513 Driver
234, 240, 241, 249, 250, 251, 502, 506 N-channel transistor
235, 242, 243, 501, 504 P-channel transistor
236 Low resistance stabilization writing circuit
237 Smoothing capacitor
245 Buffer
262 Memory controller
300 Memory cell
301 Semiconductor substrate
302a, 302b N-type diffusion layer region
303a Gate insulation film
303b Gate electrode
304, 306, 308, 310 Via
305, 307, 311 Wiring layer
317 Transistor
507, 508 Pseudo memory cell circuit

The invention claimed is:

1. A method of writing data to a nonvolatile variable resistance memory element that includes a first electrode and a second electrode and reversibly changes between a high resistance state and a low resistance state according to a polarity of a voltage applied across the first electrode and the second electrode, said writing method comprising:
performing high resistance writing by applying a positive first voltage to the second electrode with respect to the first electrode, to set the nonvolatile variable resistance memory element to the high resistance state;
performing low resistance writing by applying a negative second voltage to the second electrode with respect to the first electrode, to set the nonvolatile variable resistance memory element to the low resistance state; and
performing low resistance stabilization writing by applying a positive third voltage to the second electrode with respect to the first electrode to set the nonvolatile variable resistance memory element to the low resistance state, after the negative second voltage is applied in said performing low resistance writing.

2. The writing method according to claim 1,
wherein a resistance value of the nonvolatile variable resistance memory element has a possibility of changing to an intermediate low resistance value between a high resistance value and a low resistance value as a result of the application of the negative second voltage in said performing low resistance writing, the high resistance value being a resistance value of the nonvolatile variable resistance memory element in the high resistance state, and the low resistance value being a resistance value of the nonvolatile variable resistance memory element in the low resistance state, and
said performing low resistance stabilization writing includes changing the resistance value of the nonvolatile variable resistance memory element from the intermediate low resistance value to the low resistance value.

3. The writing method according to claim 2,
wherein said performing low resistance stabilization writing includes applying a positive voltage that increases stepwise.

4. The writing method according to claim 3,
wherein said performing low resistance stabilization writing includes changing the resistance value of the nonvolatile variable resistance memory element from the intermediate low resistance value to the high resistance value through the low resistance value, by applying the positive voltage that increases stepwise.

5. The writing method according to claim 2,
wherein said performing low resistance stabilization writing includes changing the resistance value of the nonvolatile variable resistance memory element from the intermediate low resistance value to the low resistance value, by applying the predetermined positive third voltage only once.

6. The writing method according to claim 5,
wherein the predetermined positive third voltage is equal to or lower than an absolute value of a negative voltage to be applied so that the resistance value of the nonvolatile variable resistance memory element is a minimum low resistance value out of possible low resistance values of the nonvolatile variable resistance memory element in the low resistance state.

7. The writing method according to claim 2, further comprising
determining whether or not the resistance value of the nonvolatile variable resistance memory element after the application of the negative voltage in said performing low resistance writing is the low resistance value of the low resistance state,
wherein said performing low resistance stabilization writing is executed only in the case where the resistance value of the nonvolatile variable resistance memory element is not the low resistance value of the low resistance state in said determining.

8. The writing method according to claim 2, further comprising
forming by applying a negative voltage to the second electrode with respect to the first electrode to decrease the resistance value of the nonvolatile variable resistance memory element from a resistance value equal to or higher than the high resistance value, in the case where any of said performing high resistance writing and said performing low resistance writing is not executed on the nonvolatile variable resistance memory element immediately after manufacturing,
wherein said performing low resistance stabilization writing is executed following said forming.

9. The writing method according to claim 1,
wherein the third voltage is a voltage required to cause a current to flow from the second electrode to the first electrode in the nonvolatile variable resistance memory element, the current having the same value as a current that flows through the nonvolatile variable resistance memory element when the negative second voltage is applied in said performing low resistance writing.

10. A nonvolatile variable resistance memory device that writes data to a nonvolatile variable resistance memory element, said nonvolatile variable resistance memory device comprising:
a memory cell array that includes a plurality of memory cells in each of which a nonvolatile variable resistance memory element and a switch element are connected in series with each other, said nonvolatile variable resistance memory element including a first electrode and a second electrode and reversibly changing between a high resistance state and a low resistance state according to a polarity of a voltage applied across said first electrode and said second electrode;
a selection unit configured to select at least one memory cell from said memory cell array;
a writing power source that supplies power for writing data to said nonvolatile variable resistance memory element; and
a writing circuit that applies a voltage for writing data to said nonvolatile variable resistance memory element included in said memory cell selected by said selection unit, with the supply of the power from said writing power source,
wherein said writing power source includes:
a high resistance writing power source that supplies power for setting said nonvolatile variable resistance memory element to the high resistance state;
a low resistance writing power source that supplies power for setting said nonvolatile variable resistance memory element to the low resistance state; and
a low resistance stabilization writing power source that supplies power for additionally setting said nonvolatile variable resistance memory element to the low resistance state stably, and
said writing circuit includes:
a high resistance writing unit configured to apply, with the supply of the power from said high resistance writing power source, a voltage to said memory cell selected by said selection unit so that a positive first voltage is applied to said second electrode with respect to said first electrode in said nonvolatile variable resistance memory element included in said selected memory cell, the positive first voltage being required to set said nonvolatile variable resistance memory element to the high resistance state;
a low resistance writing unit configured to apply, with the supply of the power from said low resistance writing power source, a voltage to said memory cell selected by said selection unit so that a negative second voltage is applied to said second electrode with respect to said first electrode in said nonvolatile variable resistance memory element included in said selected memory cell, the negative second voltage being required to set said nonvolatile variable resistance memory element to the low resistance state; and
a low resistance stabilization writing unit configured to apply, with the supply of the power from said low resistance stabilization writing power source, a voltage to said memory cell selected by said selection unit so that a positive third voltage is applied to said second electrode with respect to said first electrode in said nonvolatile variable resistance memory element included in said selected memory cell, after the negative second voltage is applied by said low resistance writing unit, the positive third voltage being required to set said nonvolatile variable resistance memory element to the low resistance state.

11. The nonvolatile variable resistance memory device according to claim 10,
wherein said low resistance stabilization writing unit is configured to, in the case where a resistance value of said nonvolatile variable resistance memory element changes to an intermediate low resistance value between a high resistance value and a low resistance value as a result of the application of the negative second voltage by said low resistance writing unit, change the resistance value of said nonvolatile variable resistance memory element from the intermediate low resistance value to the low resistance value by applying the positive third voltage, the high resistance value being a resistance value of said nonvolatile variable resistance memory element in the high resistance state, and the low resistance value being a resistance value of said nonvolatile variable resistance memory element in the low resistance state.

12. The nonvolatile variable resistance memory device according to claim 11,
wherein said low resistance stabilization writing power source supplies a positive voltage that increases stepwise, by successively selecting a plurality of voltages one by one and supplying the selected voltage.

13. The nonvolatile variable resistance memory device according to claim 12,
wherein said low resistance stabilization writing unit is configured to change the resistance value of said nonvolatile variable resistance memory element from the intermediate low resistance value to the high resistance value through the low resistance value, by applying the positive voltage that increases stepwise to said nonvolatile variable resistance memory element, with the supply of the power from said low resistance stabilization writing power source.

14. The nonvolatile variable resistance memory device according to claim 11,
wherein said low resistance stabilization writing power source supplies a predetermined positive voltage, and
said low resistance stabilization writing unit is configured to change the resistance value of said nonvolatile variable resistance memory element from the intermediate low resistance value to the low resistance value, by applying the predetermined positive third voltage only once to said nonvolatile variable resistance memory element with the supply of the power from said low resistance stabilization writing power source, after the application of the negative second voltage by said low resistance writing unit.

15. The nonvolatile variable resistance memory device according to claim 14,
wherein said low resistance stabilization writing power source supplies, as the predetermined positive third voltage, a voltage equal to or lower than a voltage to be applied so that the resistance value of said nonvolatile variable resistance memory element is a minimum low resistance value out of possible low resistance values of said nonvolatile variable resistance memory element in the low resistance state.

16. The nonvolatile variable resistance memory device according to claim 10,
wherein the third voltage is a voltage required to cause a current to flow from said second electrode to said first electrode in said nonvolatile variable resistance memory element, the current having the same value as a current that flows through said nonvolatile variable resistance memory element when the negative second voltage is applied by said low resistance writing unit.

17. The nonvolatile variable resistance memory device according to claim 16,
wherein said low resistance stabilization writing unit includes:
first and second pseudo memory cells in each of which a resistance element and a switch element are connected in series with each other, said resistance element having the same resistance value as said nonvolatile variable resistance memory element in the low resistance state;
a first buffer amplifier that receives the power from said low resistance writing power source, and applies a voltage of the same value as a voltage that is applied when said low resistance writing unit performs low resistance writing on said memory cell, to said first pseudo memory cell;
a current mirror circuit that generates a current of the same value as a current flowing through said first pseudo memory cell, and has a terminal that controls the current so that the generated current is applied to said second pseudo memory cell; and
a second buffer amplifier that receives a voltage generated across both ends of said second pseudo memory cell, and generates a voltage of the same value as the received voltage.

18. The nonvolatile variable resistance memory device according to claim 17,
wherein said first buffer amplifier is a differential amplifier circuit that has a non-inverting input terminal connected to said low resistance writing power source, an inverting input terminal connected to said first pseudo memory cell, and an output terminal connected to said terminal that controls the current in said current mirror circuit.

19. The nonvolatile variable resistance memory device according to claim 17,
wherein one terminal of said resistance element and one terminal of said switch element are connected to each other in each of said first and second pseudo memory cells,
said first buffer amplifier applies the voltage to an other terminal of said switch element in said first pseudo memory cell, with respect to an other terminal of said resistance element in said first pseudo memory cell, and
said current mirror circuit applies the current so that the current flows from the other terminal of said resistance element in said second pseudo memory cell to the other terminal of said switch element in said second pseudo memory cell.

20. The nonvolatile variable resistance memory device according to claim 17,
wherein one terminal of said resistance element and one terminal of said switch element are connected to each other in each of said first and second pseudo memory cells,
said first buffer amplifier applies the voltage to an other terminal of said resistance element in said first pseudo memory cell, with respect to an other terminal of said switch element in said first pseudo memory cell, and
said current mirror circuit applies the current so that the current flows from the other terminal of said switch element in said second pseudo memory cell to the other terminal of said resistance element in said second pseudo memory cell.

21. The nonvolatile variable resistance memory device according to claim 17,
wherein said switch elements in said first and second pseudo memory cells are MOS transistors having gates of the same gate length and the same gate width.

22. The nonvolatile variable resistance memory device according to claim 17,
wherein said resistance elements in said first and second pseudo memory cells comprise wiring resistance formed in a diffusion layer on a semiconductor substrate or polysilicon.

23. The nonvolatile variable resistance memory device according to claim 17,
wherein said resistance elements in said first and second pseudo memory cells are variable resistance elements that are set at the same resistance value as said nonvolatile variable resistance memory element in the low resistance state.

24. The nonvolatile variable resistance memory device according to claim 17,
wherein said current mirror circuit includes a first MOS transistor and a second MOS transistor, a gate of said first MOS transistor and a gate of said second MOS transistor being connected to each other,
said first MOS transistor is connected to said first pseudo memory cell, and
said second MOS transistor is connected to said second pseudo memory cell, and has a larger current capability than said first MOS transistor.

25. The nonvolatile variable resistance memory device according to claim 17,
wherein said low resistance stabilization writing unit further includes:
a low resistance stabilization writing power source that divides the voltage generated by said second buffer amplifier by one voltage ratio selected from a plurality of voltage ratios, to generate an output voltage; and
a third buffer amplifier that receives the output voltage of said low resistance stabilization writing power source, and generates a voltage of the same value as the received voltage.

* * * * *